United States Patent
Zushi et al.

(10) Patent No.: US 8,513,836 B2
(45) Date of Patent: Aug. 20, 2013

(54) DRIVE CONTROL DEVICE FOR AN ELECTRIC LOAD

(75) Inventors: Yuji Zushi, Chiyoda-ku (JP); Shinsuke Suzuki, Chiyoda-ku (JP); Akihiro Ishii, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 719 days.

(21) Appl. No.: 12/786,660

(22) Filed: May 25, 2010

(65) Prior Publication Data

US 2011/0133715 A1      Jun. 9, 2011

(30) Foreign Application Priority Data

Dec. 7, 2009   (JP) .................................. 2009-277664

(51) Int. Cl.
  *H01H 35/00*    (2006.01)
  *H01H 83/00*    (2006.01)
  *H01H 47/00*    (2006.01)
  *H02H 3/00*     (2006.01)

(52) U.S. Cl.
  USPC ........................................................ 307/130

(58) Field of Classification Search
  USPC ............... 307/10.1, 116, 130; 361/93.1, 100; 323/285
  See application file for complete search history.

(56) References Cited

U.S. PATENT DOCUMENTS 5,311,138 A    5/1994 Ott et al.
7,345,383 B2   3/2008 Zushi et al.

FOREIGN PATENT DOCUMENTS

DE    40 12 109 A1    10/1991
JP    2007-135294 A    5/2007

*Primary Examiner* — Carlos Amaya
(74) *Attorney, Agent, or Firm* — Sughrue Mion, PLLC

(57) ABSTRACT

Provided is a drive control device capable of surely detecting, by a monitoring/controlling unit, an abnormality of a short circuit and a disconnection in a power supply circuit to an electric load, and of decreasing a load required for a quick response imposed on the monitoring/controlling unit. A switching element is controlled to open/close by a control output signal generated by a monitoring/controlling unit, and a determination storing circuit determines whether circuit opening and circuit closing have been correctly carried out and stores a result of the determination, and periodically reports to the monitoring/controlling unit. While the stored content of the determination is periodically reset, the determination operation is updated and continues. The monitoring/controlling unit does not need to immediately monitor the determination storing signal when the open/closing command is generated.

20 Claims, 14 Drawing Sheets

FIG. 3A

STATE DETECTION AND STORED DETERMINATION

| | CONTROL OUTPUT SIGNAL Dr | STATE DETECTION SIGNAL Mn | NORMALITY CLOSED-CIRCUIT STORING SIGNAL M1 | NORMALITY OPEN-CIRCUIT STORING SIGNAL M2 | ABNORMALITY GENERATION CATEGORY |
|---|---|---|---|---|---|
| A1 | H | H | H | | CLOSED-CIRCUIT PRELIMINARY NORMALITY OR ELEMENT INTERNAL/EXTERNAL SHORT CIRCUIT 220 NOT LOAD INTERNAL/EXTERNAL SHORT CIRCUIT OR THE LIKE 210 |
|  | OP+RST=L | | | | |
| A2 | H | L | L | | CLOSED-CIRCUIT ABNORMALITY LOAD INTERNAL/EXTERNAL SHORT CIRCUIT OR THE LIKE 210 IS GENERATED |
|  | OP+RST=L | | | | |
| A3 | L | L | | H | OPEN-CIRCUIT PRELIMINARY NORMALITY OR LOAD INTERNAL/EXTERNAL SHORT CIRCUIT OR THE LIKE 210 NOT ELEMENT INTERNAL/EXTERNAL SHORT CIRCUIT 220 |
|  | OP+RST=L | | | | |
| A4 | L | H | | L | OPEN-CIRCUIT ABNORMALITY ELEMENT INTERNAL/EXTERNAL SHORT CIRCUIT 220 IS GENERATED |
|  | OP+RST=L | | | | |
| A5 | (L) | — | L | L | LOAD INTERNAL/EXTERNAL DISCONNECTION 230 IS GENERATED OR RESET COMMAND IS ACTIVE |
|  | OP+RST=H | | | | |

FIG. 3B

COMMAND HISTORY AND STORED DETERMINATION — RESET COMMAND SIGNAL IS CLEARED

| ON-COMMAND STORING SIGNAL M3 | OFF-COMMAND STORING SIGNAL M4 | NORMALITY CLOSED-CIRCUIT STORING SIGNAL M1 | NORMALITY OPEN-CIRCUIT STORING SIGNAL M2 | CLOSED CIRCUIT | OPEN CIRCUIT | DIS-CONNECTION | DETERMINATION |
|---|---|---|---|---|---|---|---|
| H | H | H | H | PRELIMINARY NORMALITY | PRELIMINARY NORMALITY | NORMALITY | B2(NORMALITY) |
|  |  | H | L | PRELIMINARY NORMALITY | ABNORMALITY | NORMALITY | B3(OPEN-CIRCUIT ABNORMALITY) |
|  |  | L | H | ABNORMALITY | PRELIMINARY NORMALITY | NORMALITY | B3(CLOSED-CIRCUIT ABNORMALITY) |
|  |  | L | L | PRELIMINARY NORMALITY | PRELIMINARY NORMALITY | ABNORMALITY | B5(DISCONNECTION) |
|  | L | H | L | UNCERTAINTY | UNCERTAINTY | UNCERTAINTY | B4(UNCERTAINTY) |
|  |  | H,L | H | LOGIC ABNORMALITY | | | B3orB5 |
| L |  | L | L | UNCERTAINTY | NORMALITY | NORMALITY | B6(LOGIC) |
|  | H | L | H | UNCERTAINTY | UNCERTAINTY | UNCERTAINTY | B4(UNCERTAINTY) |
|  |  | H | H,L | LOGIC ABNORMALITY | | | B3orB5 |
| L |  | H,L | H,L | LOGIC ABNORMALITY | | | B6(LOGIC) |
|  | L |  |  | LOGIC ABNORMALITY | | | B6(LOGIC) |

B1:PRELIMINARY NORMALITY, B2:NORMALITY, B3:ABNORMALITY, B4:UNCERTAINTY, B5:DISCONNECTION, B6:LOGIC ABNORMALITY

FIG. 7A

STATE DETECTION AND STORED DETERMINATION

| | CONTROL OUTPUT SIGNAL Dr | STATE DETECTION SIGNAL Mn | ABNORMAL CLOSED-CIRCUIT STORING SIGNAL M5 | ABNORMAL OPEN-CIRCUIT STORING SIGNAL M6 | ABNORMALITY GENERATION CATEGORY |
|---|---|---|---|---|---|
| A1 | H | H | L | | CLOSED-CIRCUIT PRELIMINARY NORMALITY OR ELEMENT INTERNAL/EXTERNAL SHORT CIRCUIT 220 NOT LOAD INTERNAL/EXTERNAL SHORT CIRCUIT OR THE LIKE 210 |
| | OP+RST=L | | | | |
| A2 | H | L | H | | CLOSED-CIRCUIT ABNORMALITY LOAD INTERNAL/EXTERNAL SHORT CIRCUIT OR THE LIKE 210 IS GENERATED |
| | OP+RST=L | | | | |
| A3 | L | L | | L | OPEN-CIRCUIT PRELIMINARY NORMALITY OR LOAD INTERNAL/EXTERNAL SHORT CIRCUIT OR THE LIKE 210 NOT ELEMENT INTERNAL/EXTERNAL SHORT CIRCUIT 220 |
| | OP+RST=L | | | | |
| A4 | L | H | | H | OPEN-CIRCUIT ABNORMALITY ELEMENT INTERNAL/EXTERNAL SHORT CIRCUIT 220 IS GENERATED |
| | OP+RST=L | | | | |
| A5 | (L) | — | H | H | LOAD INTERNAL/EXTERNAL DISCONNECTION 230 IS GENERATED |
| | OP=H | | | | |
| A6 | — | — | L | L | RESET COMMAND IS ACTIVE |
| | RST=H | | | | |

FIG. 7B

COMMAND HISTORY AND STORED DETERMINATION — RESET COMMAND SIGNAL IS CLEARED

| ON-COMMAND STORING SIGNAL M3 | OFF-COMMAND STORING SIGNAL M4 | ABNORMAL CLOSED-CIRCUIT STORING SIGNAL M5 | ABNORMAL OPEN-CIRCUIT STORING SIGNAL M6 | CLOSED CIRCUIT | OPEN CIRCUIT | DIS-CONNECTION | DETERMINATION |
|---|---|---|---|---|---|---|---|
| H | H | L | L | PRELIMINARY NORMALITY | PRELIMINARY NORMALITY | NORMALITY | B2(NORMALITY) |
| | | L | H | PRELIMINARY NORMALITY | ABNORMALITY | NORMALITY | B3(OPEN-CIRCUIT ABNORMALITY) |
| | | H | L | ABNORMALITY | PRELIMINARY NORMALITY | NORMALITY | B3(CLOSED-CIRCUIT ABNORMALITY) |
| | | H | H | PRELIMINARY NORMALITY | PRELIMINARY NORMALITY | ABNORMALITY | B5(DISCONNECTION) |
| H | L | L | L | PRELIMINARY NORMALITY | UNCERTAINTY | NORMALITY | B4(UNCERTAINTY) |
| | | H | L | ABNORMALITY | UNCERTAINTY | NORMALITY | B3(CLOSED-CIRCUIT ABNORMALITY) |
| | | H,L | H | LOGIC ABNORMALITY | | | B6(LOGIC) |
| L | H | L | L | UNCERTAINTY | PRELIMINARY NORMALITY | NORMALITY | B4(UNCERTAINTY) |
| | | L | H | UNCERTAINTY | ABNORMALITY | NORMALITY | B3(OPEN-CIRCUIT ABNORMALITY) |
| | | H | H,L | LOGIC ABNORMALITY | | | B6(LOGIC) |
| L | L | H,L | H,L | LOGIC ABNORMALITY | | | B6(LOGIC) |

B1:PRELIMINARY NORMALITY,B2:NORMALITY,B3:ABNORMALITY,B4:UNCERTAINTY,B5:DISCONNECTION,B6:LOGIC ABNORMALITY

DRIVE CONTROL DEVICE FOR AN ELECTRIC LOAD

BACKGROUND OF THE INVENTION

1. Field of the Invention

The present invention relates to a drive control device for an electric load including a switching element serially connected to an electric load to which a power is supplied from a drive power source, and monitoring/controlling means for performing opening/closing control of the switching element, and monitoring presence/absence of an abnormal state of a power supply circuit for the electric load, and more particularly, to a drive control device for an electric load improved so as not to miss whether a switching element is correctly brought into a closed-circuit state or an open-circuit state according to a momentary circuit closing command or circuit opening command, or a change in the command from the circuit closing command to the circuit opening command or the circuit opening command to the circuit closing command thereby surely detecting presence/absence of an abnormal state.

2. Description of the Related Art

In power supply control for an electric load, an intelligent switch provided with a feature of monitoring an abnormality of a switching element, which is a power transistor, is widely used. For example, according to the "ABNORMALITY DETECTION APPARATUS FOR A POWER SUPPLY CIRCUIT" described in Japanese Patent Application Laid-open No. 2007-135294 (FIG. 1, Abstract), switching control means (corresponding to the monitoring/controlling means) is caused to generate a control output signal directed to a power transistor (corresponding to the switching element), and a state detection circuit is caused to report an open/closed-circuit state of the power transistor, as a state detection signal, to the switching control means, and the switching control means compares a result of determining whether the control output signal generated by itself is the circuit closing command or the circuit opening command and a result of determining whether the reported state detection signal is the closed-circuit state or the open-circuit state with each other, thereby determining presence/absence of an abnormality of the power supply circuit for the electric load and the switching element.

For example, when, in response to the circuit closing command, a voltage between both terminals of a power transistor is equal to or more than a predetermined value, and thus the power transistor is not in the closed-circuit state, it is determined that this state is a load short-circuit abnormality in which an electric load is short-circuited or the electric load is short-circuited by contacts of external wiring, and thus an overcurrent is flowing, or a closed-circuit abnormality caused by an internal fusion abnormality in which the power transistor cannot close or the like. Further, when, in response to the circuit opening command, the voltage between both the terminals of the power transistor is equal to or less than a predetermined value, and thus the power transistor is not in the open-circuit state, it is determined that this state is an open circuit abnormality which is an internal short-circuit of the power transistor or both the terminals of the power transistor is short-circuited by contacts of external wiring.

However, even when, in response to the circuit closing command, the voltage between both terminals of the power transistor is equal to or less than the predetermined value, and it thus appears that the power transistor is in the normal closed-circuit state, there may be an open-circuit abnormal state caused by an internal short circuit and an external short circuit of the power transistor. Further, even when, in response to the circuit opening command, the voltage between both terminals of the power transistor is equal to or more than the predetermined value, and it thus appears that the power transistor is in the normal open-circuit state, there may be a closed-circuit abnormal state caused by an internal short circuit or an external short circuit of the electric load. Thus, only after both the normal closed-circuit state and the normal open-circuit state are detected, it is confirmed that the power supply circuit and the switching element are normal, and a state in which only the normal closed-circuit state or the normal open-circuit state is detected is a state in which a normal state is preliminary determined.

(1) Description of Problems of Prior Art

In the "ABNORMALITY DETECTION APPARATUS FOR A POWER SUPPLY CIRCUIT" according to Japanese Patent Application Laid-open No. 2007-135294 (FIG. 1, Abstract), the switching control means serving as the monitoring/controlling means determines presence/absence of a generation of an abnormality of the power supply circuit and the switching element for the electric load. As a result, though the apparatus is characterized in that the circuit scale on the switching element side is small, a heavy load resulting from the control is imposed on the monitoring/controlling means side. A first problem thereof is that, for example, when, to a switching element opening/closing highly frequently by a pulse-width modulation signal, a circuit opening command or a circuit closing command in an extremely short period is given, in the short period in which this circuit opening command or circuit closing command is being fed, the state detection signal must be read immediately. A second problem thereof is that, for an electric load to which the opening/closing operation is rarely carried out, when the command directed to the switching element changes from the circuit opening command or circuit closing command to the circuit closing command or circuit opening command, it is necessary to always provide monitoring in order not to miss the states before and after the command change. Further, for example, when one monitoring/controlling means including a microprocessor is providing a large number of switching elements with the monitoring/controlling, or a serial communication line is used in order to reduce signal lines used for a large number of switching elements, a response relating to the monitoring/controlling is especially important subject, and a problem that an accurate abnormality detection cannot be carried out arises.

SUMMARY OF THE INVENTION

(2) Description of Objects of the Invention

A first object of the present invention is to provide a drive control device for an electric load capable of, without imposing an excessive control load relating to a response on a monitoring/controlling means, surely determining presence/absence of an abnormal state of a power supply circuit to the electric load and a switching element. Further, a second object of the present invention is to provide a drive control device for an electric load capable of, even when a monitoring/controlling means includes a microprocessor, and is configured to serially communicate with a large number of switching elements, surely determining presence/absence of an abnormal state of a power supply circuit to the electric load and a switching element.

A drive control device for an electric load according to the present invention includes: a switching element serially connected to an electric load to which a power is supplied from a drive power source; and monitoring/controlling means for controlling opening/closing of the switching element, and monitoring presence/absence of an abnormal state of a power supply circuit for the electric load, in which:

the monitoring/controlling means generates a control output signal serving as one of a circuit closing command and a circuit opening command directed to the switching element, and supplies the switching element and a determination storing circuit with the control output signal;

the switching element generates a state detection signal according to open/closed-circuit states of the switching element, and supplies the determination storing circuit with the state detection signal;

the determination storing circuit is configured to:

detect, when the control output signal is the circuit closing command, whether the switching element has normally been brought into a closed-circuit state and store a result of the detection, thereby generating a closed-circuit determination storing signal;

detect, when the control output signal is the circuit opening command, whether the switching element has normally been brought into an open-circuit state and store a result of the detection, thereby generating an open-circuit determination storing signal; and one of reset the stored information by itself when the monitoring/controlling means has read the determination storing signal and periodically reset forcedly the stored information by a command of the monitoring/controlling means; and the monitoring/controlling means further periodically reads and stores the closed-circuit determination storing signal and the open-circuit determination storing signal serving as the determination storing signal before the determination storing circuit is reset, thereby determining the presence/absence of the abnormal state according to a combination of logics relating to a signal voltage level of the determination storing signal stored before.

According to the present invention, the state storing circuit for collating the control output signal directed to the switching element and an open or closed-circuit state of the switching element to each other, thereby generating the closed-circuit determination storing signal and the open-circuit determination storing signal, is provided, and the monitoring/controlling means periodically reads the determination storing signals, thereby comprehensively determining presence/absence of an abnormality, and the state storing circuit is periodically reset. Thus, even for a circuit closing command signal or circuit opening command signal in a short period, a determination result whether the switching element has normally closed or opened is stored, and thus can be read at a time delayed from a generated timing of the circuit closing command signal or circuit opening command signal, resulting in a reduction of the load relating to the quick response imposed on the switching control means, and effects of surely detecting presence/absence of an abnormality generation, and increasing safety of the control. Further, when the circuit closing command signal and the circuit opening command signal change relatively slowly, and only the closed-circuit or open-circuit determination storing signal is read by the read operation for the present time, and the open-circuit or closed-circuit determination storing signal is read by the read operation for the subsequent time, there is provided an effect that, by considering together the closed-circuit determination storing signal and the open-circuit determination storing signal, presence/absence of an abnormality can be determined. Further, the determination storing circuit repeats the determination operation while the determination storing circuit is periodically reset, and thus an incorrect storing state due to a malfunction caused by noises or the like does not remain, and accurate determination processing can be carried out.

BRIEF DESCRIPTION OF THE DRAWINGS

In the accompanying drawings:

FIG. 3 are tables of stored contents of determinations of a determination storing circuit 160 illustrated in FIG. 1, in which (A) illustrates a content of a state detection and a stored determination, and (B) illustrates a content of a command history and a stored determination;

FIG. 7 are tables of stored contents of determinations of a determination storing circuit 160B illustrated in FIG. 6, in which (A) illustrates a content of a state detection and a stored determination, and (B) illustrates a content of a command history and a stored determination;

DETAILED DESCRIPTION OF THE PREFERRED EMBODIMENTS

First Embodiment
(1) Detailed Description of Configuration

Figure 1:
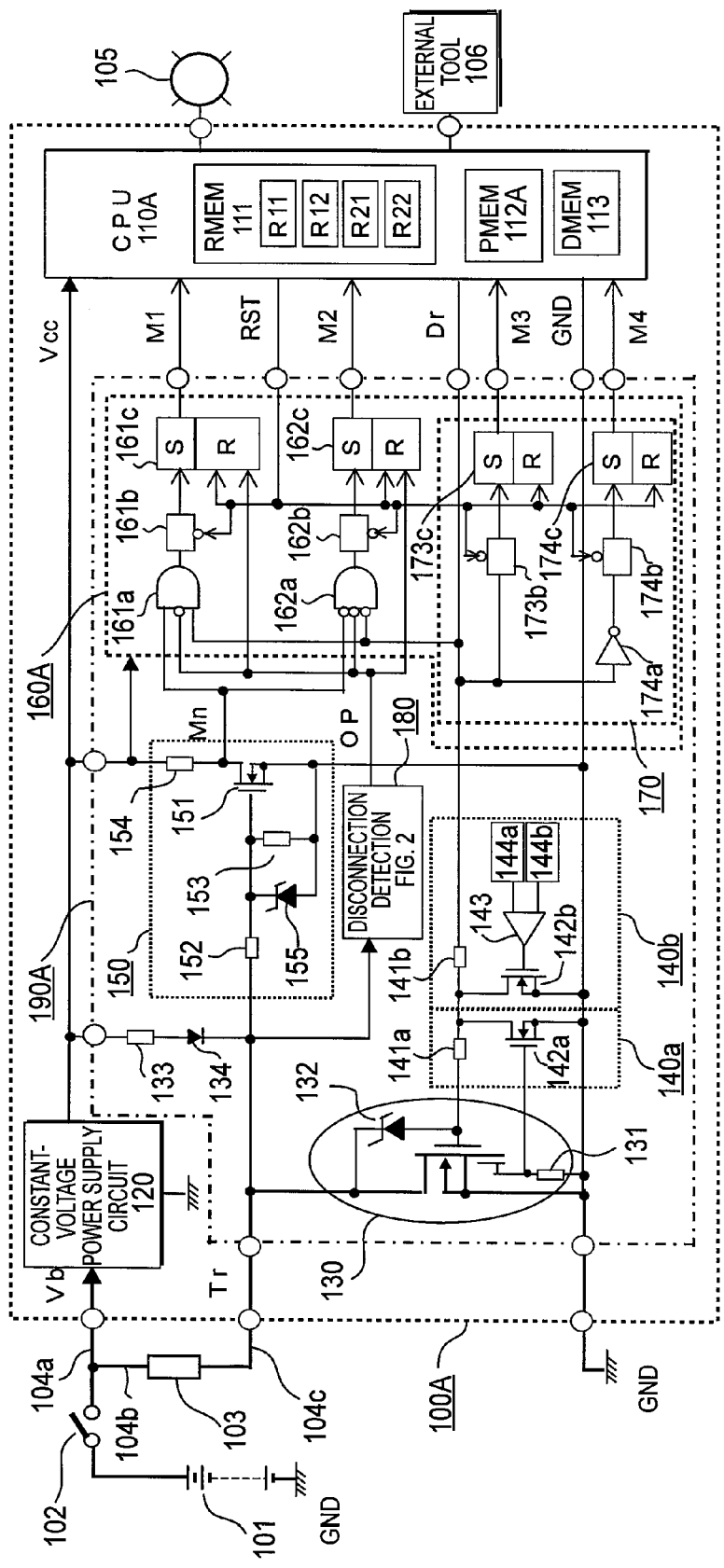
FIG. 1 is a block diagram of an entire circuit of a drive control device for an electric load according to a first embodiment of the present invention.

A description is given hereinafter of FIG. 1 illustrating a block diagram of an entire circuit of a drive control device for an electric load according to a first embodiment of the present invention. In FIG. 1, a drive control device 100A is included, in actuality, in an engine control device for a motor vehicle, for example, and a power supply from a drive power source 101 such as an onboard battery is fed via an output contact of a power supply relay 102 and a power supply line 104a. The power supply relay 102 is configured so as to close immediately after a power supply switch (not shown) is turned on, and, when the power supply switch is turned off, however, to open after a predetermined delay recovery period. Further, an electric load 103, which is, for example, an electric heater for quickly activating an exhaust gas sensor, is connected via a positive-side wiring 104c to the power supply line 104a, and is connected via a negative-side wiring 104c to a drain terminal of a power transistor serving as a switching element 130 described later. Further, an alarm display 105 is connected to an output terminal of monitoring/controlling means 110A described later, and is disposed outside the drive control device 100A for the sake of driver's visibility.

Figure 4:
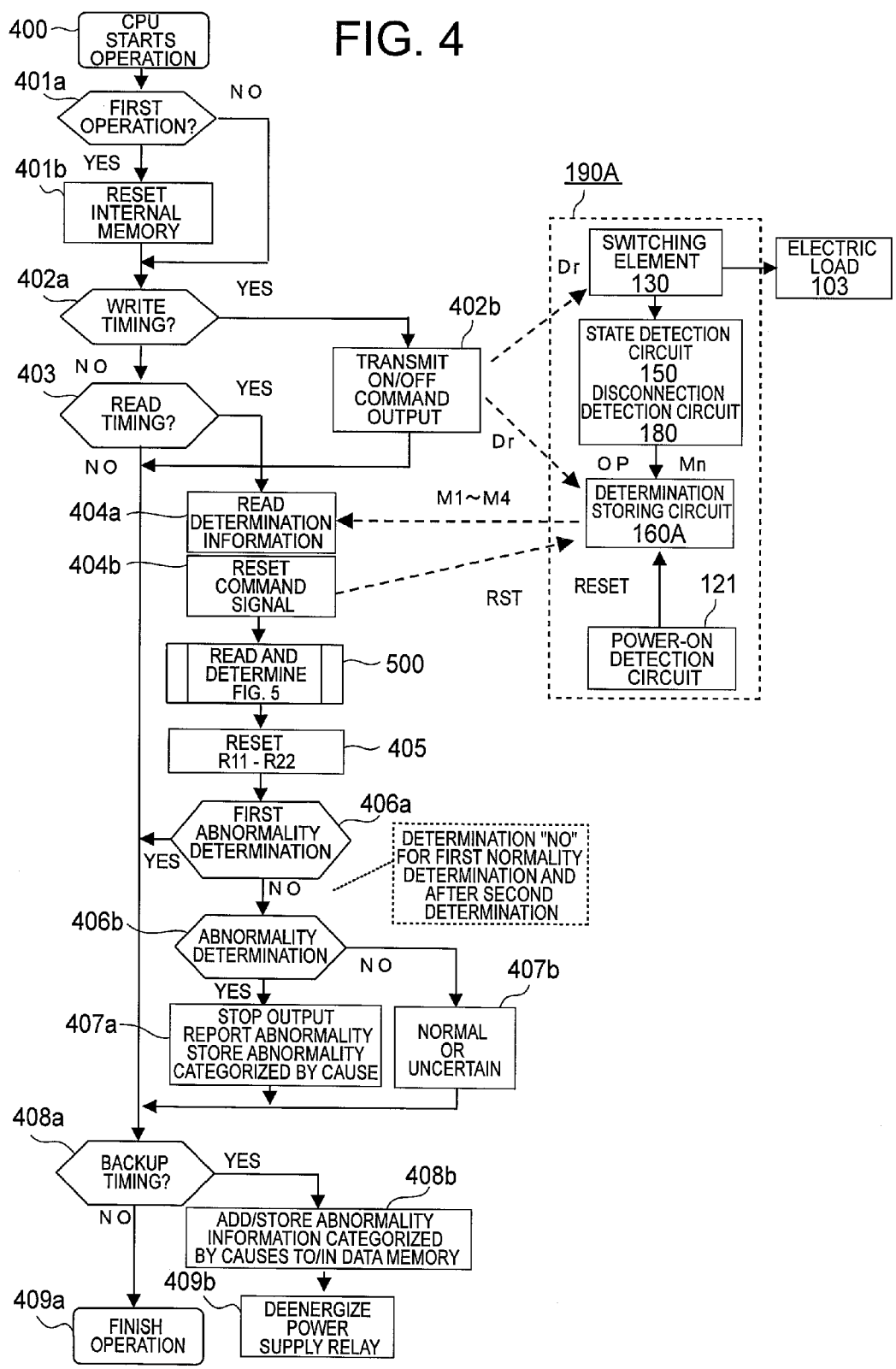
FIG. 4 is a flowchart illustrating an operation of the device in FIG. 1.
Figure 5:
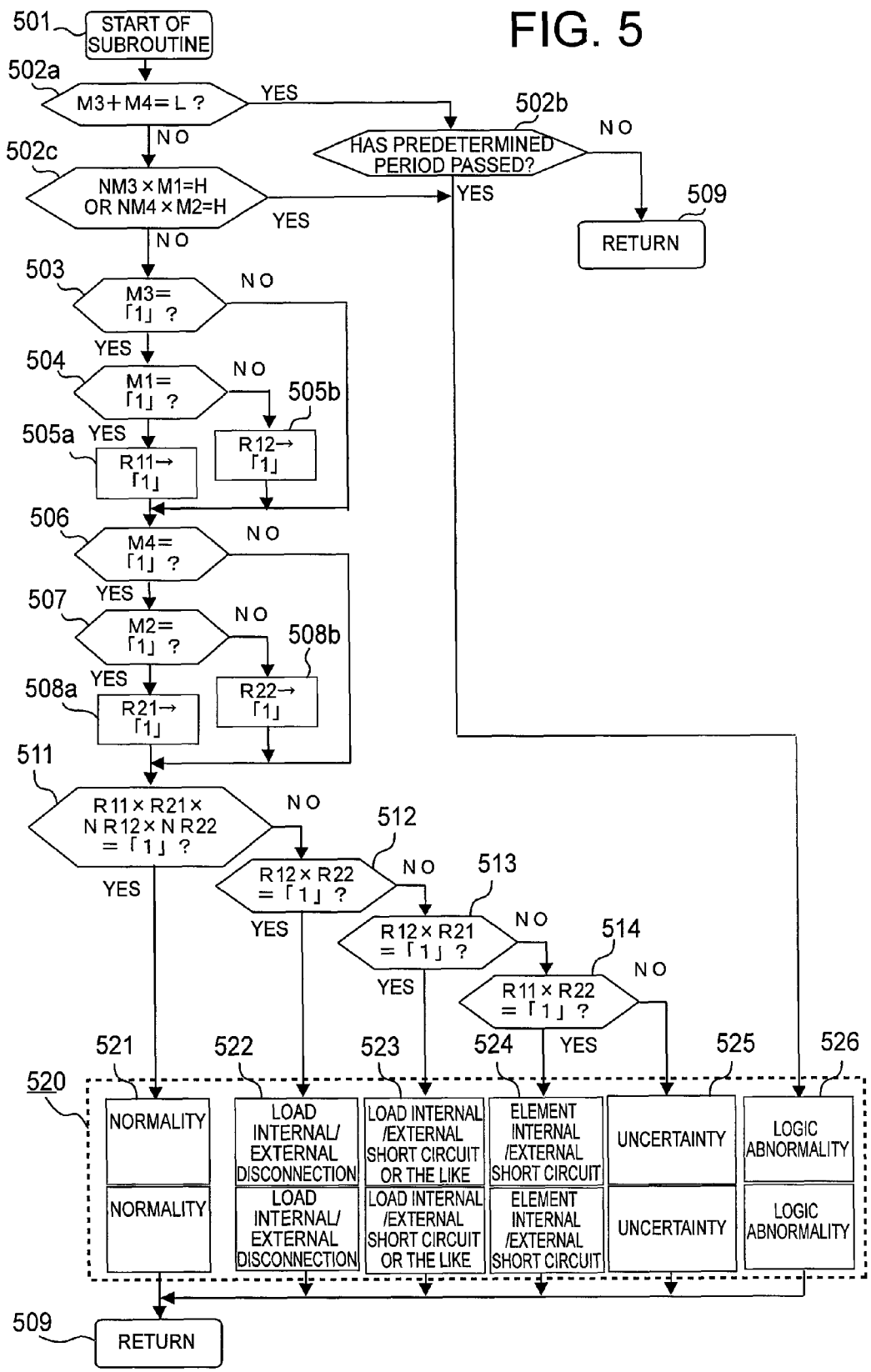
FIG. 5 is a flowchart detailing a part of the operation in FIG. 4.

To the drive control device 100A such as an engine control device, other many electric loads and various input sensors are connected, and, in response to operation states of these input sensors, a power supply and a stop of the power supply to the electric load 103 are carried out. The monitoring/controlling means 110A included in the drive control device 100A includes a microprocessor cooperating with a random access memory (RAM) 111 for arithmetic processing, a program memory 112A such as a nonvolatile flash memory, and a data memory 113 such as a nonvolatile electrically erasable programmable read only memory (EEPROM) memory. In the program memory 112A, control programs serving as command output generation means 402b, determination information reading means 404a, recheck processing means 406a, and abnormality handling means 407a and 408b, which are described later referring to FIGS. 4 and 5, are stored. Further, in the nonvolatile data memory 113, as an abnormality generation history of the electric load 103, numbers of generation of abnormalities categorized by a cause of the generation of the abnormalities are stored and retained. An external tool 106 is serially connected, when the product is inspected and adjusted on delivery or maintenance and inspection are carried out, via a detachable connector (not shown) to the microprocessor 110A, and is used to transfer and write the control program to the program memory 112A and to check reading from the data memory 113.

A constant-voltage power supply circuit 120 is supplied with the power from the drive power source 101 via the output contact of the power supply relay 102, generates a stabilized control power supply voltage Vcc such as DC 5V, and supplies the control power supply voltage Vcc as a control power supply for the monitoring/controlling means 110A. As the switching element 130, a power transistor, which is an N-MOS field effect transistor, is used, and this power transistor is connected on the downstream of the electric load 103. A current detection resistor 131 connected to a current mirror circuit is connected along with the source terminal to a negative-side terminal of the drive power source 101 serving as a ground circuit GND. An over-voltage suppressing diode 132 is a constant voltage diode connected between the drain terminal and the source terminal or the drain terminal and the gate terminal of the power transistor 130, and a load current flowing when the power transistor 130 is in the closed-circuit state quickly attenuates through the over-voltage suppressing diode 132 when the power transistor 130 is bought into the open-circuit state, and, on this occasion, an open-circuit surge voltage is regulated by the constant voltage characteristic of the over-current suppressing diode 132.

A pull-up resistor 133 and a reverse current protection diode 134 are serially connected to each other, and are connected between the output terminal of the constant-voltage power supply circuit 120 and the drain terminal of the power transistor 130. A over-current suppression circuit 140a includes a first drive resistor 141a and a conduction control transistor 142a, which is an N-MOS field effect transistor, the drain terminal of the conduction control transistor 142a is connected to a connection point between a first drive resistor 141a and a second drive resistor 141b serially connected between the gate terminal of the power transistor 130 and an output terminal for a control output signal Dr of the monitoring/controlling means 110A, the source terminal thereof is connected to the ground circuit GND, and the gate terminal thereof is connected to the current detection resistor 131. The over-current suppression circuit 140a is a negative feedback control circuit which cooperates with the conduction control transistor 142a operating in response to a detected voltage of the current detection resistor 131, thereby linearly controlling the conduction state of the power transistor 130 so that the load current flowing through the power transistor 130 falls below a limit threshold current Ic larger than a predetermined reference current value Ir corresponding to a nominal current of the power transistor 130, and, when a short-circuit abnormality of the electric load 103 occurs, maintains the voltage between both the terminals of the power transistor 130 to a value equal to or more than a predetermined logic determination voltage.

The current detection resistor 131 is serially connected to the current mirror circuit through which a minute current proportional to the drain current of the power transistor 130 flows, and is configured to generate, when the reference current Ir is flowing through the power transistor 130, a first voltage between both terminals $E1=Rr \times Ir/n$, and to generate, when the limit threshold current Ic is flowing through the power transistor 130, a second voltage between both terminals $E2=Rr \times Ic/n$, where Rr denotes a resistance of the current detection resistor 131, and n is a current mirror rate, the first voltage between both terminals E1 is set to be equal to or less than the gate-off voltage Eoff (such as DC 2V) of the conduction control transistor 142a, and the second voltage between both terminals E2 is set to be equal to or more than the gate-on voltage Eon (such as DC 4V) of the conduction control transistor 142a. It should be noted that when the gate voltage of the conduction control transistor 142a is equal to or less than the gate-off voltage Eoff, the conduction control transistor 142a is in a completely open-circuit state, and when the gate voltage of the conduction control transistor 142a is equal to or more than the gate-on voltage Eon, the conduction control transistor 142a is in a complete conductive state, and a relationship $E1 \leq Eoff < Eon \leq E2$ holds.

An overheat interruption circuit 140b mainly includes an interruption control transistor 142b, which is an N-MOS field effect transistor, a comparison amplifier 143, and a temperature detection element 144a, the drain terminal of the interruption control transistor 142b is connected to the connection point between the first drive resistor 141a and the second drive resistor 141b, the source terminal is connected to the ground circuit GND, and the gate terminal is connected to an output terminal of the comparison amplifier 143. To an inverting input terminal of the comparison amplifier 143, a reference voltage 144b is applied, and, to a non-inverting input terminal thereof, the temperature detection element 144a is connected. It should be noted that the temperature detection element 144a detects a neighborhood temperature of the power transistor 130, as the temperature increases, the electric potential of the non-inverting input of the comparison amplifier 143 rises, and, when the electric potential finally exceeds the reference voltage 144b applied to the inverting input terminal, the output logic of the comparison amplifier 143 reaches the high level, the interruption control transistor 142b reaches the close circuit state, and, as a result, the power transistor 130 reaches the open-circuit state. When the output logic of the comparison amplifier 143 reaches the high level, the voltage of the non-inverting input terminal rises via a positive feedback resistor (not shown) and the output logic of the comparison amplifier 143 remains the high level.

A state detection circuit 150 includes a state detection transistor 151, which is an N-MOS field effect transistor, a drive resistor 152 serving also as a pull-down resistor, which is described later, a stabilization resistor 153, a voltage limiting diode 155, and a pull-up resistor 154. The drive resistor 152 and the stabilization resistor 153 are serially connected to each other, and are connected between the drain terminal and the source terminal of the power transistor 130. A connection point between the drive resistor 152 and the stabilization resistor 153 is connected to the gate terminal of the state detection transistor 151, and, to the stabilization resistor 153, the voltage limiting diode 155 is connected in parallel. The source terminal of the state detection transistor 151 is connected to the ground circuit GND, and the drain terminal is connected to an input terminal of a state detection signal Mn of a determination storing circuit 160A, and is connected via a pull-up resistor 154 to the output terminal of the constant-voltage power supply circuit 120.

It should be noted that the signal voltage level of the state detection signal Mn reaches "H" (logic "1") as a result of the state detection transistor 151 reaching the open-circuit state when the signal voltage level of the control output signal Dr is "H" (logic "1"), and the power transistor 130 is in the normal closed-circuit state. Further, when the signal voltage level of the control output signal Dr is "L" (logic "0"), and the power transistor 130 is in the normal open-circuit state, the state detection transistor 151 is driven, via the electric load 103 and the drive resistor 152, to reach the closed-circuit state, and the signal voltage level of the state detection signal Mn reaches "L" (logic "0"). The resistance of the drive resistor 152 is extremely large compared with the resistance of the electric load 103 so as not to actually operate the electric load 103 by a closed-circuit drive current of the state detection transistor 151.

A disconnection detection circuit 180, which is described later referring to FIG. 2, generates, when an internal disconnection of the electric load 103 or a disconnection of external wiring such as the positive-side wiring 104b or the negative-side wiring 104c occurs, a disconnection detection signal OP, the signal voltage level of which is "H". A description is given hereinafter of the determination storing circuit 160A which operates while the control power supply voltage Vcc is fed. A normal closed-circuit determination element 161a is an AND element, to which the control output signal Dr, the state detection signal Mn, and a logically inverted signal of the disconnection detection signal OP are input, a filter circuit 161b is a low-pass filter including a resistor (not shown) and a capacitor (not shown), a normal closed-circuit storing element 161c is a flip-flop circuit which operates in response to a set input and a reset input, when the control output signal Dr represents the circuit closing command (logic level "H"), the state detection signal Mn detects the closed-circuit state (logic level "H"), and the disconnection detection signal OP represents the non-disconnection state (logic level "L"), the output voltage level of the AND element 161a becomes "H", via the filter circuit 161b, the normal closed-circuit storing element 161c is set, and a normal closed-circuit storing signal M1 is supplied to the microprocessor 110A. The filter circuit 161b eliminates a momentary error operation signal due to a response delay of the respective circuits, and the capacitor is discharged by a reset command signal RST described later.

A normal open-circuit determination element 162a is an AND element, to which a logically inverted input of the control output signal Dr, a logically inverted signal of the state detection signal Mn, and the logically inverted signal of the disconnection detection signal OP are input, a filter circuit 162b is a low-pass filter including a resistor (not shown) and a capacitor (not shown), a normal open-circuit storing element 162c is a flip-flop circuit which operates in response to a set input and a reset input, when the control output signal Dr represents the circuit opening command (logic level "L"), the state detection signal Mn detects the open-circuit state (logic level "L"), and the disconnection detection signal OP represents the non-disconnection state (logic level "L"), the output voltage level of the AND element 162a becomes "H", via the filter circuit 162b, the normal open-circuit storing element 162c is set, and a normal open-circuit storing signal M2 is supplied to the microprocessor 110A. The filter circuit 162b eliminates a momentary error operation signal due to a response delay of the respective circuits, and the capacitor is discharged by the reset command signal RST described later.

A command history storing circuit 170, which is a part of the determination storing circuit 160A, includes filter circuits 173b and 174b, an on-command storing element 173c, an inverting logic element 174a, and an off-command storing element 174c. The filter circuits 173b and 174b are low-pass filters including resistors (not shown) and capacitors (not shown) and the capacitors are discharged by the reset command signal RST described later. The on-command storing element 173c is a flip-flop circuit operating in response to a set input and a reset input, and, when the control output signal Dr is applied via the filter circuit 173b as a set input, generates an on-command storing signal M3, and inputs the on-command storing signal M3 to the microprocessor 110A. The off-command storing element 174c is a flip-flop circuit operating in response to a set input and a reset input, and, when an inverted logic signal of the control output signal Dr generated by the inverting logic element 174a is applied via the filter circuit 174b as a set input, generates an off-command storing signal M4, and inputs the off-command storing signal M4 to the microprocessor 110A. It should be noted that the filter circuits 173b and 174b prevent the on-command storing circuit 173c and the off-command storing circuit 174c from carrying out the storing operation due to malfunction caused by a momentary noise pulse.

The microprocessor 110A reads the normal closed-circuit storing signal M1, the normal open-circuit storing signal M2, the on-command storing signal M3, and the off-command storing signal M4, thereby determining storing states of a first normality memory R11, a second normality memory R21, a first abnormality memory R12, and a second abnormality memory R22 described later referring to FIG. 5, and generates the reset command signal RST to reset the normal closed-circuit storing element 161c, the normal open-circuit storing element 162c, the on-command storing element 173c, and the off-command storing element 174c. It should be noted that when the disconnection detection circuit 180 detects a disconnection abnormality, and, thus, the logic level of the disconnection detection signal OP becomes H, the microprocessor 110A resets the normal closed-circuit storing element 161c and the normal open-circuit storing element 162c, and acts on the normal closed-circuit determination element 161a and the normal open-circuit determination element 162a so as to prevent the normal closed-circuit storing element 161c and the normal open-circuit storing element 162c from being set.

Figure 2:
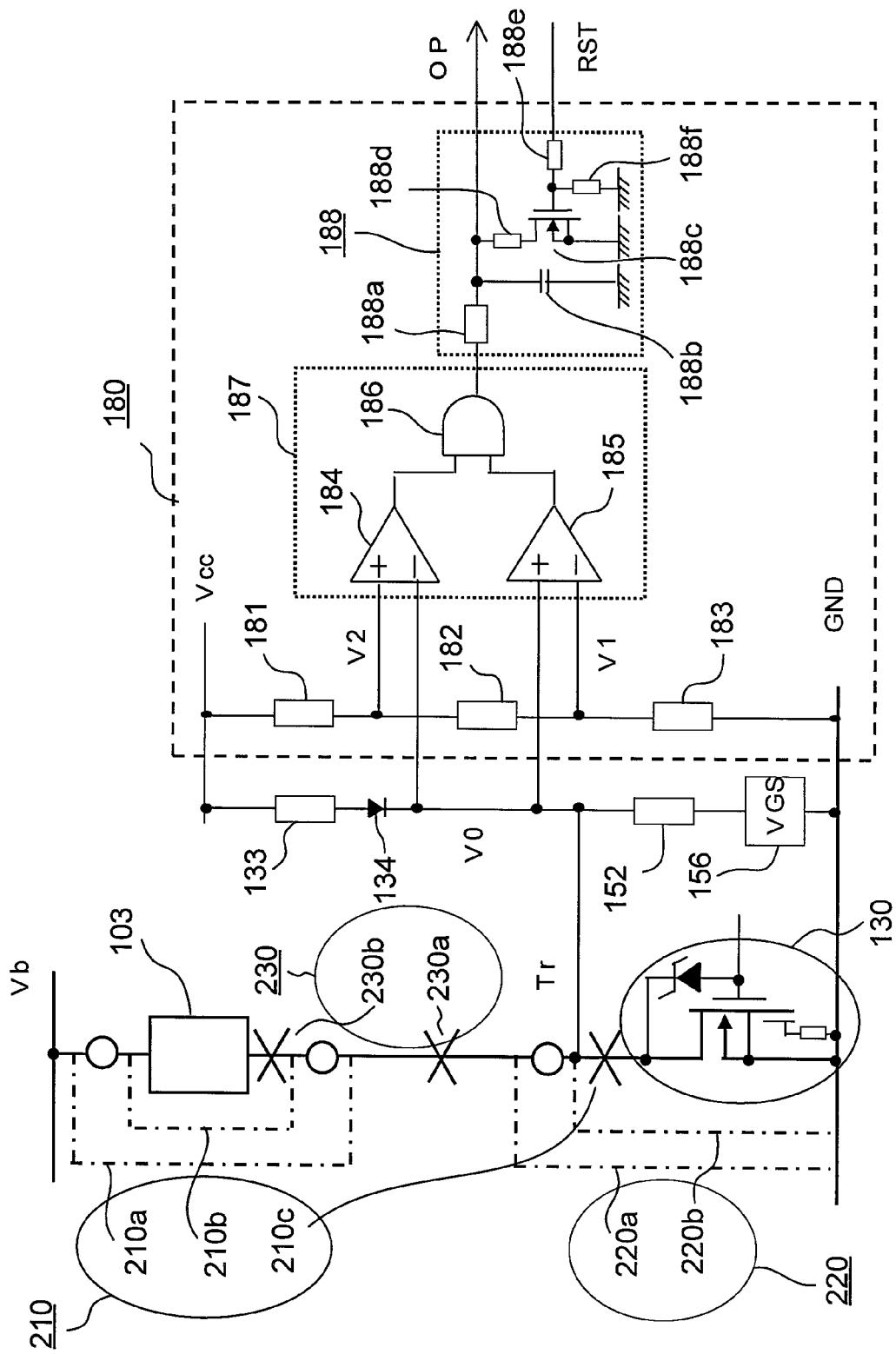
FIG. 2 is a detailed diagram of a disconnection detection circuit 180 illustrated in FIG. 1.

A description is given of FIG. 2, which is a detailed diagram of the disconnection detection circuit 180 illustrated in FIG. 1. In FIG. 2, the disconnection detection circuit 180 includes voltage dividing resistors 181, 182, and 183, and a zone comparison circuit 187, and a filter circuit 188. The voltage dividing resistors 181, 182, and 183 are serially connected to each other, receive electricity supplied from the control power supply voltage Vcc, and generate a first voltage V1 and a second voltage V2 (V1<V2). Further, an opening/closing terminal voltage Tr of the power transistor 130 is input as a monitored voltage V0 to the disconnection detection circuit 180.

The second voltage V2 is applied to a non-inverting input terminal of a second comparison circuit 184 in the zone comparison circuit 187, and a monitored voltage V0 is applied to an inverting input terminal, and, when a relationship V2>V0 holds, a comparison determination output, the signal voltage level of which is "H", is generated. The monitored voltage V0 is applied to a non-inverting input terminal of a first comparison circuit 185 in the zone comparison circuit 187, and the first voltage V1 is applied to an inverting input terminal, and, when a relationship V0>V1 holds, a comparison determination output, the signal voltage level of which is "H", is generated. To an AND element 186, the comparison determination outputs of the first comparison circuit 185 and the second comparison circuit 184 are input, and the AND element 186 generates, when both the respective comparison determination outputs are the logic level "H", an output voltage, the logic level of which is "H", and generates, via the filter circuit 188, the disconnection detection signal OP.

The filter circuit 188 includes a charge resistor 188a for a capacitor 188b, and a discharge transistor 188c used, when the reset command signal RST is given, for quickly discharge an electric charge of the capacitor 188b. The discharge transistor 188c, of which a stabilization resistor 188f is connected between the gate terminal and the source terminal is connected via a discharge resistor 188d to the capacitor 188b in parallel with each other, and is driven, when the logic level of the reset command signal RST becomes "H", via the drive resistor 188e, to be conductive.

On this occasion, when the resistances of the voltage dividing resistors 181, 182, and 183 are denoted by R181, R182, and R183, respectively, the first voltage V1 and the second voltage V2 are obtained by the following equations (1) and (2), respectively.

$$V1 = Vcc \times R183/(R181+R182+R183) \quad (1)$$

$$V2 = Vcc \times (R182+R183)/(R181+R182+R183) \quad (2)$$

On the other hand, when the resistances of the pull-up resistor 133 and the pull-down resistor 152 are denoted by R133 and R152, respectively, the forward voltage drop of the reverse current protection diode 134 is denoted by Vd, and the value of the voltage between the gate/source 156 of the state detection transistor 151 is denoted by Vgs, and when the power transistor 130 is in the open-circuit state, and any one of load wiring disconnection 230a and a load internal disconnection 230b is present, the value of the monitored voltage V0 is represented by an equation (3).

$$V0 = Vgs + R152 \times (Vcc - Vd - Vgs)/(R133+R152) \quad (3)$$

The respective circuit constants are defined so that the first voltage V1 and the second voltage V2 and the monitored voltage V0 calculated by the equations (1), (2), and (3), respectively, satisfy a relationship V2>V0>V1. On one hand, when the power transistor 130 is in the normal closed-circuit state, the monitored voltage V0 is a normal closed-circuit voltage Von, which is less than the first voltage V1. Further, when the disconnection abnormality is not present and the power transistor 130 is in the normal open-circuit state, the monitored voltage V0 is a normal open-circuit voltage Voff which exceeds the second voltage V2, and is a value approximately equal to the power supply voltage Vb of the drive power source 101.

Therefore, when the disconnection abnormality is not present, or when the disconnection abnormality is present, but the power transistor 130 is in the normal closed-circuit state, the signal voltage level of the disconnection detection signal OP is "L", and when the disconnection abnormality is present, and the power transistor 130 is in the normal open-circuit state, the signal voltage level of the disconnection detection signal OP is "H", and the disconnection abnormality is identified and detected. It should be noted that the reverse current protection diode 134 serves, when no disconnection abnormality is present and the power transistor 130 is in the normal open-circuit state, to prevent a current from flowing from the electric load 103 via the pull-up resistor 133 into an output circuit of the constant-voltage power supply circuit 120. A load internal/external disconnection 230 generally refers to the load wiring disconnection 230a and the load internal disconnection 230b, and does not identify which disconnection is present. Further, the load internal/external short circuit or the like 210 includes an across-load wiring short circuit 210a caused by a contact between the positive-side wiring 104b and the negative-side wiring 104c, a load internal short circuit 210b, and a switching element fusion 210c, any of these cases is an abnormality in which the power transistor 130 cannot attain the normal closed-circuit state, and it is not possible to determine which of these short circuit abnormalities and the switching element fusion has occurred.

Figure 8:
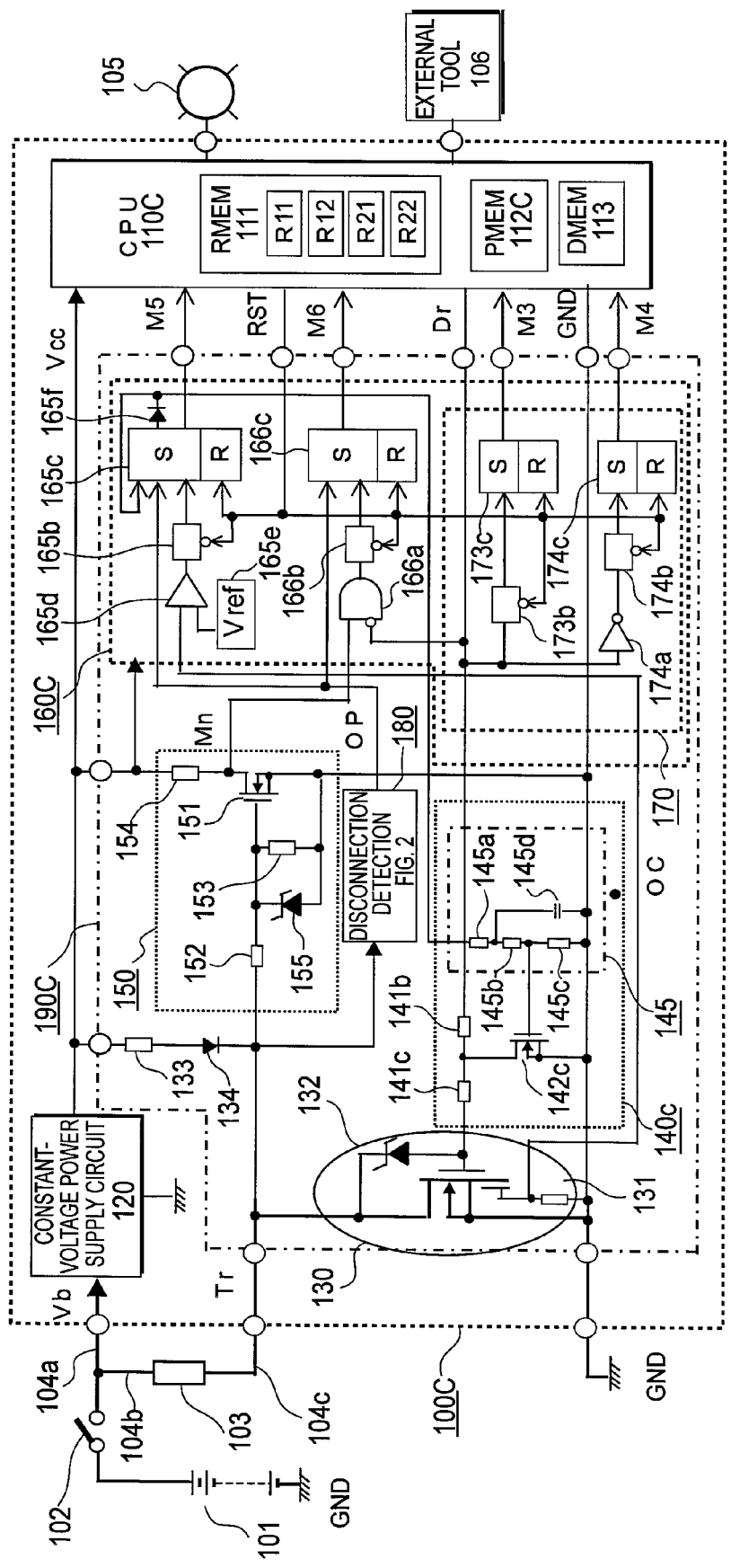
FIG. 8 is a block diagram of an entire circuit of a drive control device for an electric load according to a third embodiment of the present invention.

It should be noted that when the overheat interruption circuit 140b or an over-current interruption circuit 140c described later referring to FIG. 8 is activated, the same phenomena occur as in the case of the switching element fusion 210c, and the switching element fusion 210c includes a switching element forced interruption state. Further, an element internal/external short circuit 220 includes an across-element wiring short circuit 220a in which the negative-side wiring 104c comes in contact with the ground GND, and an element internal short circuit 220b of the power transistor 130, any of these cases is an abnormality in which the power transistor 130 cannot attain the normal open-circuit state, and it is not possible to determine which of these short circuit abnormalities has occurred. Further, when the across-load wiring short circuit 210a and the load wiring disconnection 230a occur at the positions illustrated in FIG. 2 at the same time, the across-load wiring short circuit 210a and the load wiring disconnection 230a are detected as the load internal/external disconnection 230, and when the across-load wiring short circuit 210a and the load internal disconnection 230b occur at the same time, the across-load wiring short circuit 210a and the load internal disconnection 230b are detected as the load internal/external short circuit or the like 210. When the across-load wiring short circuit 210a and the across-element wiring short circuit 220a occur at the same time, positive and negative terminals of the drive power source 101 are short-circuited, and a fuse (not shown) is fused, resulting in a stop of the power supply to the drive control device 100A. When the across-load short circuit 210a and the element internal short circuit 220b occur at the same time, the positive and negative terminals of the drive power source 101 are short-circuited, however, generally, before the fusion of the fuse occurs, the inside of the power transistor 130 fuses, resulting in a generation of the abnormality of the switching element fusion 210c.

A description is given of FIGS. 3(A) and (B) which are tables of contents of the stored determination of the determination storing circuit 160 illustrated in FIG. 1. FIG. 3(A)

describes the state detection and the stored determination, illustrates the logic levels of the normal closed-circuit storing signal M1 and the normal open-circuit storing signal M2 and an abnormality generation category corresponding to a combination of the logic levels of the control output signal Dr and the state detection signal Mn, and, in a first row (A1) to a fourth row (A4) of the table, both the disconnection detection signal OP and the reset command signal RST are at the logic level "L", and are in a state in which a disconnection is not detected and the reset command is cleared.

In the first row (A1) of the table, in terms of the normal closed-circuit storing signal M1, when the control output signal Dr is the circuit closing command signal (logic level "H"), and the voltage between both terminals Tr of the switching element 130 is equal to or less than the predetermined closed-circuit voltage Von, the state detection transistor 151 reaches the open-circuit state, then, the state detection signal Mn reaches the logic level "H", and, as a result, the logic level of the normal closed-circuit storing signal M1 becomes "H", so as to make a preliminary normality determination which considers that the switching element 130 has normally carried out the circuit closing operation, while leaving a possibility that this is a state in which abnormality of the internal short circuit of the switching element 130 or the element internal/external short circuit 220 which is the across-element wiring short circuit may have occurred.

In the second row (A2) of the table, in terms of the normal closed-circuit storing signal M1, when the control output signal Dr is the circuit closing command signal (logic level "H"), and the voltage between both terminals Tr of the switching element 130 exceeds the predetermined closed-circuit voltage Von, the state detection transistor 151 reaches the closed-circuit state, then, the state detection signal Mn reaches the logic level "L", and, as a result, the logic level of the normal closed-circuit storing signal M1 becomes "L", the determination of the closed-circuit abnormality is made, and this closed-circuit abnormality determination is made in case of an abnormality such as the load internal/external short circuit or the like 210 implying the internal short circuit of the electric load 103, the short circuit across the load caused by external wiring, or the fused state in which the switching element 130 cannot reach the closed-circuit state.

In the third row (A3) of the table, in terms of the normal open-circuit storing signal M2, when the control output signal Dr is the circuit opening command signal (logic level "L"), and the voltage between both terminals Tr of the switching element 130 is equal to or more than the predetermined closed-circuit voltage Voff, the state detection transistor 151 reaches the closed-circuit state, then, the state detection signal Mn reaches the logic level "L", and, as a result, the logic level of the normal open-circuit storing signal M2 becomes "H", and a preliminary normality determination which considers that the switching element 130 has normally carried out the circuit opening operation is made, this is a state in which the abnormality of the load internal/external short circuit or the like 210 may have occurred.

In the fourth row (A4) of the table, in terms of the normal open-circuit storing signal M2, when the control output signal Dr is the circuit opening command signal (logic level "L"), and the voltage between both terminals Tr of the switching element 130 is less than the predetermined closed-circuit voltage Voff, the state detection transistor 151 reaches the open-circuit state, then, the state detection signal Mn reaches the logic level "H", and, as a result, the logic level of the normal open-circuit storing signal M2 becomes "L", the open-circuit abnormality determination is made, and this open-circuit abnormality determination is made in case of the abnormality of the element internal/external short circuit 220.

In the fifth row (A5) of the table, when the control output signal Dr is the circuit opening command signal (logic level "L"), and the disconnection detection signal OP reaches the logic level "H", both the normal closed-circuit storing signal M1 and the normal open-circuit storing signal M2 reach the logic level "L", and a determination that the load internal/external disconnection 220 has occurred is made. Until the reset command signal RST is cleared, independently of the logic levels of the control output signal Dr and the state detection signal Mn, both the normal closed-circuit storing signal M1 and the normal open-circuit storing signal M2 are at the logic level "L", which implies the abnormality determination should not be made during the generation of the reset command signal.

FIG. 3(B) describes a command history and the stored determination, and is a table illustrating, in the state in which the reset command signal RST is cleared, a combination of the logic levels of the normal closed-circuit storing signal M1, the normal open-circuit storing signal M2, the on-command storing signal M3, and the off-command storing signal M4 and an overall determination result. It should be noted that in a case where the normal closed-circuit storing signal M1 is not generated, when the on-command storing signal M3 is not generated, it cannot be considered that a closed-circuit abnormality is present, in a case where the normal open-circuit storing signal M2 is not generated, when the off-command storing signal M4 is not generated, it cannot be considered that an open-circuit abnormality is present, and it is thus necessary to consider the logic levels of the on-command storing signal M3 and the off-command storing signal M4 for the overall determination.

Preliminary normality determination portions in the table are denoted by a reference numeral B1 below the table in FIG. 3(B), when a Boolean logic equation $(M1 \times M3)=(H)$ holds, the closed circuit preliminary normality is determined, and when a Boolean logic equation $(M2 \times M4)=(H)$ holds, the open circuit preliminary normality is determined. Closed circuit and open circuit normality determination portions are denoted by a reference numeral B2 in the table, and when a Boolean logic equation $(M1 \times M2 \times M3 \times M4)=(H)$ holds, and, thus, both the closed circuit preliminary normality and the open circuit preliminary normality hold, the closed circuit normality and the open circuit normality are determined. Abnormality determination portions are denoted by a reference numeral B3 in the table, when a Boolean logic equation $(NM1 \times M3)=(H)$ holds, the closed-circuit abnormality is determined, and when a Boolean logic equation $(NM2 \times M4)=(H)$ holds, the open-circuit abnormality is determined, where NM1 is the negative logic of M1, and NM2 is the negative logic of M2.

A reference numeral B4 in the table denotes uncertain determination portions, when a Boolean logic equation $(NM2 \times NM4)=(H)$ holds, the open-circuit determination is uncertain, and when a Boolean logic equation $(NM1 \times NM3)=(H)$ holds, the closed-circuit determination is uncertain. When $(NM3 \times NM4)=(H)$ holds, a logic abnormality described later is present, where NM3 is the negative logic of M3, and NM4 is the negative logic of M4. Load internal/external disconnection determination portions are denoted by a reference numeral B5 in the table, and, when a Boolean logic equation $(NM1 \times NM2) \times (M3 \times M4)=(H)$ holds, the load internal/external disconnection is determined. When $(NM3 \times NM4)=(H)$ holds, the logic abnormality described later is present, and when a Boolean logic equation $(NM1 \times NM2) \times (M3 \times NM4 + NM3 \times M4)=(H)$ holds, a compound abnormality state in which the disconnection abnormality, the closed-circuit abnormality, or the open-circuit abnormality is present.

Determination portions of the logic abnormality are denoted by a reference numeral B6 in the table, when a Boolean logic equation N(M3+M4)=(H), a Boolean logic equation (M1×NM3)=(H), or a Boolean logic equation (M2×NM4)=(H) holds, a noise malfunction, or a logic abnormality of the control circuit portion other than the electric load, the load wiring, and the switching element is present, and N(M3+M4) is the negative logic of (M3+M4). It should be noted that, except for a period in which the reset command is active, at least one of the on-command storing signal M3 and the off-command storing signal M4 is at the logic level "H", and a case in which both of the on-command storing signal M3 and the off-command storing signal M4 become the logic level "L" cannot happen in terms of logic. Further, a case in which, when the on command is not generated, the normal closed-circuit storing state is active, or when the off command is not generated, the normal open-circuit storing state is active cannot happen in terms of logic.

(2) Detailed Description of Effects and Operations

A description is given of effects and operations of the device according to the first embodiment of the present invention configured as illustrated in FIG. 1 referring to flowcharts illustrated in FIGS. 4 and 5. First, in FIGS. 1 and 2, when the power supply switch (not shown) is brought into the closed-circuit state, the output contact point of the power supply relay 102 is brought into the closed-circuit state, the power is supplied to the drive control device 100A, and the microprocessor 110A starts the operation. The microprocessor 110A, according to the operation states of the plurality of input signals (not shown) and contents of the control program stored in the program memory 112A, performs the drive control of the plurality of electric loads (not shown). The power supply to the electric load 103, which is a part of the plurality of electric loads, is controlled by the switching element 130 serving as the power transistor subjected to opening/closing control in response to the control output signal Dr generated by the microprocessor 110A.

The microprocessor 110A, cooperating with the state detection circuit 150, the disconnection detection circuit 180, and the determination storing circuit 160A, detects the presence/absence of the abnormalities such as the load internal/external short circuit or the like 210 including the across-load wiring short circuit 210a, the load internal short circuit 210b, and the switching element fusion 210c, the element internal/external short circuit 220 including the across-element wiring short circuit 220a and the element internal short circuit 220b, and the load internal/external short circuit 230 including the load wiring disconnection 230a and the load internal disconnection 230b, and writes a result of the detection in the RAM 111 for storage. When the power supply switch is brought into the open-circuit state, the power supply relay 102 maintains the closed-circuit state for the predetermined delay period, and, in this delayed power supply period, the abnormality generation information stored in the RAM 111 is transferred to and stored in the nonvolatile data memory 113. It should be noted that a load current IL which flows through the electric load 103 when the power transistor 130 is brought into the closed-circuit state is represented as IL≈Vb/RL where the power supply voltage of the drive power source 101 is Vb, and a load resistance of the electric load 103 is RL, and the load current IL is set so as to be equal to or smaller than the reference current Ir corresponding to the nominal current of the power transistor 130.

Thus, the voltage between both terminals of the current detection resistor 131 takes a value equal to or less than the first voltage between both terminals E1=Rr×Ir/n, and, thus, the state in which the conduction control transistor 142a is completely turned off and the power transistor 130 is completely conductive is secured. When the logic level of the control output signal Dr becomes "L", the gate voltage of the power transistor 130 becomes zero, and the open-circuit state is brought about between the drain terminal and the source terminal of the power transistor 130. When the power transistor 130 is brought into the open-circuit state, via the electric load 103 and the drive resistor 152, the state detection transistor 151 becomes conductive. It should be noted that the resistance R152 of the drive resistor 152 is designed with respect to the load resistance RL of the electric load 103 so as to hold a relationship R152>>RL, and, thus, the electric load 103 is not operated by a minute drive current.

A description is be given of FIG. 4 which is a flowchart describing an operation of the device illustrated in FIG. 1, and FIG. 5 which is a flowchart detailing a part of the operation in FIG. 4. In FIG. 4, Step 400 is a start step of the abnormality determination operation by the microprocessor 110A included in the monitoring/controlling means. The following Step 401a is a determination step, from which the operation proceeds, when Step 401a is executed for the first time, by a determination "YES", to Step 401b, and proceeds, when Step 401a is executed for the second and subsequent times, by a determination "NO", to Step 402a. Step 401b is a step of resetting the first normal memory R11 and the second normal memory R21, the first abnormal memory R12 and the second abnormal memory R22, and a shift resistor 520 written in Step block 500 described later, from which the operation proceeds to Step 402a.

Step 402a is a determination step of determining whether a timing for writing the control output signal Dr to an output latch memory (not shown) has been reached. In Step 402a, a determination "YES" is periodically made, and the operation proceeds to Step 402b, and a determination "NO" is periodically made, and the operation proceeds to Step 403. In Step 402b, the microprocessor 110A uses the command output generation means to generate the control output signal Dr, thereby generating a switching command output to the switching element 130, and then the operation proceeds to Step 408a.

Step 403 is a determination step of determining whether a timing for reading, from the determination storing circuit 160A, the normal closed-circuit storing signal M1, the normal open-circuit storing signal M2, the on-command storing signal M3, and the off-command storing signal M4, has been reached. In Step 403, a determination "YES" is periodically made, and the operation proceeds to Step 404a, and a determination "NO" is periodically made, and the operation proceeds to Step 408a. It should be noted that, in Step 408a described later, when the power supply switch is in the closed-circuit state, a determination "NO" is made, and the operation proceeds to an operation finishing Step 409a, and in the operation finishing Step 409a, the microprocessor 110A executes other control programs, and then the operation proceeds again to the operation start Step 400. Then, while the control flow circulating among Steps 400, 402a, 403, 408a, 409a, and 400, when the determination "YES" is periodically made in Step 402a, the microprocessor 110A executes Step 402b, and when the determination "YES" is periodically made in Step 403, the microprocessor 110A executes Steps 404a to 407b.

In Step 404a, the microprocessor 110A uses the determination information reading means to read, from the determination storing circuit 160A, the normal closed-circuit storing signal M1, the normal open-circuit storing signal M2, the on-command storing signal M3, and the off-command storing signal M4, and then the operation proceeds to Step 404b, and in Step 404b, the microprocessor 110A generates the reset command signal RST for the stored information directed to the determination storing circuit 160A, and the operation proceeds to Step block 500. It should be noted that, in Step 404a, when the signal voltage level of the storing signals M1 to M4 is "H", the logic value "1" is written to a corresponding predetermined address in the RAM 111, and when the signal voltage level is "L", the logic value "0" is written to the address, the inverted logic value may be written. It should be noted that in Step block 500, as described later referring to FIG. 5, according to the logic states of the signals M1 to M4 read in Step 404a, the microprocessor 110A controls the first normality memory R11 and the second normality memory R21, and the first abnormality memory R12 and the second abnormality memory R22, and writes the overall determination result to the shift register 520 inside the RAM 111. In the following Step 405, the microprocessor 110A resets the first normality memory R11, the second normality memory R21, the first abnormality memory R12, and the second abnormality memory R22, and the operation proceeds to Step 406a.

Step 406a is a determination step, in which the microprocessor 110A uses the recheck processing means to determine whether the first overall determination result written to the shift resistor 520 in Step block 500 contains an abnormality determination, when an abnormality determination is contained, a determination "YES" is made, and the operation proceeds to Step 408a to carry out a check operation in the next control cycle, and when an abnormality determination is not contained, or when an abnormality determination is contained, but the check operation has been carried out, a determination "NO" is made, and the operation proceeds to Step 406b. Step 406b is a determination step, in which a determination "YES" is made when the determination in Step 406a is, as a result of the check operation, that an abnormality is present, and the operation proceeds to Step 407a, and a determination "NO" is made when Step 406a is the first determination or the second determination that an abnormality is not present, and the operation proceeds to Step 407b. In the check and determination in Steps 406a and 406b, the microprocessor 110A may perform the check operation three times, and determine the presence/absence of an abnormality according to majority decision.

Step 407a is a determination step, in which the microprocessor 110A uses the abnormality handling means to set the control output signal Dr to the circuit opening command when a cause of the abnormality is the load internal/external short circuit or the like 210, and report the abnormality generation state by the alarm display 105, for example, and confirm and store the abnormality generation categorized by the cause, and then the operation proceeds to Step 408a. Step 407b is a step of storing the normality determination, or the state in which the control output signal Dr is any one of the circuit closing command and the circuit opening command, and presence/absence of an abnormality cannot be confirmed. The operation proceeds from Step 407b to Step 408a.

Step 408a is a determination step, in which, when the power supply switch is in the closed-circuit state, a determination "NO" is made, and the operation proceeds to the operation finishing Step 409a and again proceeds to the operation start Step 400, and, when the power supply switch is in the open-circuit state, a determination "YES" is made, and hence the operation proceeds to Step 408b. In Step 408b, the microprocessor 110A uses the abnormality handling means to store the abnormality generation information categorized by the cause confirmed and stored in Step 407a in the nonvolatile data memory 113, and then the operation proceeds to Step 409b. In Step 409b, the microprocessor 110A deenergizes the power supply relay 102. It should be noted that the data to be stored in the data memory 113 is the number of generated abnormalities categorized by the cause, and, when the forwarding in Step 408b is carried out, data obtained by reading out an accumulated number of times up to the previous time and incremented by one is written for update.

In the power transistor 130, the state detection circuit 150, and the determination storing circuit 160A included in the intelligent power switch 190A, the switching element 130 carries out, in response to the logic level of the control output signal Dr, the switching control operation, thereby controlling the power supply state to the electric load 103. The state detection signal Mn responding to the switching operation state of the switching element 130, and the disconnection detection signal OP responding to the load internal/external disconnection state are supplied via the state detection circuit 150 and the disconnection detection circuit 180 to the determination storing circuit 160A. The determination storing circuit 160A, responding to the control output signal Dr, the state detection signal Mn, and the disconnection detection signal OP, generates the normal closed-circuit storing signal M1, the normal open-circuit storing signal M2, the on-command storing signal M3, and the off-command storing signal M4, which serve as the determination storing signal, and inputs the signals to the microprocessor 110A. The stored state of the determination storing circuit 160A is reset by the power-on detection circuit 121 when the power supply is turned on, and is reset by the reset command signal RST from the microprocessor 110A, and becomes the logic level "L".

In FIG. 5 detailing Step block 500 in FIG. 4, Step 501 is a start step of a subroutine program. The following Step 502a is a determination step, in which the microprocessor 110A determines whether the on-command storing signal M3 and the off-command storing signal M4 read in Step 404a are both at the logic level "L", and, when both of the signals are at the logic level "L", a determination "YES" is made, and the operation proceeds to Step 502b, and, when any one of or both of the signals is at the logic level "H", a determination "NO" is made, and the operation proceeds to Step 502c. It should be noted that the determination "YES" is made in Step 502a when the reset command signal RST to the determination storing circuit 160A is at the logic level "H", and when the reset command signal RST is cleared to the logic level "L", but the predetermined delayed response period caused by the filter circuits 173b and 174b continues, the determination "YES" is made and the determination based on the normal closed-circuit storing signal M1 and the normal open-circuit storing signal M2 are not made. In practice, when, as the read timing of the determination signals M1 to M4, not a timing immediately after a change of the control output signal Dr, but a timing between the rewrite timings of the control command signal Dr is set, the determination in Step 502a is usually "NO", and the operation immediately proceeds to Step 503.

In Step 502b, a determination "NO" is made within a predetermined period after the determination "YES" is made in Step 502a, and the operation proceeds to Step 509 to return to Step 405 in FIG. 4. The operation proceeds from the operation finishing Step 409a in FIG. 4 to the operation start Step 400 to return to Steps 502a and 502b in FIG. 5. While this circulation of operation repeats, when the reset command signal RST is cleared, but the determination "NO" is not made in Step 502a after the predetermined period has passed, a determination "YES" is made in Step 502b, which corresponds to an excess in time, and the operation proceeds to Step 526.

Step 502c is a determination step, in which, when the on-command storing signal M3 is not storing the on command, but the normal closed-circuit storing signal M1 is storing the normal-closed circuit state, or when the off-command storing signal M4 is not storing the off command, but the normal open-circuit storing signal M2 is storing the normal open-circuit state, the microprocessor 110A determines that the logic abnormality is present and a determination "YES" is made, and the operation proceeds to Step 526, and, when the microprocessor 110A determines that the logic abnormality is not present, a determination "NO" is made, and the operation proceeds to Step 503.

Step 503 is a determination step, in which the microprocessor 110A determines whether the on-command storing signal M3 is storing the logic value "1" representing that the on-command storing information is present, and when the storing information is present, a determination "YES" is made, and the operation proceeds to Step 504, and when the storing information is not present, a determination "NO" is made, and the operation proceeds to Step 506. Step 504 is a determination step, in which the microprocessor 110A determines whether the normal closed-circuit storing signal M1 is storing the logic value "1" representing that the normal closed-circuit storing information is present, and when the storing information is present, a determination "YES" is made, and the operation proceeds to Step 505a, and when the storing information is not present, a determination "NO" is made, and the operation proceeds to Step 505b.

In Step 505a, the microprocessor 110A writes the logic value "1" to the first normality memory R11, and in Step 505b, the microprocessor 110A writes the logic value "1" to the first abnormality memory R12, and then the operation proceeds to Step 506. Step 506 is a determination step, in which the microprocessor 110A determines whether the off-command storing signal M4 is storing the logic value "1" representing that an off-command storing information is present, and when the storing information is present, a determination "YES" is made, and the operation proceeds to Step 507, and when the storing information is not present, a determination "NO" is made, and the operation proceeds to Step 511.

Step 507 is a determination step, in which the microprocessor 110A determines whether the normal open-circuit storing signal M2 is storing the logic value "1" representing that the normal open-circuit storing information is present, and when the storing information is present, a determination "YES" is made, and the operation proceeds to Step 508a, and when the storing information is not present, a determination "NO" is made, and the operation proceeds to Step 508b. In Step 508a, the microprocessor 110A writes the logic value "1" to the second normality memory R21, and in Step 508b, the microprocessor 110A writes the logic value "1" to the second abnormality memory R22, and then the operation proceeds to Step 511.

In Step 511, when both the first normality memory R11 and the second normality memory R21 have the logic value "1", and both the first abnormality memory R12 and the second abnormality memory R22 have the logic value "0", a determination "YES" is made, which corresponds to a normality determination, and the operation proceeds to Step 521, and, when the normality determination is not made, a determination "NO" is made, and the operation proceeds to Step 512. In Step 512, when both the first abnormality memory R12 and the second abnormality memory R22 have the logic value "1", a determination "YES" is made, which corresponds to an abnormality of the load internal/external disconnection, and the operation proceeds to Step 522, and when the abnormality determination is not made, a determination "NO" is made, and the operation proceeds to Step 513. In Step 513, when the first abnormality memory R12 has the logic value "1" and the second normality memory R21 has the logic value "1", a determination "YES" is made, which corresponds to an abnormality of the load internal/external short circuit or the like, and the operation proceeds to Step 523, and when the abnormality determination is not made, a determination "NO" is made, and the operation proceeds to Step 514. In Step 514, when the first normality memory R11 has the logic value "1" and the second abnormality memory R22 has the logic value "1", a determination "YES" is made, which corresponds to an abnormality of the element internal/external short circuit, and the operation proceeds to Step 524, and when the abnormality determination is not made, a determination "NO" is made, and the operation proceeds to Step 525.

The block 520 is represented as six shift resistors provided with a front stage and a rear stage, Step 521 is a step of writing, to the front stage of a normality determination resistor, the logic value "1" as normality determination information, and Step 522 is a step of writing, to the front stage of a disconnection abnormality determination resistor, the logic value "1" as disconnection abnormality determination information, which corresponds to the load internal/external disconnection 230. Step 523 is a step of writing, to the front stage of a closed-circuit abnormality determination resistor, the logic value "1" as closed-circuit abnormality determination information, which corresponds to the load internal/external short circuit or the like 210, and Step 524 is a step of writing, to the front stage of an open-circuit abnormality determination resistor, the logic value "1" as open-circuit abnormality determination information, which corresponds to the element internal/external short circuit 220. Step 525 is a step of writing, to the front stage of an uncertainty abnormality determination resistor, the logic value "1" as uncertainty determination information, and Step 526 is a step of writing, to the front stage of a logic abnormality determination resistor, the logic value "1" as logic abnormality determination information. It should be noted that, when the logic value "1" is written in any one of Steps 521 to 526, in the other steps, the logic value "0" is written, and when the logic value "1" is again to be written in any one of Steps 521 to 526, prior to this, the information which has already written is shifted at once to the rear stage, and then the operation proceeds to Step 509, and subsequently, the operation proceeds to Step 405 in FIG. 4. In Steps 406a and 406b in FIG. 4, the microprocessor 110A compares the logic values on the front and rear stages of the shift register 520 with each other, thereby determining presence/absence of an abnormality occurring again.

Though, in the above description, the logic value "1" corresponds to the logic level "H" of the signal voltage, and the logic value "0" corresponds to the logic value "L" of the signal voltage, the logic value "1" may correspond to the logic level "L" of the signal voltage, and the logic value "0" may correspond to the logic value "H" of the signal voltage. For example, though the storing signals M1 to M4 use the set output signals of the normal closed-circuit storing element 161c, the normal open-circuit storing element 162c, the on-command storing element 173c, and the off-command storing element 174c, the reset output signals may be input to the microprocessor 110A. Further, though, as the switching element 130, the power transistor, which is the N-MOS field effect transistor connected to the downstream side of the electric load 103 is used, the switching element 130 may be a PNP junction transistor connected to the upstream side of the electric load 103. In this case, though, when the upstream switching element 130 is brought into the closed-circuit state, the voltage level of the output terminal of the switching element 130 is the "H" level, by connecting the state detection transistor driven by the switching element 130 to the downstream side, the logic level of the state detection signal is converted to "L".

Further, the over-current suppression circuit 140a provides the constant current control that, when, during the closed-circuit operation of the switching element 130, the short-circuit abnormality of the electric load 103 occurs, the electric conduction current of the switching element 130 keeps the predetermined threshold, and as a result, the voltage between the terminals Tr of the switching element 130 becomes more than the predetermined voltage, thereby bringing the state detection transistor 151 into the closed-circuit state. However, an intermittent operation that, when the electric conduction current of the switching element 130 exceeds a predetermined threshold, the switching element 130 is shut off, and, when, as a result, the electric conduction current of the switching element 130 becomes equal to or less than the predetermined threshold, the switching element 130 is brought into the closed-circuit state may be provided, and, in this case, when the short-circuit state of the electric load 103 is present, the intermittent operation of the switching element 130 continues, this operation causes the state detection transistor 151 to intermittently operate, a period in which the switching element 130 is in the closed-circuit state is longer than a period in which the switching element 130 is in the open-circuit state, and as a result, the output of the filter circuit 161b does not become the logic level "H". Further, as described later referring to FIG. 8, when, due to the short-circuit abnormality of the electric load 103, an over current flows through the switching element 130, the switching element 130 can be completely shut off.

In any case, the filter circuit 161b and 162b serve to prevent the normal closed-circuit storing element 161c and the normal open-circuit storing element 162c from being set by a false signal in a short period caused by an operation delay of the control elements, and noise pulses. Thus, immediately after the control output signal Dr changes from the circuit opening command to the circuit closing command, or from the circuit closing command to the circuit opening command, after the response delay periods of the filter circuits 161b and 162b, the normal closed-circuit storing signal M1 and the normal open-circuit storing signal M2 become effective. The filter circuits 173b and 174b have larger filter constants than those of the filter circuits 161b and 162b, after the determination storing circuit 160A is reset, until any one of the on-command storing signal M3 and the off-command storing signal M4 becomes the logic level "H", the determination for the normal closed-circuit storing signal M1 and the normal open-circuit storing signal M2 is not made by Step 502a in FIG. 5.

(3) Essential Points and Characteristics of First Embodiment

As apparent from the above description, the drive control device for an electric load according to the first embodiment is the drive control device 100A for an electric load including the switching element 130 serially connected to the electric load 103 to which the power is supplied from the drive power source 101, and the monitoring/controlling means 110A for performing the opening/closing control of the switching element 130, and monitoring presence/absence of an abnormal state of the power supply circuit for the electric load 103, the monitoring/controlling means 110A generates the control output signal Dr serving as the circuit closing command or the circuit opening command directed to the switching element 130, and supplies the switching element 130 and the determination storing circuit 160A with the control output signal, the switching element 130 generates the state detection signal Mn according to open/closed-circuit states of the switching element 130, and supplies the determination storing circuit 160A with the state detection signal Mn, the determination storing circuit 160A detects, when the control output signal Dr is the circuit closing command, whether the switching element 130 has normally been brought into the closed-circuit state and stores a result of the detection, thereby generating the closed-circuit determination storing signal, detects, when the control output signal Dr is the circuit opening command, whether the switching element 130 has normally been brought into the open-circuit state and stores a result of the detection, thereby generating the open-circuit determination storing signal M2, and, when the monitoring/controlling means 110A has read the determination storing signal, is forcedly reset periodically by a command of the monitoring/controlling means 110A, and the monitoring/controlling means 110A further periodically reads and stores the closed-circuit determination storing signal M1 and the open-circuit determination storing signal M2 serving as the determination storing signal before the determination storing circuit 160A is reset, thereby determining the presence/absence of the abnormal state according to the combination of the logics relating to the signal voltage level of the determination storing signal stored before.

Further, the read timing of the determination signal when the monitoring/controlling means 110A periodically reads the closed-circuit determination signal M1 and the open-circuit determination signal M2 is a timing before and after the command supply timing when the monitoring/controlling means 110A generates the control output signal Dr serving as the circuit closing command or the circuit opening command directed to the switching element 130, and the time zone for determination made by the determination storing circuit 160A expands from the reset processing of the stored information of the determination storing circuit 160A caused by a completion of the reading of the determination storing signal for the previous time to a completion of the reading/storing by the monitoring/controlling means 110A reading the determination storing signal for the next time, and when the control output signal Dr changes from the circuit opening command to the circuit closing command or from the circuit closing command to the circuit opening command within the determination time zone, the determination storing signal read for the next time contains both the closed-circuit determination storing signal M1 and the open-circuit determination storing signal M2, and when the control output signal Dr holds any one of the circuit closing command and the circuit opening command, as the determination storing signal read for the next time, any one of the closed-circuit determination storing signal M1 and the open-circuit determination signal M2 is effective. As a result, the timings in which the monitoring/controlling means reads the determination storing signal are timings before and after the generation of the control output signal. Thus, there is provided a characteristic that the determination storing signal read after the control output signal has changed surely contains both the closed-circuit determination storing signal and the open-circuit determination storing signal, and the monitoring/controlling means can comprehensively determine presence/absence of an abnormality when the reading has been completed.

Further, the monitoring/controlling means 110A periodically reads/stores the determination storing signal generated by the determination storing circuit 160A, thereby determining the presence/absence of the abnormality, carries out the recheck processing of checking again, when the abnormality determination made by the reading/storing for this time results in an abnormality, whether the abnormality determination made by the reading/storing for the next time results in an abnormality again, and carries out the abnormality handling when the abnormality determination results in an abnormality for a plurality of times, and the abnormality handling stops the control output signal Dr at least when the abnormality determination result is a short-circuit abnormality of the electric load 103, and supplies the switching element 130 with the circuit opening command. As a result, the monitoring/controlling means 110A carries out the check processing for the abnormality determination result, and then carries out the error handling. Thus, there is provided a characteristic that, when the determination storing circuit which is directly connected to the switching element, which is the power transistor, and is provided close thereto malfunctions due to noises or the like, the recheck processing can prevent an erroneous abnormality handling from being carried out.

Further, the determination storing circuit 160A generates, as the closed-circuit determination storing signal, the normal closed-circuit storing signal M1, and, as the open-circuit determination storing signal, the normal open-circuit storing signal M2, and further includes the command history storing circuit 170 to which the control output signal Dr directed to the switching element 130 is input, the command history storing circuit 170 stores information that the control output signal Dr reaches a logic level corresponding to the circuit closing command, thereby generating the on-command storing signal M3 at the logic "1", and stores information that the control output signal Dr reaches a logic level corresponding to the circuit opening command, thereby generating the off-command storing signal M4 at the logic "1", and along with the determination storing circuit, the stored information is, when the monitoring/controlling means 110A has read the determination storing signal, forcedly reset periodically by the command of the monitoring/controlling means 110A, the monitoring/controlling means 110A includes the first normality memory R11 for storing the preliminary determination that the content of the closed-circuit determination storing signal M1 is a normality or non-abnormality determination when the on-command storing signal M3 is at the logic "1" upon the reading and the first abnormality memory R12 for storing information that the content is a non-normality or abnormality determination, and includes the second normality memory R21 for storing the preliminary determination that the content of the open-circuit determination storing signal M2 is a normality or non-abnormality determination when the off-command storing signal M4 is at the logic "1" upon the reading and the second abnormality memory R22 for storing information that the content is a non-normality or abnormality determination, when both the first normality memory R11 and the second normality memory R21 store the normality preliminary determinations, and none of the first abnormality memory R12 and the second abnormality memory R22 store the abnormality determination, a normality determination is made, when at least one of the first abnormality memory R12 and the second abnormality memory R22 stores the abnormality determination, an abnormality determination, which is the closed-circuit abnormality or the open-circuit abnormality, is made, and when the first normality memory R11 does not store the normality determination, and the first abnormality memory R12 does not store the abnormality determination, or when the second normality memory R21 does not store the normality determination and the second abnormality memory R22 does not store the abnormality determination, the uncertainty determination is made, and the first normality memory R11, the second normality memory R21, the first abnormality memory R12, and the second abnormality memory R22 are periodically reset after the result of the normality preliminary determination, the normality determination, the abnormality determination, or the uncertainty determination is stored while the result is categorized by the cause.

As a result, the determination storing circuit includes the command history storing circuit used for the control output signal, and the monitoring/controlling means makes, after both the on command and off command are generated, the overall normality determination, even when any one of the on command and the off command is generated, the abnormality determination is effective, and, when an abnormality is not generated, the normality determination is suspended. Thus, there is provided a characteristic that, when, after the off command remains for a long period, the on command is generated, the overall normality determination is suspended until the on command is generated, when, while the off command is active, the open-circuit abnormality is generated, an abnormality determination can be quickly made, and when, while the on command is active, and the closed-circuit abnormality is generated, an abnormality determination can be quickly made. Further, there is provided a characteristic that, when the control output signal is a signal for the pulse-width modulation, and the switching operation is carried out in a period in which, from the reading of the determination storing signal for the previous time to the reading for the present time, the control output signal always changes from the circuit closing command or circuit opening command to the circuit opening command or circuit closing command at least once, each time when the reading has been completed, the first normality memory, the second normality memory, the first abnormality memory, and the second abnormality memory are reset, thereby allowing an update and repeat of the normality determination operation or the abnormality determination operation. Especially, there is provided a characteristic that the monitoring/controlling circuit means can also check whether the switching element has received the control output signal.

Further, the monitoring/controlling means 110A makes a preliminary determination of a logic abnormality in the state in which the reset signal directed to the command history storing circuit 170 is cleared, in any one of a case where both the on-command storing signal M3 and the off-command storing signal M4 are at the logic "0", a case where the on-command storing signal M3 is at the logic "0", and the on-storing operation has not been carried out, but the closed-circuit determination storing signal M1 is at the logic "1", and a case where the off-command storing signal M4 is at the logic "0", and the off-storing operation has not been carried out, but the open-circuit determination storing signal M2 is at the logic "1", carries out the recheck processing, then makes the logic abnormality determination. The logic abnormality determination corresponds to a determination that the signal transmission system from the monitoring/controlling means 110A to the switching element 130, the determination storing circuit 160A, or that the command history circuit 170 is abnormal, or malfunctions due to a noise. As a result, the determination storing circuit includes the command history storing circuit used for the control output signal, and the monitoring/controlling means makes the logical abnormality determination when there is an inconsistency among the on-command storing signal, the off-command storing signal, the closed-circuit determination storing signal, and the open circuit determination signal. Thus, there is provided a characteristic that, when the determination storing circuit which is directly connected to the switching element, which is the power transistor, and is provided close thereto malfunctions due to noises or the like, the recheck processing can prevent an erroneous abnormality handling from being carried out.

Further, the normal closed-circuit storing signal M1 is at the logic "1" when the control output signal Dr is the circuit closing command signal, and the voltage Tr between terminals of the switching element 130 is equal to or less than the predetermined closed-circuit voltage Von, so as to make the preliminary normality determination considering that the switching element 130 has normally carried out the circuit closing operation, while leaving a possibility that the abnormality of the element internal/external short circuit 220 which is the internal short circuit or the across-element wiring short circuit of the switching element 130 may be present. The normal closed-circuit storing signal M1 is at the logic "0" when the control output signal Dr is the circuit closing command signal, and the voltage Tr between the terminals of the switching element 130 is more than the predetermined closed-circuit voltage Von, so as to make the determination of abnormality of the load internal/external short circuit or the like 210 which means the internal short circuit of the electric load 103, the short circuit between the terminals of the electric load by external wiring, or the fused state in which the switching element 130 cannot be closed. The normal open-circuit storing signal M2 is at the logic "1" when the control output signal Dr is the circuit opening command signal, and the voltage Tr between the terminals of the switching element 130 is equal to or more than the predetermined open-circuit voltage Voff, so as to make the preliminary normality determination considering that the switching element 130 has normally carried out the circuit opening operation, while leaving a possibility that an abnormality of the load internal/external short circuit or the like 210 may be present. The normal open-circuit storing signal M2 is at the logic "0" when the control output signal Dr is the circuit opening command signal, and the voltage Tr between the terminals of the switching element 130 is less than the predetermined open-circuit voltage Voff, so as to make the determination that an abnormality such as the element internal/external short circuit 220 is present.

Further, the monitoring/controlling means 110A, when both of the normal closed-circuit storing signal M1 and the normal open-circuit storing signal M2 are at the logic "1", which represents the preliminary normality determination, determines that all the electric load 103, the switching element 130, and external wiring are normal, when the normal closed-circuit storing signal M1 is at the logic "1", which represents the preliminary normality determination, and the normal open-circuit storing signal M2 is at the logic "0", which represents the non-normality determination, determines that the abnormality caused by the element internal/external short circuit 220 is present, and when the normal closed-circuit storing signal M1 is at the logic "0", which represents the non-normality determination, and the normal open-circuit storing signal M2 is at the logic "1", which represents the preliminary normality determination, determines that the abnormality caused by the load internal/external short circuit or the like 210 is present, the logic "1" representing that a logic level of a signal voltage is "H" or "L", and the logic "0" representing that the logic level of the signal voltage is "L" or "H", which is an inverted logic. As a result, the monitoring/controlling means comprehensively makes the abnormality determination by combining both the logic level of the normal closed-circuit storing signal and the logic level of the normal open-circuit storing signal. Thus, there is provided a characteristic in that it is possible to identify and detect the abnormality of the load internal/external short circuit or the like which is the across-load wiring short circuit, the load internal short circuit, or the switching element fusion, or the element internal/external short circuit which is the across-element wiring short circuit or the element internal short circuit, thereby accurately determining a normal state in which these abnormalities are not present.

Further, the pull-up resistor 133 and the pull-down resistor 152 are connected to the connection point between the switching element 130 and the electric load 103, and the monitored voltage V0 at this connection point is input to the disconnection detection circuit 180, the disconnection detection circuit 180 includes the voltage dividing resistors 181, 182, and 183 for generating the first voltage V1 and the second voltage V2, which is a set value higher than the first voltage V1, and the zone comparison circuit 187, and the zone comparison circuit 187, when the monitored voltage V0 is between the first voltage V1 and the second voltage V2, determines that the load internal/external disconnection 230 which is an internal disconnection of the electric load 103 or a disconnection of load wiring occurs, thereby generating the disconnection detection signal OP, and when the disconnection detection circuit 180 detects the disconnection internal/external to the electric load, both the normal closed-circuit storing signal M1 and the normal open-circuit storing signal M2 are set to the logic "0", which represents the non-normality determination. As a result, the disconnection detection circuit for detecting the disconnection abnormality external or internal to the electric load is provided, and, when the disconnection abnormality is detected, both the normal closed-circuit storing signal and the normal open-circuit storing signal are set to the non-normality determination side. It should be noted that the non-normality determination state of the normal closed-circuit storing signal is set for the internal/external short-circuit abnormality of the electric load, the non-normality determination state of the normal open-circuit storing signal is set for the internal/external short-circuit abnormality of the switching element, when the internal/external short-circuit abnormality of the electric load and the external short-circuit abnormality of the switching element occur at the same time, a short circuit between the positive terminal and the negative terminal of the drive power source is present, the power supply interrupt such as fusion of a fuse is carried out, and the drive control device stops the operation. Further, when the internal/external short-circuit abnormality of the electric load and the internal short-circuit abnormality of the switching element occur at the same time, the short circuit between the positive terminal and the negative terminal of the drive power source is present, the power supply interrupt such as fusion of a fuse is carried out, or the switching element fused, the power supply recovers, the drive control device is restarted, and an abnormality state in which the switching element cannot be brought into the closed-circuit state arises. Thus, there is provided a characteristic that when both the normal closed-circuit storing signal and the normal open-circuit storing signal are on the non-normal side, and the on-command storing signal and the off-command storing signal are active, the disconnection abnormality internal/external to the electric load is identified, and, according to a small number of the types of the storing signal, the many types of the abnormality state can be distinguished.

Second Embodiment (1) Detailed Description of Configuration

Figure 6:
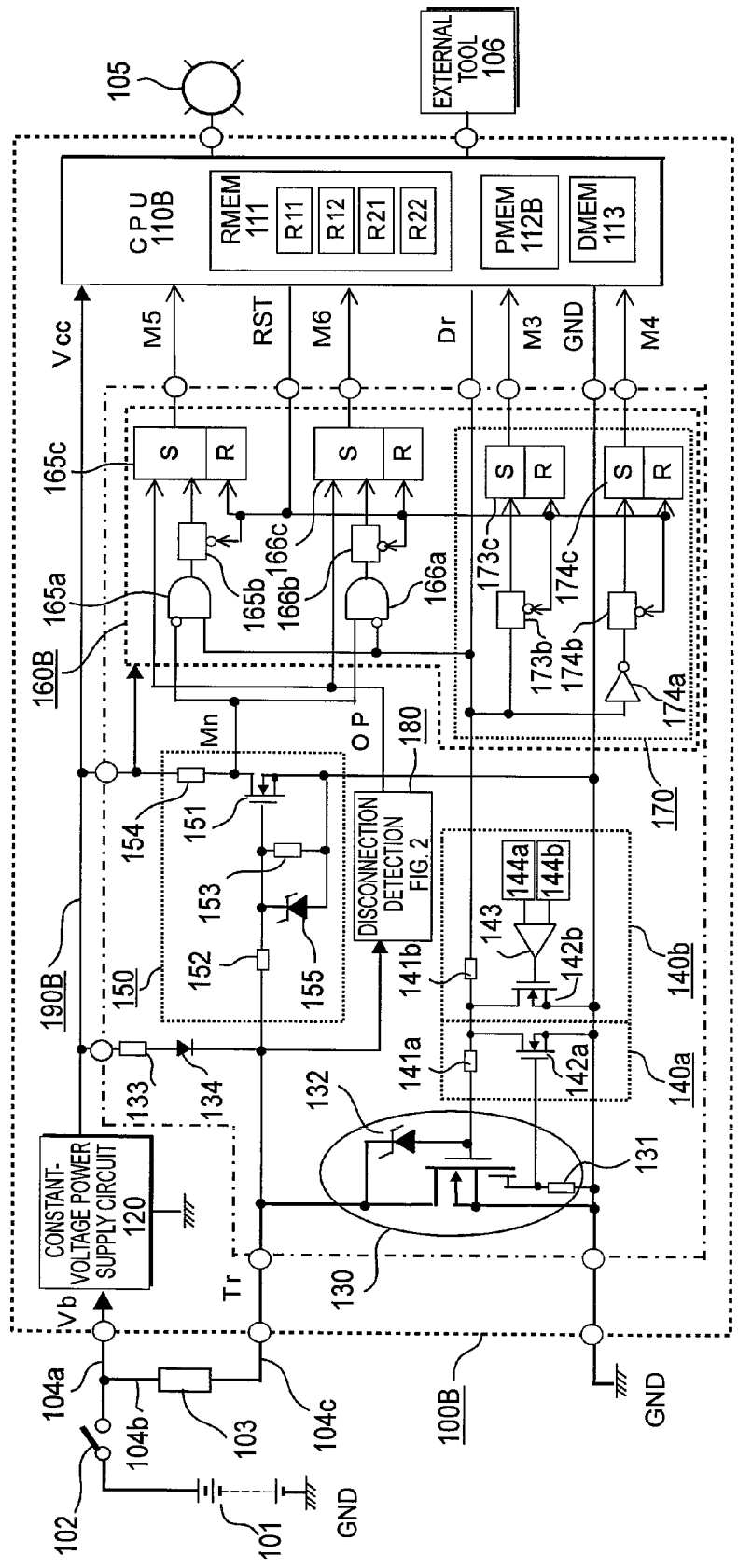
FIG. 6 is a block diagram of an entire circuit of a drive control device for an electric load according to a second embodiment of the present invention.

In the following section, referring to FIG. 6 illustrating a block diagram of an entire circuit of the drive control device for an electric load according to a second embodiment of the present invention, a description is mainly given of differences from the device illustrated in FIG. 1. It should be noted that like or corresponding components are denoted by like numerals throughout drawings. In FIG. 6, a drive control device 100B, which receives a power from the drive power source 101 via the power supply relay 102, and controls the drive of the electric load 103, includes a microprocessor 110B serving as the monitoring/controlling means, the constant-voltage power supply circuit 120, the switching element 130 which is a power transistor provided with the over-current suppression circuit 140a and the overheat interruption circuit 140b, the state detection circuit 150, the disconnection detection circuit 180, and a determination storing circuit 160B including the command history storing circuit 170, the microprocessor 110B cooperates with the RAM 111, a program memory 112B, and the data memory 113 to detect disconnection and short circuit abnormalities of wiring circuits of the electric load 103, the electric load 103, and the switching element 130, thereby reporting the abnormality using the alarm display 105, storing information on the abnormality generation history in the data memory 113, and permitting the external tool 106 to read, for maintenance and inspection, the information on the generated abnormalities.

It should be noted that a main difference between the device in FIG. 6 and the device in FIG. 1 is that, while the determination storing circuit 160A in FIG. 1, by the normal closed-circuit storing element 161c and the normal open-circuit storing element 162c, generates, as the closed-circuit determination storing signal, the normal closed-circuit storing signal M1, and, as the open-circuit determination storing signal, the normal open-circuit storing signal M2, the determination storing circuit 160B in FIG. 6, by an abnormal closed-circuit storing element 165c and an abnormal open-circuit storing element 166c, generates, as the closed-circuit determination storing signal, an abnormal closed-circuit storing signal M5, and, as the open-circuit determination storing signal, an abnormality open-circuit storing signal M6, and the disconnection detection circuit 180 is exactly the same as that illustrated in FIG. 2. In the program memory 112B, control programs serving as the command output generation means 402b, the determination information reading means 404a, the recheck processing means 406a, and the abnormality handling means 407a and 408b, which were mentioned before referring to FIGS. 4 and 5, are stored.

In determination storing circuit 160B, an abnormal closed-circuit determination element 165a is an AND element, to which the control output signal Dr and the logically inverted signal of the state detection signal Mn are input, a filter circuit 165b is a low-pass filter including a resistor (not shown) and a capacitor (not shown), a normal closed-circuit storing element 165c is a flip-flop circuit which operates in response to a set input and a reset input, when the control output signal Dr represents the circuit closing command (logic level "H") and the state detection signal Mn detects the closed-circuit state (logic level "L") the output voltage level of the AND element 165a becomes "H", via the filter circuit 165b, the abnormal closed-circuit storing element 165c is set, and a abnormal closed-circuit storing signal M5 is supplied to the microprocessor 110B. The filter circuit 165b eliminates a momentary error operation signal due to a response delay of the respective circuits, and the capacitor is discharged by a reset command signal RST described later.

A abnormal open-circuit determination element 166a is an AND element, to which a logically inverted input of the control output signal Dr and the state detection signal Mn are input, a filter circuit 166b is a low-pass filter including a resistor (not shown) and a capacitor (not shown), a abnormal open-circuit storing element 166c is a flip-flop circuit which operates in response to a set input and a reset input, when the control output signal Dr represents the circuit opening command (logic level "L") and the state detection signal Mn detects the circuit opening state (logic level "H"), the output voltage level of the AND element 166a becomes "H", via the filter circuit 166b, the abnormal open-circuit storing element 166c is set, and a abnormal open-circuit storing signal M6 is supplied to the microprocessor 110B. The filter circuit 166b eliminates a momentary error operation signal due to a response delay of the respective circuits, and the capacitor is discharged by the reset command signal RST described later. The abnormal closed-circuit storing element 165c and the abnormal open-circuit storing element 166c are set when the disconnection detection signal OP is in the disconnection detection state (logic level "H"), and generate the abnormal closed-circuit storing signal M5 and the abnormal open-circuit storing signal M6.

The command history storing circuit 170 contained in the determination storing circuit 160B is configured as the case illustrated in FIG. 1, and generates, according to the on-command storing element 173c and the off-command storing element 174c, the on-command storing signal M3 and the off-command storing signal M4, thereby inputting the signals to the microprocessor 110B. The microprocessor 110B reads the abnormal closed-circuit storing signal M5, the abnormal open-circuit storing signal M6, the on-command storing signal M3, and the off-command storing signal M4, thereby determining storing states of the first normality memory R11, the second normality memory R21, the first abnormality memory R12, and the second abnormality memory R22 mentioned before referring to FIG. 5, and generates the reset command signal RST to reset the abnormal closed-circuit storing element 165c, the abnormal open-circuit storing element 166c, the on-command storing element 173c, and the off-command storing element 174c.

A description is given of FIGS. 7(A) and (B) which are tables of contents of the stored determination of the determination storing circuit 160B illustrated in FIG. 6. FIG. 7(A) describes the state detection and the stored determination, illustrates the logic levels of the abnormal closed-circuit storing signal M5 and the abnormal open-circuit storing signal M6 and an abnormality generation category corresponding to a combination of the logic levels of the control output signal Dr and the state detection signal Mn, and, in a first row (A1) to a fourth row (A4) of the table, both the disconnection detection signal OP and the reset command signal RST are at the logic level "L", and are in a state in which a disconnection is not detected and the reset command is cleared.

In the first row (A1) of the table, in terms of the abnormal closed-circuit storing signal M5, when the control output signal Dr is the circuit closing command signal (logic level "H"), and the voltage between both terminals Tr of the switching element 130 is equal to or less than the predetermined closed-circuit voltage Von, the state detection transistor 151 reaches the open-circuit state, then, the state detection signal Mn reaches the logic level "H", and, as a result, the logic level of the normal closed-circuit storing signal M5 becomes "L", so as to make a preliminary normality determination which considers that the switching element 130 has normally carried out the circuit closing operation, while leaving a possibility that this is a state in which abnormality of the internal short circuit of the switching element 130 or the element internal/external short circuit which is the across-element wiring short circuit may have occurred.

In the second row (A2) of the table, in terms of the abnormal closed-circuit storing signal M5, when the control output signal Dr is the circuit closing command signal (logic level "H"), and the voltage between both terminals Tr of the switching element 130 exceeds the predetermined closed-circuit voltage Von, the state detection transistor 151 reaches the closed-circuit state, then, the state detection signal Mn reaches the logic level "L", and, as a result, the logic level of the abnormal closed-circuit storing signal M5 becomes "H", the determination of the closed-circuit abnormality is made, and this closed-circuit abnormality determination is made in case of an abnormality such as the load internal/external short circuit or the like 210 implying the internal short circuit of the electric load 103, the short circuit across the load caused by external wiring, or the fused state in which the switching element 130 cannot reach the closed-circuit state.

In the third row (A3) of the table, in terms of the abnormal open-circuit storing signal M6, when the control output signal Dr is the circuit opening command signal (logic level "L"), and the voltage between both terminals Tr of the switching element 130 is equal to or more than the predetermined closed-circuit voltage Voff, the state detection transistor 151 reaches the closed-circuit state, then, the state detection signal Mn reaches the logic level "L", and, as a result, the logic level of the abnormal open-circuit storing signal M6 becomes "L", so as to make a preliminary normality determination which considers that the switching element 130 has normally carried out the circuit opening operation, while leaving a possibility that this is a state in which the abnormality of the load internal/external short circuit or the like 210 may have occurred.

In the fourth row (A4) of the table, in terms of the abnormal open-circuit storing signal M6, when the control output signal Dr is the circuit opening command signal (logic level "L"), and the voltage between both terminals Tr of the switching element 130 is less than the predetermined closed-circuit voltage Voff, the state detection transistor 151 reaches the open-circuit state, then, the state detection signal Mn reaches the logic level "H", and, as a result, the logic level of the abnormal open-circuit storing signal M6 becomes "H", the open-circuit abnormality determination is made, and this open-circuit abnormality determination is made in case of the abnormality of the element internal/external short circuit 220.

In the fifth row (A5) of the table, when the control output signal Dr is the circuit opening command signal (logic level "L"), and the disconnection detection signal OP reaches the logic "H", both the abnormal closed-circuit storing signal M5 and the abnormal open-circuit storing signal M6 reach the logic level "H", and a determination that the load internal/external disconnection 230 has occurred is made.

In the sixth row (A6) of the table, when the logic level of the reset command signal RST becomes "H", independently of the logic levels of the control output signal Dr and the disconnection detection signal OP, both the abnormal closed-circuit storing signal M5 and the abnormal open-circuit storing signal M6 reach the logic level "L", resulting in the determination state the same as the overall normal state. Therefore, it implies that, while the reset command signal is active, the abnormality determination should not be carried out.

FIG. 7(B) describes a command history and the stored determination, and illustrates, in the state in which the reset command signal RST is cleared, a combination of the logic levels of the abnormal closed-circuit storing signal M5, the abnormal open-circuit storing signal M6, the on-command storing signal M3, and the off-command storing signal M4 and an overall determination result. It should be noted that in a case where the abnormal closed-circuit storing signal M5 is not generated, when the on-command storing signal M3 is not generated, it cannot be affirmed that a closed-circuit normality is present, in a case where the abnormal open-circuit storing signal M6 is not generated, when the off-command storing signal M4 is not generated, it cannot be affirmed that an open-circuit normality is present, and it is thus necessary to consider the logic levels of the on-command storing signal M3 and the off-command storing signal M4 for the overall determination.

Preliminary normality determination portions in the table are denoted by a reference numeral B1 below the table in FIG. 7(B), when a Boolean logic equation (NM5×M3)=(H) holds, the closed circuit preliminary normality is determined, and when a Boolean logic equation (NM6×M4)=(H) holds, the open circuit preliminary normality is determined. It should be noted that NM5 is the negative logic of M5, and NM6 is the negative logic of M6. Closed circuit and open circuit normality determination portions are denoted by a reference numeral B2 in the table, and when a Boolean logic equation (NM5×NM6×M3×M4)=(H) holds, and, thus, both the closed circuit preliminary normality and the open circuit preliminary normality hold, the closed circuit normality and the open circuit normality are determined. It should be noted that NM3 is the negative logic of M3, and NM4 is the negative logic of M4. Abnormality determination portions are denoted by a reference numeral B3 in the table, when a Boolean logic equation (M5×M3)=(H) holds, the closed-circuit abnormality is determined, and when a Boolean logic equation (M6×M4)=(H) holds, the open-circuit abnormality is determined. It should be noted that when (M5×NM3)=(H) or (M6×NM4)=(H) holds, the logic abnormality described later is present.

Uncertain determination portions are denoted by a reference numeral B4 in the table, when a Boolean logic equation (NM6×NM4)=(H) holds, the open-circuit determination is uncertain, and when a Boolean logic equation (NM5×NM3)=(H) holds, the closed-circuit determination is uncertain. When (NM3×NM4)=(H) holds, a logic abnormality described later is present. Load internal/external disconnection determination portions are denoted by a reference numeral B5 in the table, and, when a Boolean logic equation (M5×M6)×(M3+M4)=(H) holds, the load internal/external disconnection is determined. When (M3×M4)=(L) holds, the compound abnormality including a logic abnormality is present.

Portions of the logic abnormality are denoted by a reference numeral B6 in the table, when a Boolean logic equation (M3+M4)=(L), a Boolean logic equation (M5×NM3)=(H), or a Boolean logic equation (M6×NM4)=(H) holds, a noise malfunction, or a logic abnormality of the control circuit portion other than the electric load, the load wiring, and the switching element is present. It should be noted that except for a period in which the reset command is active, at least one of the on-command storing signal M3 and the off-command storing signal M4 is at the logic level "H", and a case in which both of the on-command storing signal M3 and the off-command storing signal M4 become the logic level "L" cannot happen in terms of logic. Further, a case in which, when the on command is not generated, the abnormal closed-circuit storing state is active, or when the off command is not generated, the abnormal open-circuit storing state is active cannot happen in terms of logic.

(2) Detailed Description of Effects and Operations

A description is given of effects and operations of the device according to the second embodiment of the present invention configured as illustrated in FIG. 6 and differences from the device illustrated in FIG. 1 referring to flowcharts illustrated in FIGS. 4 and 5. First, in FIG. 6, when the power supply switch (not shown) is brought into the closed-circuit state, the output contact point of the power supply relay 102 is brought into the closed-circuit state, the power is supplied to the drive control device 100B, and the microprocessor 110B starts the operation. The microprocessor 110B, according to the operation states of the plurality of input signals (not shown) and contents of the control program stored in the program memory 112B, performs the drive control of the plurality of electric loads (not shown). The power supply to the electric load 103, which is a part of the plurality of electric loads, is controlled by the switching element 130 serving as the power transistor subjected to opening/closing control in response to the control output signal Dr generated by the microprocessor 110B.

The microprocessor 110B, cooperating with the state detection circuit 150, the disconnection detection circuit 180, and the determination storing circuit 160B, detects the presence/absence of the abnormalities such as the load internal/external short circuit or the like 210 including the across-load wiring short circuit 210a, the load internal short circuit 210b, and the switching element fusion 210c, the element internal/external short circuit 220 including the across-element wiring short circuit 220a and the element internal short circuit 220b, and the load internal/external short circuit 230 including the load wiring disconnection 230a and the load internal disconnection 230b, and writes and stored the detection in the RAM 111. When the power supply switch is brought into the open-circuit state, the power supply relay 102 maintains the closed-circuit state for the predetermined delay period, and, in this delayed power supply period, the abnormality generation information stored in the RAM 111 is transferred to and stored in the nonvolatile data memory 113. When the power transistor 130 is in the closed-circuit state, and an excessive current flows through the electric load 103 due to the short-circuit abnormality, the voltage between both terminals Tr of the power transistor 130 exceeds the predetermined closed-circuit voltage, and, due to the closed-circuit state of the state detection transistor 151, the short-circuit abnormality is detected. When the short-circuit abnormality internal or external to the load is generated, the microprocessor 110B sets the control output signal Dr, which is directed to the power transistor 130, to the circuit opening command.

A description is given of effects and operations of the device illustrated in FIG. 6 referring to the flowcharts for describing the operations in FIGS. 4 and 5. Regarding FIG. 4, also in the case illustrated in FIG. 6, the operations as described before are performed. Regarding FIG. 5, in Step 504, the determination whether the normal closed-circuit storing signal M1 is logic "1" or not may be replaced by a determination whether the abnormal closed-circuit storing signal M5 is logic "0" or not. When the abnormal closed-circuit storing signal M5 is logic "0", a determination "YES" may be made, and the operation may proceed to Step 505a, and when the abnormal closed-circuit storing signal M5 is not logic "0", a determination "NO" may be made, and the operation may proceed to Step 505b. Similarly, in Step 507, the determination whether the normal open-circuit storing signal M2 is logic "1" or not may be replaced by a determination whether the abnormal open-circuit storing signal M6 is logic "0" or not. When the abnormal open-circuit storing signal M6 is not logic "0", a determination "YES" may be made, and the operation may proceed to Step 508a, and when the abnormal open-circuit storing signal M6 is not logic "0", a determination "NO" may be made, and the operation may proceed to Step 508b.

(3) Essential Points and Characteristics of Second Embodiment

As apparent from the above description, the drive control device for an electric load according to the second embodiment is the drive control device for an electric load 100B including the switching element 130 serially connected to the electric load 103 to which the power is supplied from the drive power source 101, and the monitoring/controlling means 110B for performing the opening/closing control of the switching element 130, and monitoring presence/absence of an abnormal state of the power supply circuit for the electric load 103. The monitoring/controlling means 110B generates the control output signal Dr serving as the circuit closing command or the circuit opening command directed to the switching element 130, and supplies the switching element 130 and the determination storing circuit 160B with the control output signal Dr. The switching element 130 generates the state detection signal Mn according to open/closed-circuit states of the switching element 130, and supplies the determination storing circuit 160B with the state detection signal Mn. The determination storing circuit 160B detects, when the control output signal Dr is the circuit closing command, whether the switching element 130 has normally been brought into the closed-circuit state and stores a result of the detection, thereby generating the closed-circuit determination storing signal M5, detects, when the control output signal Dr is the circuit opening command, whether the switching element 130 has normally been brought into the open-circuit state and stores a result of the detection, thereby generating the open-circuit determination storing signal M6. Further, the determination storing circuit 160B is, when the monitoring/controlling means 110B has read the determination storing signal, forcedly reset periodically by a command of the monitoring/controlling means 110B, and the monitoring/controlling means 110B further periodically reads and stores the closed-circuit determination storing signal M5 and the open-circuit determination storing signal M6 serving as the determination storing signal before the determination storing circuit 160B is reset, thereby determining the presence/absence of the abnormal state according to the combination of the logics relating to the signal voltage level of the determination storing signal stored before.

Further, the determination storing circuit 160B further includes the command history storing circuit 170 to which the control output signal Dr directed to the switching element 130 is input. The command history storing circuit 170 stores information that the control output signal Dr reaches the logic level corresponding to the circuit closing command, thereby outputting the on-command storing signal M3 at the logic "1", and stores information that the control output signal Dr reaches the logic level corresponding to the circuit opening command, thereby outputting the off-command storing signal M4 at the logic "1". The determination storing circuit 160B includes, as the closed-circuit determination storing signal, the abnormal closed-circuit storing signal M5, and as the open-circuit determination storing signal, the abnormal open-circuit storing signal M6. Further, in the command history storing circuit 170, along with the determination storing circuit, the stored information is, when the monitoring/controlling means 110B has read the determination storing signal, forcedly reset periodically by the command of the monitoring/controlling means 110B. The monitoring/controlling means 110B includes the first normality memory R11 for storing the preliminary determination that the content of the closed-circuit determination storing signal M5 is a normality or non-abnormality determination when the on-command storing signal M3 is at the logic "1" upon the reading and the first abnormality memory R12 for storing information that the content is a non-normality or abnormality determination, and includes the second normality memory R21 for storing the preliminary determination that the content of the open-circuit determination storing signal M6 is a normality or non-abnormality determination when the off-command storing signal M4 is at the logic "1" upon the reading and the second abnormality memory R22 for storing information that the content is a non-normality or abnormality determination.

Further, the determination storing circuit 160B generates the abnormal closed-circuit storing signal M5 and the abnormal open-circuit storing signal M6. The abnormal closed-circuit storing signal M5 is at the logic "1" when the control output signal Dr is the circuit closing command signal, and the voltage Tr between the terminals of the switching element 130 is more than the predetermined closed-circuit voltage Von, so as to make a determination of the load internal/external short circuit or the like 210 which means an internal short circuit of the electric load 103, a short circuit between the terminals of the electric load by external wiring, or a fused state in which the switching element 130 cannot be closed. The abnormal closed-circuit storing signal M5 is at the logic "0" when the control output signal Dr is the circuit closing command signal, and the voltage Tr between the terminals of the switching element 130 is equal to or less than the predetermined closed-circuit voltage Von, so as to make the preliminary normality determination considering that the switching element 130 has normally carried out the circuit closing operation, while leaving a possibility that the abnormality of the element internal/external short circuit 220 which is an internal short circuit or an across-element wiring short circuit of the switching element 130 may be present. The abnormal open-circuit storing signal M6 is at the logic "1" when the control output signal Dr is the circuit opening command signal, and the voltage Tr between the terminals of the switching element 130 is less than the predetermined open-circuit voltage Voff, so as to make a determination that an abnormality of the element internal/external short circuit 220 is present. The abnormal open-circuit storing signal M6 is at the logic "0" when the control output signal Dr is the circuit opening command signal, and the voltage Tr between the terminals of the switching element 130 is equal to or more than the predetermined open-circuit voltage Voff, so as to make the preliminary normality determination considering that the switching element 130 has normally carried out a circuit opening operation, while leaving a possibility that an abnormality such as the load internal/external short circuit or the like 210 may be present.

Further, the monitoring/controlling means 1108, in a state in which a reset command directed to the determination storing circuit 160B is cleared, when both the abnormal closed-circuit storing signal M5 and the abnormal open-circuit storing signal M6 are at the logic "0", which represents the preliminary normality determination, determines that all the electric load 103, the switching element 130, and external wiring are normal. Further, the monitoring/controlling means 1108, when the abnormal closed-circuit storing signal M5 is at the logic "0", which represents the preliminary normality determination, and the abnormality open-circuit storing signal M6 is at the logic "1", which represents the abnormality determination, determines that the abnormality caused by the element internal/external short circuit 220 is present. Further, the monitoring/controlling means 1108, when the abnormality closed-circuit storing signal M5 is at the logic "1", which represents the abnormality determination, and the abnormal open-circuit storing signal M6 is at the logic "0", which represents the preliminary normality determination, determines that the abnormality caused by the load internal/external short circuit 210 is present. The logic "1" represents that a logic level of a signal voltage is "H" or "L", and the logic "0" represents that the logic level of the signal voltage is "L" or "H", which is an inverted logic. As a result, the monitoring/controlling means comprehensively makes the abnormality determination by combining both the logic level of the abnormal closed-circuit storing signal and the logic level of the abnormal open-circuit storing signal. Thus, there is provided a characteristic that it is possible to identify and detect the abnormality of the load internal/external short circuit or the like which is the across-load wiring short circuit, the load internal short circuit, or the switching element fusion, or the element internal/external short circuit which is the across-element wiring short circuit or the element internal short circuit, thereby accurately determining a normal state in which those abnormalities are not present.

Further, the pull-up resistor 133 and the pull-down resistor 152 are connected to the connection point between the switching element 130 and the electric load 103, and the monitored voltage V0 at this connection point is input to the disconnection detection circuit 180. The disconnection detection circuit 180 includes the voltage dividing resistors 181, 182, and 183 for generating the first voltage V1 and the second voltage V2, which is a set value higher than the first voltage V1, and the zone comparison circuit 187. The zone comparison circuit 187, when the monitored voltage V0 is between the first voltage V1 and the second voltage V2, determines that the load internal/external disconnection 230 which is an internal disconnection of the electric load 103 or a disconnection of load wiring occurs, thereby generating the disconnection detection signal OP. When the disconnection detection circuit 180 detects the disconnection internal/external to the electric load, both the abnormal closed-circuit storing signal M5 and the abnormal open-circuit storing signal M6 are set to the logic "1", which represents the abnormality determination. As a result, the disconnection detection circuit for detecting the disconnection abnormality external/internal to the electric load is provided, and, when the disconnection abnormality is detected, both the abnormal closed-circuit storing signal and the abnormal open-circuit storing signal are set to the abnormality determination side.

The abnormality determination state of the abnormal closed-circuit storing signal is set for the internal/external short-circuit abnormality of the electric load, and the abnormality determination state of the abnormal open-circuit storing signal is set for the internal/external short-circuit abnormality of the switching element. When the internal/external short-circuit abnormality of the electric load and the external short-circuit abnormality of the switching element occur at the same time, a short circuit between the positive and negative terminals of the drive power source is present, the power supply interrupt such as fusion of a fuse is carried out, and the drive control device stops the operation. Further, when the internal/external short-circuit abnormality of the electric load and the internal short-circuit abnormality of the switching element occur at the same time, the short circuit between the positive and negative terminals of the drive power source is present, and the power supply interrupt such as fusion of a fuse is carried out, or the switching element is fused to recover the power supply. Then, the drive control device is restarted, and an abnormality state in which the switching element cannot be brought into the closed-circuit state arises. Thus, there is provided a characteristic that when both the abnormal closed-circuit storing signal M5 and the abnormal open-circuit storing signal M6 are detected to be on the non-normal side by the monitoring/controlling means, the fact that the disconnection abnormality internal/external to the electric load is identified, and, according to a small number of the types of the storing signal, the many types of the abnormality state can be distinguished.

Third Embodiment (1) Detailed Description of Configuration

In the following section, referring to FIG. 8 illustrating a block diagram of an entire circuit of a drive control device for an electric load according to a third embodiment of the present invention, a description is mainly given of differences from the device illustrated in FIG. 1. It should be noted that like or corresponding components are denoted by like numerals throughout drawings. In FIG. 8, a drive control device 100C, which receives a power from the drive power source 101 via the power supply relay 102, and controls the drive of the electric load 103, includes a microprocessor 110C serving as the monitoring/controlling means, the constant-voltage power supply circuit 120, the switching element 130 which is a power transistor provided with an over-current interruption circuit 140c, the state detection circuit 150, the disconnection detection circuit 180, and a determination storing circuit 160C including the command history storing circuit 170. The microprocessor 110C cooperates with the RAM 111, a program memory 112C, and the non-volatile data memory 113 to detect disconnection and short circuit abnormalities of wiring circuits of the electric load 103, the electric load 103, and the switching element 130, thereby reporting the abnormality using the alarm display 105, storing information on the abnormality generation history in the data memory 113, and permitting the external tool 106 to read, for maintenance and inspection, the information on the generated abnormalities.

A main difference between the device of FIG. 8 and the device of FIG. 1 is that, while the determination storing circuit 160A of FIG. 1, by the normal closed-circuit storing element 161c and the normal open-circuit storing element 162c, generates, as the closed-circuit determination storing signal, the normal closed-circuit storing signal M1, and, as the open-circuit determination storing signal, the normal open-circuit storing signal M2, the determination storing circuit 160C of FIG. 8, by an abnormal closed-circuit storing element 165c and an abnormal open-circuit storing element 166c, generates, as the closed-circuit determination storing signal, an abnormal closed-circuit storing signal M5, and, as the open-circuit determination storing signal, an abnormality open-circuit storing signal M6. The disconnection detection circuit 180 is exactly the same as that illustrated in FIG. 2. In addition, the over-current interruption circuit 140c is used substitute for the over-current suppression circuit 140a and the overheat interruption circuit 140b. In the program memory 112C, control programs serving as the command output generation means 402b, the determination information reading means 404a, the recheck processing means 406a, and the abnormality handling means 407a and 408b, which have been described before referring to FIGS. 4 and 5, are stored.

In the determination storing circuit 160C, to the non-inverting input terminal of the comparison amplifier 165d, the voltage between both the ends of the current detection resistor 131 of the power transistor 130 is applied as the state detection signal OC, and, to the inverting input terminal, a reference voltage corresponding to a threshold voltage for carrying out over-current limiting is applied. Thus, when an over-current state arises due to the short-circuit abnormality of the electric load 103 or the like, the output signal of the comparison amplifier 165d reaches the logic level "H", and, via the filter circuit 165b, the abnormality closed-circuit storing element 165c is set, thereby generating the abnormal closed-circuit storing signal M5. The detection of the over-current state by the comparison amplifier 165d is effective when the control output signal Dr represents the circuit closing command or the circuit opening command, but this circuit as it is cannot detect the switching element fusion 210c in which, when the circuit closing command is active, the switching element 130 cannot reach the closed-circuit state. Thus, similarly to the abnormal closed-circuit determination element 165a in FIG. 6, by detecting the abnormal closed circuit based on the logical multiplication of the inverted logic signal of the state detection signal Mn and the control output signal Dr, obtaining the logical addition thereof to the over-current detection output of the comparison amplifier 165d, and setting the abnormal closed-circuit storing element 165c via the filter circuit 165b, the switching element fusion 210c in which the switching element 130 cannot reach the closed-circuit state can be detected. The filter circuit 165b is a low-pass filter formed of a resistor (not shown) and a capacitor (not shown) and the abnormal closed-circuit storing element 165c is a flip-flop circuit operating in response to a set input and a reset input. The filter circuit 165b eliminates a momentary error operation signal due to a response delay of the respective circuits, and the capacitor is discharged by a reset command signal RST described later.

The abnormal open-circuit determination element 166a is an AND element, to which a logically inverted input of the control output signal Dr and the state detection signal Mn are input. The filter circuit 166b is a low-pass filter formed of a resistor (not shown) and a capacitor (not shown). The abnormal open-circuit storing element 166c is a flip-flop circuit which operates in response to a set input and a reset input. When the control output signal Dr represents the circuit opening command (logic level "L") and the state detection signal Mn detects the closed-circuit state (logic level "H"), the output voltage level of the AND element 166a becomes "H", via the filter circuit 166b, the abnormal open-circuit storing element 166c is set, and the abnormal open-circuit storing signal M6 is supplied to the microprocessor 1108. The filter circuit 166b eliminates a momentary error operation signal due to a response delay of the respective circuits, and the capacitor is discharged by the reset command signal RST described later. The abnormal closed-circuit storing element 165c and the abnormal open-circuit storing element 166c are set when the disconnection detection signal OP is in the disconnection detection state (logic level "H"), and generate the abnormal closed-circuit storing signal M5 and the abnormal open-circuit storing signal M6.

The microprocessor 110C reads the abnormal closed-circuit storing signal M5, the abnormal open-circuit storing signal M6, the on-command storing signal M3, and the off-command storing signal M4, thereby determining storing states of the first normality memory R11, the second normality memory R21, the first abnormality memory R12, and the second abnormality memory R22 described before referring to FIG. 5, and generates the reset command signal RST to reset the abnormal closed-circuit storing element 165c, the abnormal open-circuit storing element 166c, the on-command storing element 173c, and the off-command storing element 174c. On the other hand, when the abnormal closed-circuit storing element 165c stores an abnormal closed-circuit state, an electric power is supplied from the set output terminal thereof via a diode 165f to an interruption holding circuit 145, and, via a charge resistor 145a having a low resistance, a capacitor 145d is charged. A charged voltage thereof is applied to voltage dividing resistors 145b and 145c, which have high resistances. The drain terminal of an interruption control transistor 142c is connected to a connection point of the first drive resistor 141c and the second drive resistor 141b serially connected between the output terminal of the control output signal Dr of the microprocessor 110c and the gate terminal of the power transistor 130. The source terminal of the interruption control transistor 142c is connected to the ground circuit GND, and the gate terminal thereof is connected to a connection point of the voltage dividing resistors 145b and 145c. Thus, when the power is supplied to the interruption holding circuit 145, the interruption control transistor 142c becomes conductive, and the conduction of the power transistor 130 is interrupted.

The output of the diode 165f is positively fed back to the set input terminal of the abnormal closed-circuit storing element 165c. Thus, once the abnormal closed-circuit storing element 165c generates the set output signal, even when the state detection signal OC set by the current detection resistor 131 becomes zero, the set state of the abnormal closed-circuit storing element 165c maintains, the forced interruption of the power transistor 130 still remains, and the abnormal closed-circuit storing signal M5 maintains the logic level "H". The abnormal closed-circuit storing element 165c includes a flip-flop circuit having a prioritized reset. When the reset command signal RST is input to the reset input terminal of the abnormal closed-circuit storing element 165c, the set output becomes the logic level "L" even if the set input is applied to the set input terminal, and the abnormal closed-circuit storing signal M5 reaches the logic level "L". However, the interruption control transistor 142c remains in the conductive state due to a residual charge of the capacitor C for a while. Thus, when the reset control signal RST is active in a short period, the forced interrupted state of the power transistor 130 is maintained. However, when the reset command signal RST is intentionally activated for a period longer than the normal period, the capacitor C is discharged, the interruption control transistor 142c enters the open-circuit state, and the positive feedback set signal applied to the set input terminal of the abnormal closed-circuit storing element 165c is cleared.

Then, when the reset command signal RST is cleared, if the excessive current is still flowing through the power transistor 130, the abnormal closed-circuit storing element 165c is again set, and if the excessive current is not flowing, the abnormal closed-circuit storing element 165c remains in the reset state, and the abnormal closed-circuit storing signal M5 also becomes the logic level "L". It should be noted that when a dedicated flip-flop circuit for storing the generation state of the over current is provided, and an output of the dedicated flip-flop circuit is used to bring the interruption control transistor 142c into the conductive state, the diode 165f and the interruption holding circuit 145 are not necessary. However, for resetting the dedicated flip-flop circuit by the microprocessor 110C, a dedicated reset command signal is necessary.

(2) Detailed Description of Effects and Operations

A description is given of effects and operations of the device according to the third embodiment of the present invention configured as illustrated in FIG. 8 different from those of the device illustrated in FIG. 1 referring to flowcharts illustrated in FIGS. 4 and 5. First, in FIG. 8, when the power supply switch (not shown) is brought into the closed-circuit state, the output contact point of the power supply relay 102 is brought into the closed-circuit state, the power is supplied to the drive control device 100C, and the microprocessor 110C starts the operation. The microprocessor 110C, according to the operation states of the plurality of input signals (not shown) and contents of the control program stored in the program memory 112C, performs the drive control of the plurality of electric loads (not shown). The power supply to the electric load 103, which is a part of the plurality of electric loads, is controlled by the switching element 130 serving as the power transistor subjected to opening/closing control in response to the control output signal Dr generated by the microprocessor 110C.

The microprocessor 110C, cooperating with the state detection circuit 150, the disconnection detection circuit 180, and the determination storing circuit 160C, detects the presence/absence of the abnormalities such as the load internal/external short circuit or the like 210 including the across-load wiring short circuit 210a, the load internal short circuit 210b, and the switching element fusion 210c, the element internal/external short circuit 220 including the across-element wiring short circuit 220a and the element internal short circuit 220b, and the load internal/external short circuit 230 including the load wiring disconnection 230a and the load internal disconnection 230b, and writes and stored the detection in the RAM 111. When the power supply switch is brought into the open-circuit state, the power supply relay 102 maintains the closed-circuit state for the predetermined delay period, and, in this delayed power supply period, the abnormality generation information stored in the RAM 111 is transferred to and stored in the nonvolatile data memory 113. When the power transistor 130 is in the closed-circuit state, and an excessive current flows through the electric load 103 due to the short-circuit abnormality, the voltage between both terminals Tr of the power transistor 130 exceeds the predetermined closed-circuit voltage, and, due to the closed-circuit state of the state detection transistor 151, the short-circuit abnormality is detected. When the short-circuit abnormality internal or external to the load is generated, the microprocessor 1108 sets the control output signal Dr, directed to the power transistor 130, to the circuit opening command.

A description is given of effects and operations of the device illustrated in FIG. 8 referring to the flowcharts for describing the operations in FIGS. 4 and 5. Regarding FIG. 4, also in the case illustrated in FIG. 8, the operations as described before are performed. Regarding FIG. 5, in Step 504, the determination whether the normal closed-circuit storing signal M1 is logic "1" or not may be replaced by a determination whether the abnormal closed-circuit storing signal M5 is logic "0" or not. When the abnormal closed-circuit storing signal M5 is logic "0", a determination "YES" may be made, and the operation may proceed to Step 505a, and when the abnormal closed-circuit storing signal M5 is not logic "0", a determination "NO" may be made, and the operation may proceed to Step 505b. Similarly, in Step 507, the determination whether the normal open-circuit storing signal M2 is logic "1" or not may be replaced by a determination whether the abnormal open-circuit storing signal M6 is logic "0" or not. When the abnormal open-circuit storing signal M6 is logic "0", a determination "YES" may be made, and the operation may proceed to Step 508a, and when the abnormal open-circuit storing signal M6 is not logic "0", a determination "NO" may be made, and the operation may proceed to Step 508b.

(3) Essential Points and Characteristics of Third Embodiment

As apparent from the above description, the drive control device for an electric load according to the third embodiment is the drive control device for an electric load 100C including the switching element 130 serially connected to the electric load 103 to which the power is supplied from the drive power source 101, and the monitoring/controlling means 110C for performing the opening/closing control of the switching element 130, and monitoring presence/absence of an abnormal state of the power supply circuit for the electric load 103. The monitoring/controlling means 110C generates the control output signal Dr serving as the circuit closing command or the circuit opening command directed to the switching element 130, and supplies the switching element 130 and the determination storing circuit 160C with the control output signal Dr. The switching element 130 generates the state detection signals Mn and OC according to open/closed-circuit states of the switching element 130, and supplies the determination storing circuit 160C with the state detection signals Mn and OC. The determination storing circuit 160C detects, when the control output signal Dr is the circuit closing command, whether the switching element 130 has normally been brought into the closed-circuit state and stores a result of the detection, thereby generating the closed-circuit determination storing signal M5, detects, when the control output signal Dr is the circuit opening command, whether the switching element 130 has normally been brought into the open-circuit state and stores a result of the detection, thereby generating the open-circuit determination storing signal M6. Further, determination storing circuit 160C is, when the monitoring/controlling means 110C has read the determination storing signal, forcedly reset periodically by a command of the monitoring/controlling means 110C, and the monitoring/controlling means 110C further periodically reads and stores the closed-circuit determination storing signal M5 and the open-circuit determination storing signal M6 serving as the determination storing signal before the determination storing circuit 160C is reset, thereby determining the presence/absence of the abnormal state according to the combination of the logics relating to the signal voltage level of the determination storing signal stored before.

Further, the determination storing circuit 160C further includes the command history storing circuit 170 to which the control output signal Dr directed to the switching element 130 is input. The command history storing circuit 170 stores information that the control output signal Dr reaches the logic level corresponding to the circuit closing command, thereby outputting the on-command storing signal M3 at the logic "1", and stores information that the control output signal Dr reaches the logic level corresponding to the circuit opening command, thereby outputting the off-command storing signal M4 at the logic "1". The determination storing circuit 160C includes, as the closed-circuit determination storing signal, the abnormal closed-circuit storing signal M5, and as the open-circuit determination storing signal, the abnormal open-circuit storing signal M6. Further, in the command history storing circuit 170, along with the determination storing circuit, the stored information is, when the monitoring/controlling means 110C has read the determination storing signal, forcedly reset periodically by the command of the monitoring/controlling means 110C. The monitoring/controlling means 110C includes the first normality memory R11 for storing the preliminary determination that the content of the closed-circuit determination storing signal M5 is a normality or non-abnormality determination when the on-command storing signal M3 is at the logic "1" upon the reading and the first abnormality memory R12 for storing information that the content is a non-normality or abnormality determination, and includes the second normality memory R21 for storing the preliminary determination that the content of the open-circuit determination storing signal M6 is a normality or non-abnormality determination when the off-command storing signal M4 is at the logic "1" upon the reading and the second abnormality memory R22 for storing information that the content is a non-normality or abnormality determination.

Further, the determination storing circuit 160C generates the abnormal closed-circuit storing signal M5 and the abnormal open-circuit storing signal M6. The abnormal closed-circuit storing signal M5 is at the logic "1" when the control output signal Dr is the circuit closing command signal, and the electric conduction current of the switching element 130 is more than the predetermined upper limit value, so as to make a determination of the load internal/external short circuit which is an internal short circuit 210b of the electric load 103 of a short circuit across electric loads 210a by external wiring. The abnormal closed-circuit storing signal M5 is at the logic "0" when the control output signal Dr is the circuit closing command signal, and the electric conduction current of the switching element 130 is less than the predetermined upper limit value, so as to make the preliminary normality determination considering that the switching element 130 has normally carried out the circuit closing operation, while leaving a possibility that the abnormality of the element internal/external short circuit 220 which is an internal short circuit or an across-element wiring short circuit of the switching element 130 may be present. The abnormal open-circuit storing signal M6 is at the logic "1" when the control output signal Dr is the circuit opening command signal, and the voltage Tr between the terminals of the switching element 130 is less than the predetermined open-circuit voltage Voff, so as to make a determination that an abnormality of the element internal/external short circuit 220 is present. The abnormal open-circuit storing signal M6 is at the logic "0" when the control output signal Dr is the circuit opening command signal, and the voltage Tr between the terminals of the switching element 130 is equal to or more than the predetermined open-circuit voltage Voff, so as to make the preliminary normality determination considering that the switching element 130 has normally carried out a circuit opening operation, while leaving a possibility that an abnormality such as the load internal/external short circuit or the like 210 which means an internal short circuit of the electric load 103, a short circuit across the electric loads by external wiring, or a fused state in which the switching element 130 cannot be closed may be present.

Further, the monitoring/controlling means 110C, in a state in which a reset command directed to the determination storing circuit 160C is cleared, when the both abnormal closed-circuit storing signal M5 and the abnormal open-circuit storing signal M6 are at the logic "0", which represents the preliminary normality determination, determines that all the electric load 103, the switching element 130, and external wiring are normal. Further, the monitoring/controlling means 110C, when the abnormal closed-circuit storing signal M5 is at the logic "0", which represents the preliminary normality determination, and the abnormal open-circuit storing signal M6 is at the logic "1", which represents the abnormality determination, determines that the abnormality caused by the element internal/external short circuit 220 is present. Further, the monitoring/controlling means 110C, when the abnormal closed-circuit storing signal M5 is at the logic "1", which represents the abnormality determination, and the abnormal open-circuit storing signal M6 is at the logic "0", which represents the preliminary normality determination, determines that the abnormality caused by the load internal/external short circuits 210a and 210b are present. The logic "1" represents that a logic level of a signal voltage is "H" or "L", and the logic "0" represents that the logic level of the signal voltage is "L" or "H", which is an inverted logic. As a result, the monitoring/controlling means comprehensively makes the abnormality determination by combining both the logic level of the abnormal closed-circuit storing signal and the logic level of the abnormal open-circuit storing signal. Thus, there is provided a characteristic that it is possible to identify and detect the abnormality of the load internal/external short circuit or the like which is the across-load wiring short circuit or the load internal short circuit, or the element internal/external short circuit which is the across-element wiring short circuit or the element internal short circuit, thereby accurately determining a normal state in which there abnormalities are not present.

Fourth Embodiment (1) Detailed Description of Configuration

Figure 9:
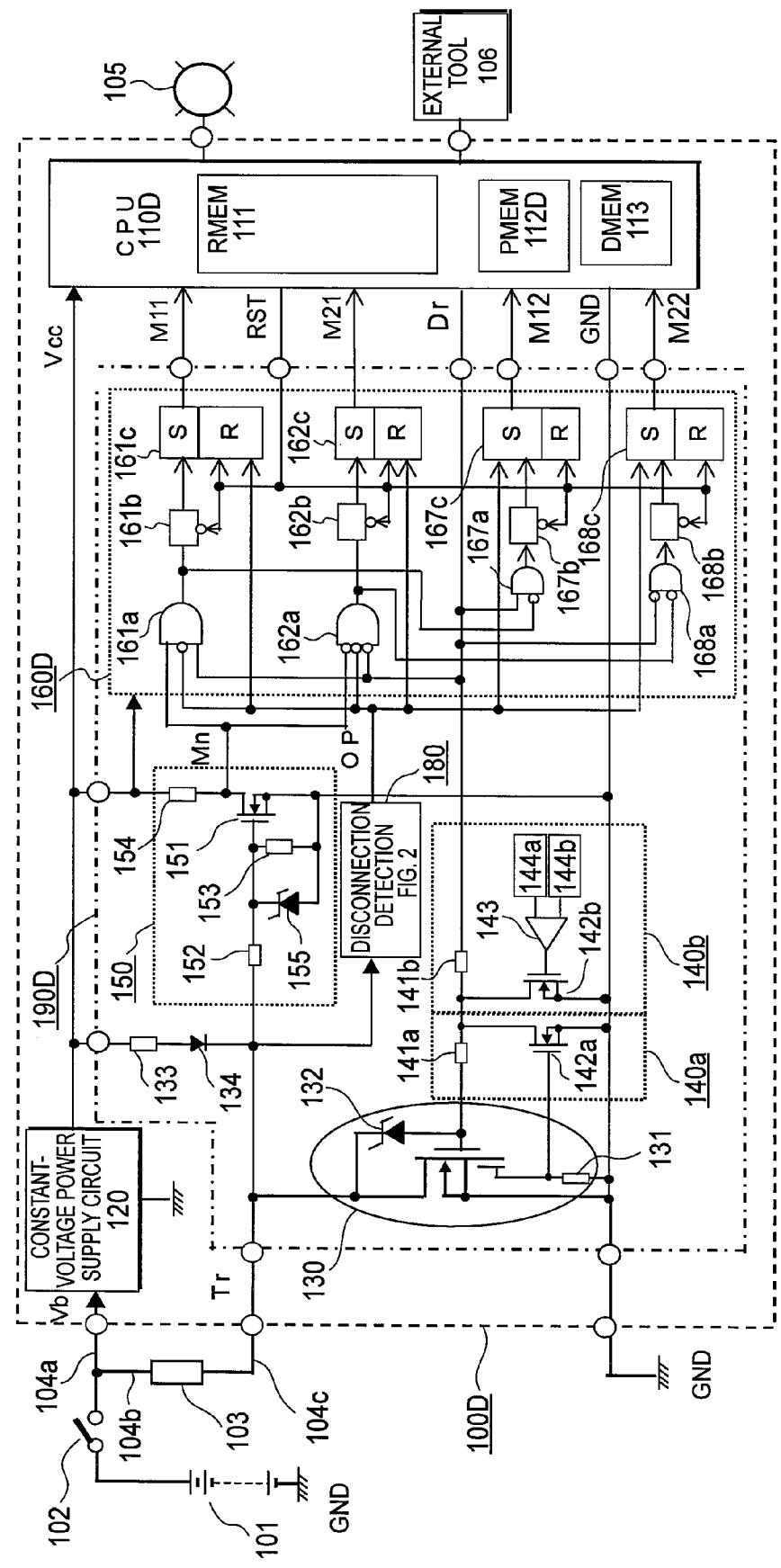
FIG. 9 is a block diagram of an entire circuit of a drive control device for an electric load according to a fourth embodiment of the present invention.

In the following section, referring to FIG. 9 illustrating a block diagram of an entire circuit of the drive control device for an electric load according to a fourth embodiment of the present invention, a description is mainly given of differences from the device illustrated in FIG. 1. It should be noted that like or corresponding components are denoted by like numerals throughout drawings. In FIG. 9, a drive control device 100D, which receives a power from the drive power source 101 via the power supply relay 102, and controls the drive of the electric load 103, includes a microprocessor 110D serving as the monitoring/controlling means, the constant-voltage power supply circuit 120, the switching element 130 which is a power transistor provided with the over-current suppression circuit 140a and the overheat interruption circuit 140b, the state detection circuit 150, the disconnection detection circuit 180, and a determination storing circuit 160D, the microprocessor 110D cooperates with the RAM 111, a program memory 112D, and the data memory 113 to detect disconnection and short circuit abnormalities of wiring circuits of the electric load 103, the electric load 103, and the switching element 130, thereby reporting the abnormality using the alarm display 105, storing information on the abnormality generation history in the data memory 113, and permitting the external tool 106 to read, for maintenance and inspection, the information on the generated abnormalities.

It should be noted that a main difference between the device in FIG. 9 and the device in FIG. 1 is that, while the determination storing circuit 160A in FIG. 1 includes the command history storing circuit 170, and, by the normal closed-circuit storing element 161c and the normal open-circuit storing element 162c, generates, as the closed-circuit determination storing signal, the normal closed-circuit storing signal M1, and, as the open-circuit determination storing signal, the normal open-circuit storing signal M2, the determination storing circuit 160D in FIG. 9, by a normal closed-circuit storing element 161c, an abnormal closed-circuit storing element 167c, a normal open-circuit storing element 162c and an abnormal open-circuit storing element 168c, generates, as the closed-circuit determination storing signal, a normal closed-circuit storing signal M11 and an abnormal closed-circuit storing signal M12, and, as the open-circuit determination storing signal, a normality open-circuit storing signal M21 and an abnormality open-circuit storing signal M22, and the disconnection detection circuit 180 is exactly the same as that illustrated in FIG. 2. In the program memory 112D, control programs serving as the command output generation means 602b, the determination information reading means 604a, the recheck processing means 706a, and the abnormality handling means 707a and 608b, which were mentioned before referring to FIGS. 10 and 11, are stored.

In the determination storing circuit 160D, a normal closed-circuit determination element 161a is an AND element, to which the control output signal Dr, the state detection signal Mn, and a logically inverted signal of the disconnection detection signal OP are input, a filter circuit 161b is a low-pass filter including a resistor (not shown) and a capacitor (not shown), a normal closed-circuit storing element 161c is a flip-flop circuit which operates in response to a set input and a reset input, when the control output signal Dr represents the circuit closing command (logic level "H"), the disconnection detection signal OP represents the non-disconnection state (logic level "L"), and the state detection signal Mn detects the closed-circuit state (logic level "H"), the output voltage level of the AND element 161a becomes "H", via the filter circuit 161b, the normal closed-circuit storing element 161c is set, and a normal closed-circuit storing signal M11 is supplied to the microprocessor 110D. The filter circuit 161b eliminates a momentary error operation signal due to a response delay of the respective circuits, and the capacitor is discharged by a reset command signal RST described later.

A normal open-circuit determination element 162a is an AND element, to which a logically inverted signal of the control output signal Dr, a logically inverted signal of the state detection signal Mn, and the logically inverted signal of the disconnection detection signal OP are input, a filter circuit 162b is a low-pass filter including a resistor (not shown) and a capacitor (not shown), a normal open-circuit storing element 162c is a flip-flop circuit which operates in response to a set input and a reset input, when the control output signal Dr represents the circuit opening command (logic level "L"), the disconnection detection signal OP represents the non-disconnection state (logic level "L"), and the state detection signal Mn detects the open-circuit state (logic level "L"), the output voltage level of the AND element 162a becomes "H", via the filter circuit 162b, the normal open-circuit storing element 162c is set, and a normal open-circuit storing signal M21 is supplied to the microprocessor 110D. The filter circuit 162b eliminates a momentary error operation signal due to a response delay of the respective circuits, and the capacitor is discharged by the reset command signal RST described later. The normal closed-circuit storing element 161c and the normal open-circuit storing element 162c are reset when the disconnection detection signal OP is in the disconnection detection state (logic level "H"), and the normal closed-circuit storing signal M11 and the normal open-circuit storing signal M21 is in the state of logic level "H".

A abnormal open-circuit determination element 167a is an AND element, to which the control output signal Dr, and the logically inverted signal of the output signal of the normal closed-circuit determination element 161a are input, a filter circuit 167b is a low-pass filter including a resistor (not shown) and a capacitor (not shown), an abnormal closed-circuit storing element 167c is a flip-flop circuit which operates in response to a set input and a reset input, when the control output signal Dr represents the circuit closing command (logic level "H"), the output voltage level of the AND element 167a becomes "H", via the filter circuit 167b, the abnormal closed-circuit storing element 167c is set, and an abnormal closed-circuit storing signal M12 is supplied to the microprocessor 110D. The filter circuit 167b eliminates a momentary error operation signal due to a response delay of the respective circuits, and the capacitor is discharged by the reset command signal RST described later.

An abnormal open-circuit determination element 168a is an AND element to which respective logically inverted signals of the control output signal Dr and the output signal of the normal open-circuit determination element 162a are input, a filter circuit 168b is a low-pass filter including a resistor (not shown) and a capacitor (not shown), the abnormal open-circuit storing element 168c is a flip-flop circuit operating in response to a set input and a rest input, when the control output signal Dr is the circuit closing command (logic level "L"), and the normal open-circuit determination element 162a supplies the output in the non-normal state (logic level "L"), the output voltage level of the AND element 168a is "H", the abnormal open-circuit storing element 168c is, via the filter circuit 168b, is set, and the abnormal open-circuit storing signal M22 is supplied to the microprocessor 110D. The filter circuit 168b eliminates a momentary error operation signal due to a response delay of the respective circuits, and the capacitor is discharged by the reset command signal RST described later. The abnormal closed-circuit storing element 167c and the abnormal open-circuit storing element 168c are set when the disconnection detection signal OP is in the disconnection detection state (logic level "H"), and generate the abnormal closed-circuit storing signal M12 and the abnormal open-circuit storing signal M22.

The microprocessor 110D reads the normal closed-circuit storing signal M11, the abnormal closed-circuit storing signal M12, the normal open-circuit storing signal M21, and the abnormal open-circuit storing signal M22, and, as illustrated later in FIGS. 10 and 11, carries out overall abnormality determination, and generates the reset command signal RST, thereby resetting the stored states of the respective determination storing elements.

(2) Detailed Description of Effects and Operations

Figure 10:
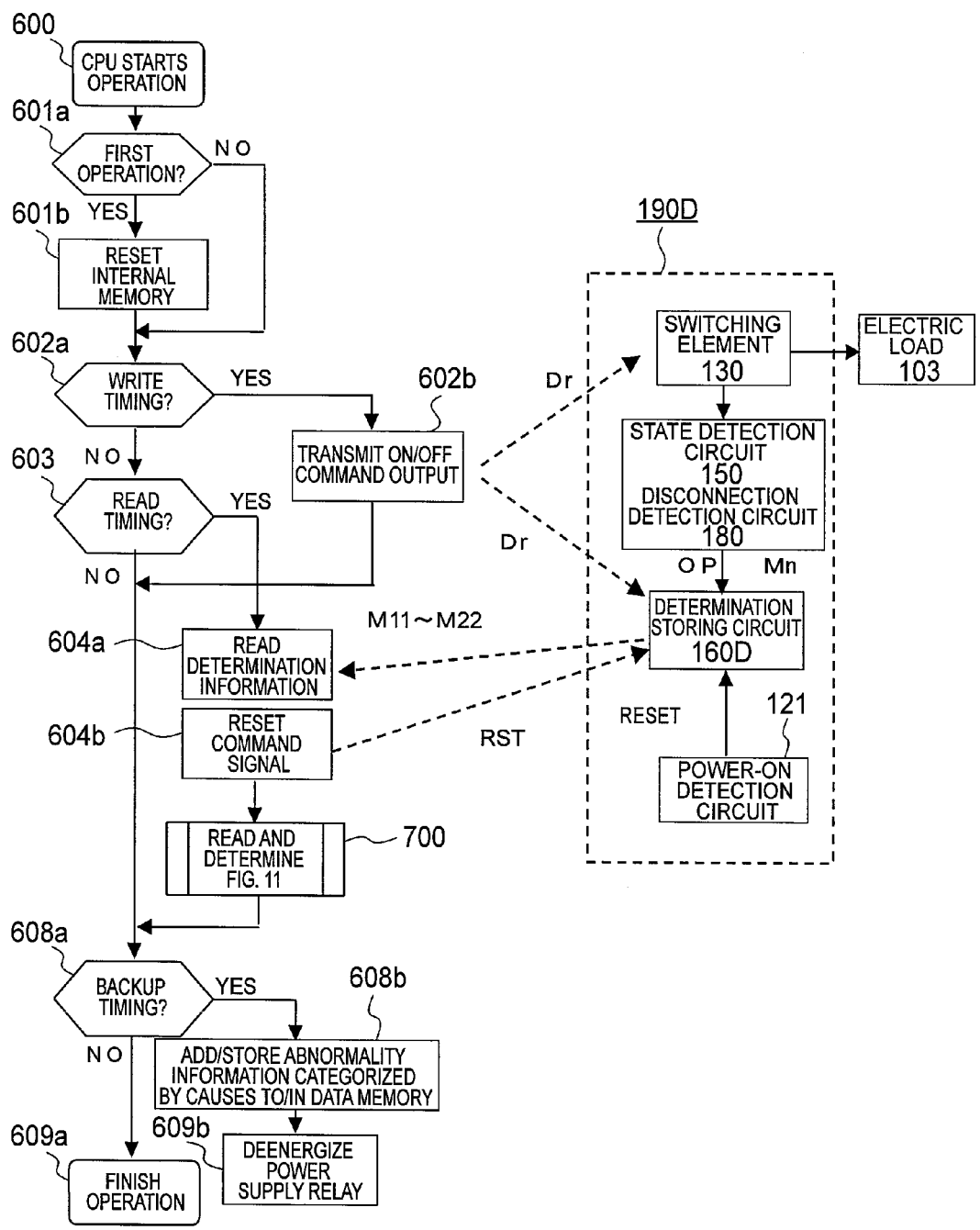
FIG. 10 is a flowchart illustrating an operation of the device in FIG. 9.
Figure 11:
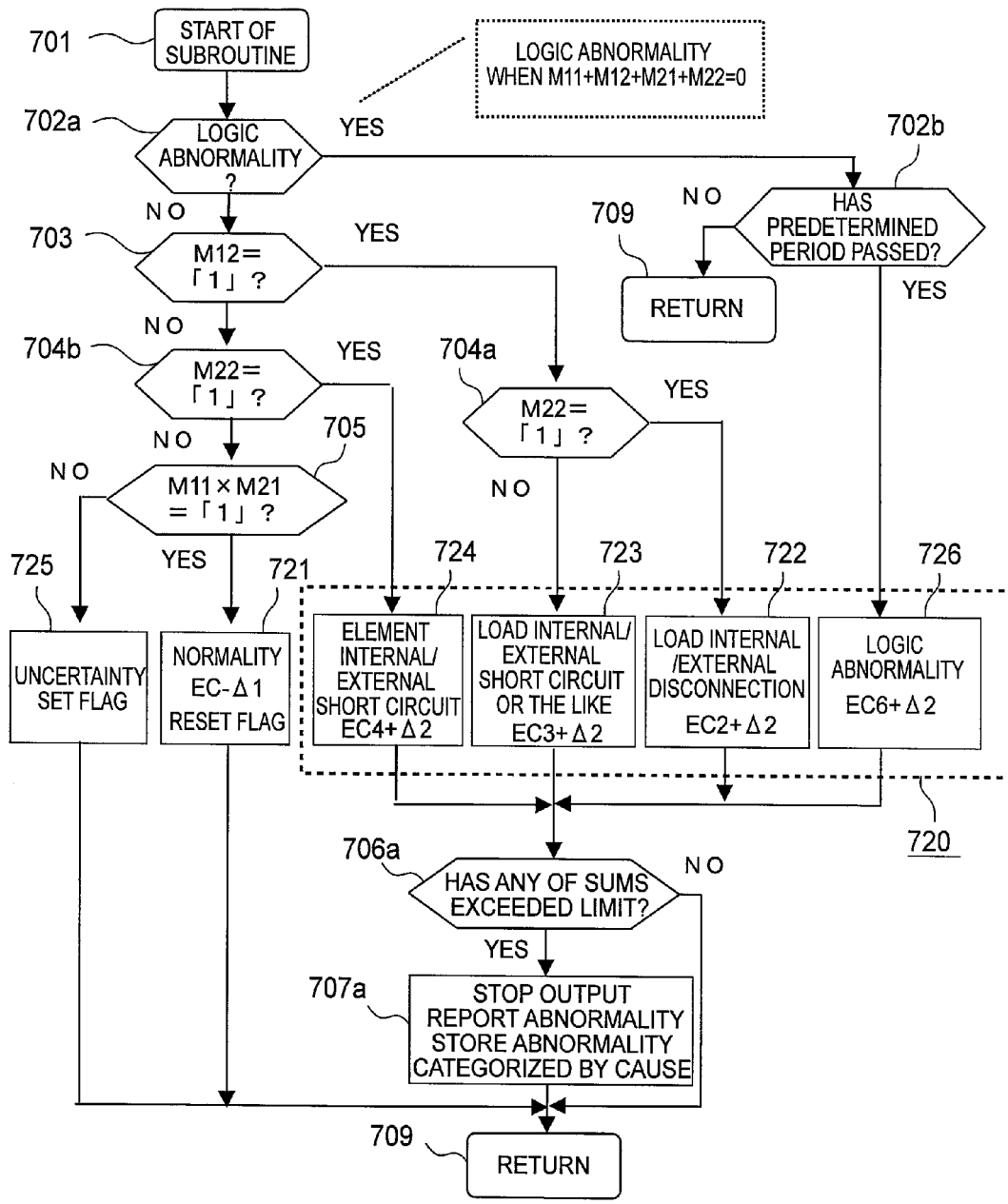
FIG. 11 is a flowchart detailing a part of the operation in FIG. 10.

A description is given of effects and operations of the device according to the fourth embodiment of the present invention configured as illustrated in FIG. 9 referring to flowcharts illustrated in FIGS. 10 and 11. First, in FIG. 9, when the power supply switch (not shown) is brought into the closed-circuit state, the output contact point of the power supply relay 102 is brought into the closed-circuit state, the power is supplied to the drive control device 100D, and the microprocessor 110D starts the operation. The microprocessor 110D, according to the operation states of the plurality of input signals (not shown) and contents of the control program stored in the program memory 112D, performs the drive control of the plurality of electric loads (not shown). The power supply to the electric load 103, which is a part of the plurality of electric loads, is controlled by the switching element 130 serving as the power transistor subjected to opening/closing control in response to the control output signal Dr generated by the microprocessor 110D.

The microprocessor 110D, cooperating with the state detection circuit 150, the disconnection detection circuit 180, and the determination storing circuit 160D, detects the presence/absence of the abnormalities such as the load internal/external short circuit or the like 210 including the across-load wiring short circuit 210a, the load internal short circuit 210b, and the switching element fusion 210c, the element internal/external short circuit 220 including the across-element wiring short circuit 220a and the element internal short circuit 220b, and the load internal/external short circuit 230 including the load wiring disconnection 230a and the load internal disconnection 230b, and writes and stored the detection in the RAM 111. When the power supply switch is brought into the open-circuit state, the power supply relay 102 maintains the closed-circuit state for the predetermined delay period, and, in this delayed power supply period, the abnormality generation information stored in the RAM 111 is transferred to and stored in the nonvolatile data memory 113. When the power transistor 130 is in the closed-circuit state, and an excessive current flows through the electric load 103 due to the short-circuit abnormality, the voltage between both terminals Tr of the power transistor 130 exceeds the predetermined closed-circuit voltage, and, due to the closed-circuit state of the state detection transistor 151, the short-circuit abnormality is detected. When the short-circuit abnormality internal or external to the load is generated, the microprocessor 110D sets the control output signal Dr, directed to the power transistor 130, to the circuit opening command.

A description is be given of FIG. 10 which is a flowchart describing the operation of the device illustrated in FIG. 9, and FIG. 11 which is a flowchart detailing a part of the operation in FIG. 10. In FIG. 10, Step 600 is a start step of the abnormality determination operation by the microprocessor 110D included in the monitoring/controlling means. The following Step 601a is a determination step, from which the operation proceeds, when Step 601a is executed for the first time, by a determination "YES", to Step 601b, and the operation proceeds, when Step 601a is executed for the second and subsequent times, by a determination "NO", to Step 602a. Step 601b is a step of resetting the counter 720 and an internal memory written in Step block 700, from which the operation proceeds to Step 602a. Step 602a is a determination step, in which the microprocessor 110D determines whether a timing for writing the control output signal Dr to an output latch memory (not shown) has been reached, and a determination "YES" is periodically made, and the operation proceeds to Step 602b, and a determination "NO" is periodically made, and the operation proceeds to Step 603. In Step 602b, the microprocessor 110D uses the command output generation means to generate the control output signal Dr, thereby generating a switching command output to the switching element 130, and the operation proceeds to Step 608a.

Step 603 is a determination step, in which the microprocessor 110D determines whether a timing for reading the determination storing signals M11, M12, M21, and M22 from the determination storing circuit 160D, has been reached, and a determination "YES" is periodically made, and the operation proceeds to Step 604a, and a determination "NO" is periodically made, and the operation proceeds to Step 608a. It should be noted that, in Step 608a described later, when the power supply switch is in the closed-circuit state, a determination "NO" is periodically made, and the operation proceeds to an operation finishing Step 609a, and in the operation finishing Step 609, the microprocessor 110D executes other control programs, and then the operation proceeds again to the start Step 600. Then, while the control flow circulating among Steps 600, 602a, 603, 608a, 609a, and 600, when the determination "YES" is periodically made in Step 602a, the microprocessor 110D executes Step 602b, and when the determination "YES" is periodically made in Step 603, the microprocessor 110D executes Step 604a and Step 604b and Step block 700. In Step 604a, the microprocessor 110D uses the determination information reading means to read the determination storing signals M11, M12, M21, and M22 from the determination storing circuit 160D, and the operation proceeds to Step 604b, and in Step 604b, the microprocessor 110D generates the reset command signal RST for the stored information directed to the determination storing circuit 160D, and the operation proceeds to Step block 700.

It should be noted that, in Step 604a, when the signal voltage levels of the determination storing signals M11, M12, M21, and M22 are "H", the logic value "1" is written to a corresponding predetermined address in the RAM 111, and when the signal voltage levels are "L", the logic value "0" is written to the address, however, the inverted logic value may be written. In Step block 700, as illustrated later in FIG. 11, the microprocessor 110D carries out the overall abnormality determination according to the logic states of the determination storing signals M11, M12, M21, and M22 read in Step 604a, and stores a result of the overall determination categorized by the cause in the RAM 111. In Step 608a executed when a determination "NO" is made in Step 603 or executed following to Step block 700, when the power supply switch is in the closed-circuit state, a determination "NO" is made, and the operation proceeds to the operation finishing Step 609a, and again proceeds to the operation start Step 600, and when the power supply switch is in the open-circuit state, a determination "YES" is made, and the operation proceeds to Step 608b. In Step 608b, the microprocessor 110D uses the abnormality handling means to store the abnormality generation information categorized by the cause confirmed and stored in Step 607a in the nonvolatile data memory 113, and then the operation proceeds to Step 609b, and in Step 609b, the microprocessor 110D deenergizes the power supply relay 102. It should be noted that the data to be stored in the data memory 113 is the number of generated abnormalities categorized by the cause, and, when the forwarding in Step 608b is carried out, and data obtained by reading out an accumulated number of times up to the previous time and incremented by one is written for update.

In the power transistor 130, the state detection circuit 150, and the determination storing circuit 160D included in the intelligent power switch 190D, the switching element 130 carries out, in response to the logic level of the control output signal Dr, the switching control operation, thereby controlling the power supply state to the electric load 103. The state detection signal Mn responding to the switching operation state of the switching element 130, and the disconnection detection signal OP responding to the load internal/external disconnection state are supplied via the state detection circuit 150 and the disconnection detection circuit 180 to the determination storing circuit 160D. The determination storing circuit 160D, responding to the control output signal Dr, the state detection signal Mn, and the disconnection detection signal OP, generates the normal closed-circuit storing signal M11, the normal open-circuit storing signal M21, the abnormal closed-circuit storing signal M12, and the abnormal open-circuit storing signal M22, which serve as the determination storing signal, and inputs the signals to the microprocessor 110D. The stored state of the determination storing circuit 160D is reset by the power-on detection circuit 121 when the power supply is turned on, and is reset by the reset command signal RST from the microprocessor 110D, and becomes the logic level "L".

In FIG. 11 detailing Step block 700 in FIG. 10, Step 701 is a start step of a subroutine program. The following Step 702a is a determination step, in which the microprocessor 110D determines whether the determination storing signals M11, M12, M21, and M22 read in Step 704a are all at the logic level "L", when all of the signals are at the logic level "L", a determination "YES" is made, and the operation proceeds to Step 702b, and, when any one of the signals is at the logic level "H", a determination "NO" is made, and the operation proceeds to Step 703. It should be noted that the determination "YES" is made in Step 702a when the reset command signal RST to the determination storing circuit 160D is at the logic level "H", and when the reset command signal RST is cleared to the logic level "L", but the predetermined delayed response period caused by the filter circuits 161b, 162b, 167b and 168b continues, the determination "YES" is made and the overall abnormality determination is not made. In practice, as the read timing of the determination signals M11 to M22, not a timing immediately after a change of the control output signal Dr, but a timing between the rewrite timings of the control command signal Dr, the determination in Step 702a is usually "NO", and the operation immediately proceeds to Step 703.

In Step 702b, a determination "NO" is made within a predetermined period after the determination "YES" is made in Step 702a, and the operation returns via Step 709 to Step 608a in FIG. 10. The operation proceeds from the operation finishing Step 609a in FIG. 10 via the operation start Step 600 again to Steps 702a and 702b in FIG. 11. While this circulation repeats, when the reset command signal RST is cleared, but the determination "NO" is not made in Step 702a after the predetermined period has passed, a determination "YES" is made in Step 702b, which corresponds to an excess in time, and the operation proceeds to Step 726.

Step 703 is a determination step, in which the microprocessor 110D determines whether the abnormal closed-circuit storing signal M12 is storing the logic value "1" representing the abnormal closed-circuit state, and a determination "YES" is made when the logic value "1" is stored, and the operation proceeds to Step 704a, and a determination "NO" is made when the logic value "1" is not stored, and the operation proceeds to Step 704b. Step 704a is a determination step, in which the microprocessor 110D determines whether the abnormal open-circuit storing signal M22 is storing the logic value "1" representing the abnormal open-circuit state, a determination "YES" is made when the logic value "1" is stored, and the operation proceeds to Step 722, and a determination "NO" is made when the logic value "1" is not stored, and the operation proceeds to Step 723. Step 704b is a determination step of determining whether the abnormal open-circuit storing signal M22 is storing the logic value "1" representing the abnormal open-circuit state, in which when the logic value "1" is stored, a determination "YES" is made, and the operation proceeds to Step 724, and when the logic value "1" is not stored, a determination "NO" is made, and the operation proceeds to Step 705. Step 705 is a determination step of determining whether both the normal closed-circuit storing signal M11 and the normal open-circuit storing signal M21 are storing the logic value "1" representing that the normal state, in which when the logic value "1" is stored, a determination "YES" is made, and the operation proceeds to Step 721, and when the logic value "0" is stored by at least one of the signals, a determination "NO" is made, and the operation proceeds to Step 725.

In Step 726, when the logic abnormality continues for more than a predetermined period in Steps 702a and 702b, the microprocessor 110D determines that a logic abnormality has occurred, and adds a variation value Δ2=3 to a present value resistor of an error counter EC6 (not shown). In Step 722, when the determination in Step 702a does not result in the logic abnormality, the determination in Step 703 results in the closed-circuit abnormality, and the determination in Step 704a results in the open-circuit abnormality, the microprocessor 110D determines that the load internal/external disconnection 230 (refer to FIG. 2) has occurred, and adds the variation value Δ2=3 to a present value resistor of an error counter EC2 (not shown). In Step 723, when the determination in Step 702a does not result in the logic abnormality, the determination in Step 703 results in the closed-circuit abnormality, and the determination in Step 704a does not result in the open-circuit abnormality, the microprocessor 110D determines that the load internal/external short circuit or the like 210 (refer to FIG. 2) has occurred, and adds the variation value Δ2=3 to a present value resistor of an error counter EC3 (not shown). In Step 724, when the determination in Step 702a does not result in the logic abnormality, the determination in Step 703 does not result in the closed-circuit abnormality, and the determination in Step 704b results in the open-circuit abnormality, the microprocessor 110D determines that the element internal/external disconnection 220 (refer to FIG. 2) has occurred, and adds the variation value Δ2=3 to a present value resistor of an error counter EC4 (not shown).

It should be noted that the four error counters EC2, EC3, EC4, and EC6 are generally referred to as error counter 720. In Step 725, when the determination in Step 702a does not result in the logic abnormality, the determination in Step 703 does not result in the closed-circuit abnormality, the determination in Step 704b does not result in the open-circuit abnormality, and the determination in Step 705 results in that one of the normal closed-circuit storing signal M11 and the normal open-circuit storing signal M21 does not store the normality determination, the microprocessor 110D determines that the preliminary normal closed circuit or preliminary normal open-circuit state is present, and sets an uncertain flag (not shown) and the operation proceeds to Step 709. In Step 721, when the determination in Step 702a does not result in the logic abnormality, the determination in Step 703 does not result in the closed-circuit abnormality, the determination in Step 704b does not result in the open-circuit abnormality, and the determination in Step 705 results in that both the normal closed-circuit storing signal M11 and the normal open-circuit storing signal M21 store the normality determination, the microprocessor 110D subtracts from the respective present value resistors of the four error counters EC2, EC3, EC4, and EC6, a variation value Δ2=1, and resets the uncertainty flag set in Step 725, and the operation proceeds to Step 709. It should be noted that, when, in the subtraction processing on the present value resistor in Step 721, the value of the each present value resistor becomes zero, the subtraction processing stops.

In Step 706a executed following to Step 722, 723, 724, or 726, the microprocessor 110D uses the recheck processing means to determine whether the value of the present value resistor of the four error counters EC2, EC3, EC4, and EC6 exceeds an upper limit value 7, and when the value exceeds the upper limit value 7, a determination "YES" is made, and the operation proceeds to Step 707a, and when the value is equal to or less than the upper limit value 7, a determination "NO" is made, and the operation proceeds to Step 709. In Step 707a, the microprocessor 110D uses the abnormality handling means to set, when a cause of the abnormality is the load internal/external short circuit or the like 210, the control output signal Dr to the circuit opening command, report the abnormality generation state by the alarm display 105, for example, and confirm and store the abnormality generation categorized by the cause, and the operation proceeds to Step 709. Step 709 is a return step, from which the operation proceeds to Step 608a in FIG. 10.

Generally describing the error counter 720, when a certain abnormality occurs, a value three is added, by the abnormality generated once, to the present value resistor of any one of the error counters EC2, EC3, EC4, and EC6. When this is an abnormality sporadically generated by a malfunction due to noises or the like, the subtraction processing in Step 721 is repeated, and the present value of the error counter does not exceed seven. However, when this is caused by a hardware abnormality, the generated abnormality continues, the subtraction in Step 721 is not carried out, the upper limit 7 is exceeded when the abnormality is generated at most three times, and the determination "YES" is made in Step 706a.

(3) Essential Points and Characteristics of Fourth Embodiment

As apparent from the above description, the drive control device for an electric load according to the fourth embodiment is the drive control device 100D for an electric load including the switching element 130 serially connected to the electric load 103 to which the power is supplied from the drive power source 101, and the monitoring/controlling means 110D for performing the opening/closing control of the switching element 130, and monitoring presence/absence of an abnormal state of the power supply circuit for the electric load 103, the monitoring/controlling means 110D generates the control output signal Dr serving as the circuit closing command or the circuit opening command directed to the switching element 130, and supplies the switching element 130 and the determination storing circuit 160D with the control output signal, the switching element 130 generates the state detection signal Mn according to open/closed-circuit states of the switching element 130, and supplies the determination storing circuit 160D with the state detection signal Mn, the determination storing circuit 160D detects, when the control output signal Dr is the circuit closing command, whether the switching element 130 has normally been brought into the closed-circuit state and stores a result of the detection, thereby generating the closed-circuit determination storing signals M11 and M12, detects, when the control output signal Dr is the circuit opening command, whether the switching element 130 has normally been brought into the open-circuit state and stores a result of the detection, thereby generating the open-circuit determination storing signals M21 and M22, and the determination storing circuit 160D is, when the monitoring/controlling means 110D has read the determination storing signal, forcedly reset periodically by a command of the monitoring/controlling means 110D, and the monitoring/controlling means 110D further periodically reads and stores the closed-circuit determination storing signals M11 and M12, and the open-circuit determination storing signals M21 and M22 serving as the determination storing signal before the determination storing circuit 160D is reset, thereby determining the presence/absence of the abnormal state according to the combination of the logics relating to the signal voltage level of the determination storing signal stored before.

Further, the determination storing circuit 160D includes, as the closed-circuit determination storing signal, the normal closed-circuit storing signal M11 and the abnormal closed-circuit storing signal M12, and, as the open-circuit determination storing signal, the normal open-circuit storing signal M21 and the abnormal open-circuit storing signal M22, the monitoring/controlling means 110D periodically reads the determination storing signals of the determination storing circuit 160D, and determines the presence/absence of the abnormal state according to the combination of the voltage levels of the normal closed-circuit storing signal M11, the abnormal closed-circuit storing signal M12, the normal open-circuit storing signal M21, and the abnormal open-circuit storing signal M22, and the stored information on all the respective determination storing signals M11, M12, M21, and M22 is forcedly reset periodically by the command of the monitoring/controlling means 110D after the monitoring/controlling means 110D reads the determination storing signals. As a result, the monitoring/controlling means, based on the normal closed-circuit storing signal, the abnormal closed-circuit storing signal, the normal open-circuit storing signal, and the abnormal open-circuit storing signal generated by the determination storing circuit, makes the abnormality determination.

Thus, there is provided a characteristic that, when, after the off command remains for a long period, the on command is generated, the overall normality determination is suspended until the on command is generated, when, while the off command is active, the open-circuit abnormality is generated, an abnormality determination can be quickly made, and when, while the on command is active, and the closed-circuit abnormality is generated, an abnormality determination can be quickly made. Further, there is provided a characteristic that, when the control output signal is a signal for the pulse-width modulation, and the switching operation is carried out in a period in which, from the reading of the determination storing signal for the previous time to the reading for the present time, the control output signal always changes from the circuit closing command or circuit opening command to the circuit opening command or circuit closing command at least once, each time when the reading has been completed, thereby allowing an update and repeat of the normality determination operation or the abnormality determination operation. Especially, on the side of the determination storing circuit, the normality determination and the abnormality determination are stored independently for the circuit closing command and the circuit opening command, and there is thus provided a characteristic that the abnormality determination by the monitoring/controlling means can be simplified.

Further, in a state in which neither the normal closed-circuit storing signal M11 nor the abnormal closed-circuit storing signal M12 read from the determination storing circuit 160D does not store the closed-circuit determination signal, and neither the normal open-circuit storing signal M21 nor the abnormal open-circuit storing signal M22 does not store the open-circuit determination signal, the monitoring/controlling means 110D makes the preliminary determination of the logic abnormality, carries out the recheck processing, and then makes the logic abnormality determination, and the logic abnormality determination determines whether a signal transmission system from the monitoring/controlling means 110D to the switching element 130 or the determination storing circuit 160D is abnormal, or malfunctions due to a noise. As a result, the monitoring/controlling means, when there is inconsistency in the logic in which both the normal closed-circuit storing signal and the abnormal closed-circuit storing signal are false, and both the normal open-circuit storing signal and the abnormal open-circuit storing signal are false, makes the logic abnormality determination. Thus, there is provided a characteristic that, when the determination storing circuit which is directly connected to the switching element, which is the power transistor, and is provided close thereto malfunctions due to noises or the like, the recheck processing can prevent an erroneous abnormality handling from being carried out.

Further, the normal closed-circuit storing signal M11 is at the logic "1" when the control output signal Dr is the circuit closing command signal, and the voltage Tr between terminals of the switching element 130 is equal to or less than the predetermined closed-circuit voltage Von, so as to make the preliminary normality determination considering that the switching element 130 has normally carried out the circuit closing operation, while leaving a possibility that the abnormality of the element internal/external short circuit 220 which is the internal short circuit or the across-element wiring short circuit of the switching element 130 may be present. The abnormal closed-circuit storing signal M12 is at the logic "1" when the control output signal Dr is the circuit closing command signal, and the voltage Tr between the terminals of the switching element 130 is more than the predetermined closed-circuit voltage Von, so as to make the determination of abnormality of the load internal/external short circuit or the like 210 which means the internal short circuit of the electric load 103, the short circuit between the terminals of the electric load by external wiring, or the fused state in which the switching element 130 cannot be closed. The normal open-circuit storing signal M2 is at the logic "1" when the control output signal Dr is the circuit opening command signal, and the voltage Tr between the terminals of the switching element 130 is equal to or more than the predetermined open-circuit voltage Voff, so as to make the preliminary normality determination considering that the switching element 130 has normally carried out the circuit opening operation, while having a possibility that an abnormality of the load internal/external short circuit or the like 210 may be present. The abnormal open-circuit storing signal M22 is at the logic "1" when the control output signal Dr is the circuit opening command signal, and the voltage Tr between the terminals of the switching element 130 is less than the predetermined open-circuit voltage Voff, so as to make the determination that an abnormality such as the element internal/external short circuit 220 is present.

Further, the monitoring/controlling means 110D, when both of the normal closed-circuit storing signal M11 and the normal open-circuit storing signal M21 are at the logic "1", which represents the preliminary normality determination, and both of the abnormal closed-circuit storing signal M12 and the abnormal open-circuit storing signal M22 are at the logic "0", determines that all the electric load 103, the switching element 130, and external wiring are normal. Further, the monitoring/controlling means 110D, when the normal closed-circuit storing signal M11 is at the logic "1", which represents the preliminary normality determination, and the normal open-circuit storing signal M22 is at the logic "1", which represents the non-normality determination, determines that the abnormality caused by the element internal/external short circuit 220 is present. Further, the monitoring/controlling means 110D, when the abnormal closed-circuit storing signal M12 is at the logic "1", which represents the abnormality determination, and the normal open-circuit storing signal M21 is at the logic "1", which represents the preliminary normality determination, determines that the abnormality caused by the load internal/external short circuit or the like 210 is present, the logic "1" representing that a logic level of a signal voltage is "H" or "L", and the logic "0" representing that the logic level of the signal voltage is "L" or "H", which is an inverted logic. As a result, the monitoring/controlling means comprehensively makes the abnormality determination by combining all the logic levels of the normal closed-circuit storing signal and abnormal closed-circuit storing signal, and the normal open-circuit storing signal and the normal open-circuit storing signal. Thus, there is provided a characteristic that it is possible to identify and detect the abnormality of the load internal/external short circuit or the like which is the across-load wiring short circuit, the load internal short circuit, or the switching element fusion, or the element internal/external short circuit which is the across-element wiring short circuit or the element internal short circuit, thereby accurately determining a normal state in which these abnormalities are not present.

Further, the pull-up resistor 133 and the pull-down resistor 152 are connected to the connection point between the switching element 130 and the electric load 103, and the monitored voltage V0 at this connection point is input to the disconnection detection circuit 180, the disconnection detection circuit 180 includes the voltage dividing resistors 181, 182, and 183 for generating the first voltage V1 and the second voltage V2, which is a set value higher than the first voltage V1, and the zone comparison circuit 187, and the zone comparison circuit 187, when the monitored voltage V0 is between the first voltage V1 and the second voltage V2, determines that the load internal/external disconnection 230 which is an internal disconnection of the electric load 103 or a disconnection of load wiring occurs, thereby generating the disconnection detection signal OP, and when the disconnection detection circuit 180 detects the disconnection internal/external to the electric load, both the abnormal closed-circuit storing signal M12 and the abnormal open-circuit storing signal M22 are set to the logic "1", which represents the abnormality determination.

As a result, in the fourth embodiment, the disconnection detection circuit for detecting the disconnection abnormality external or internal to the electric load is provided, and, when the disconnection abnormality is detected, both the abnormal closed-circuit storing signal and the abnormal open-circuit storing signal are set to the non-normality determination side. It should be noted that the abnormality determination state of the abnormal closed-circuit storing signal is set for the internal/external short-circuit abnormality of the electric load, the abnormality determination state of the abnormal open-circuit storing signal is set for the internal/external short-circuit abnormality of the switching element, when the internal/external short-circuit abnormality of the electric load and the external short-circuit abnormality of the switching element occur at the same time, a short circuit between the positive terminal and the negative terminal of the drive power source is present, the power supply interrupt such as fusion of a fuse is carried out, and the drive control device stops the operation. Further, when the internal/external short-circuit abnormality of the electric load and the internal short-circuit abnormality of the switching element occur at the same time, the short circuit between the positive terminal and the negative terminal of the drive power source is present, the power supply interrupt such as fusion of a fuse is carried out, or the switching element fused, the power supply recovers, the drive control device is restarted, and an abnormality state in which the switching element cannot be brought into the closed-circuit state arises. Thus, there is provided a characteristic that when the monitoring/controlling means detects that both the abnormal closed-circuit storing signal and the abnormal open-circuit storing signal are on the abnormal side, the disconnection abnormality internal/external to the electric load is identified, and, according to a small number of the types of the storing signal, the many types of the abnormality state can be distinguished.

Fifth Embodiment (1) Detailed Description of Configuration

Figure 12:
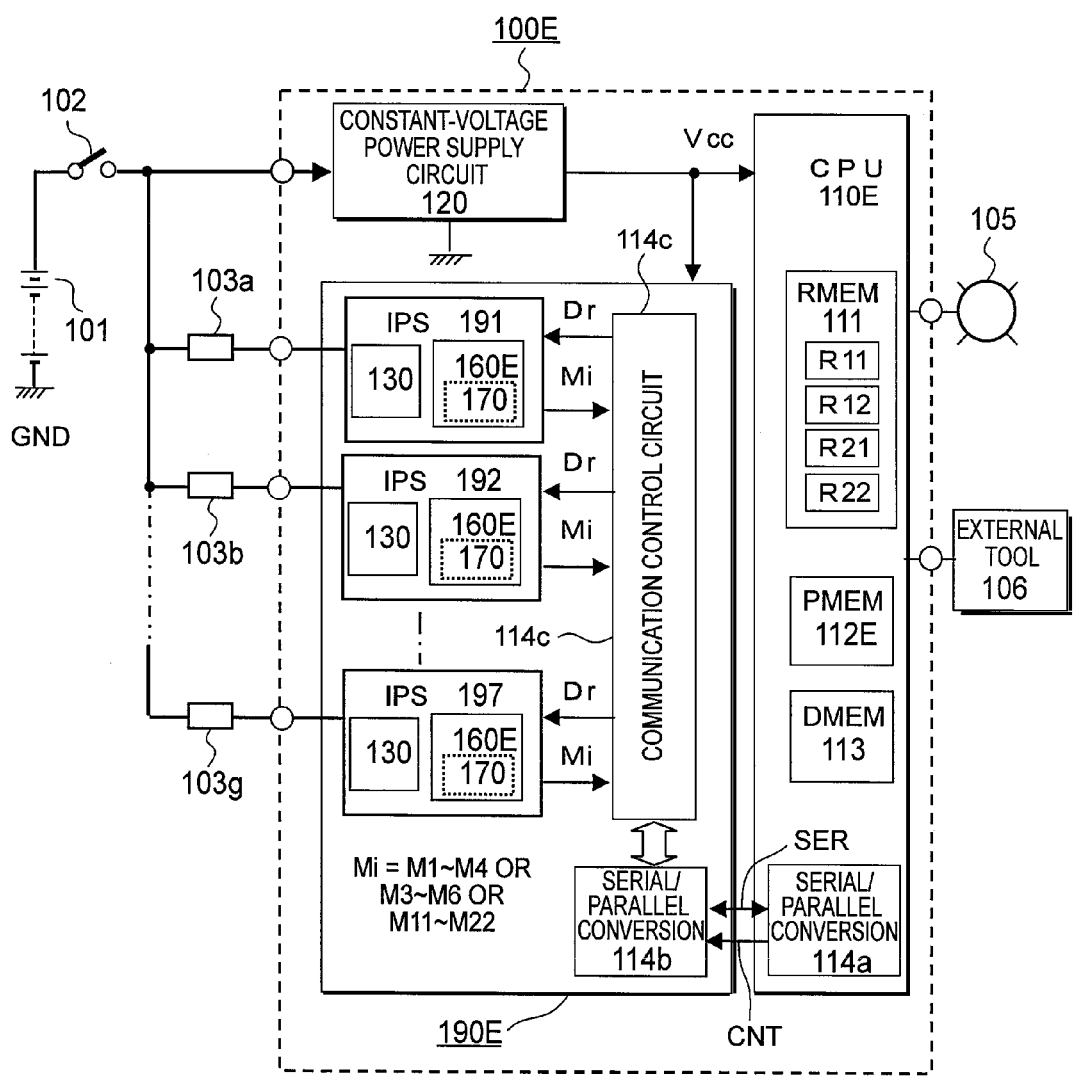
FIG. 12 is a block diagram of an entire circuit of a drive control device for an electric load according to a fifth embodiment of the present invention.

In the following section, referring to FIG. 12 illustrating a block diagram of an entire circuit of the drive control device for an electric load according to a fifth embodiment of the present invention, a description is mainly given of differences from the devices illustrated in FIGS. 1, 6, 8, and 9. It should be noted that like or corresponding components are denoted by like numerals throughout drawings. In FIG. 12, the drive control device 100E, which receives a power from the drive power source 101 via the power supply relay 102, and controls the drive of electric loads 103a to 103g, includes a microprocessor 110E serving as the monitoring/controlling means, the constant-voltage power supply circuit 120, and an intelligent power module 190E including seven, for example, intelligent power switches 191 to 197. The respective intelligent power switches 191 to 197 include the switching element 130 which is the power transistor provided with the over-current suppression circuit 140a and the overheat interruption circuit 140b or the over-current interruption circuit 140c, and a determination storing circuit 160E operating in response to the output signals of the state detection circuit 150 and the disconnection detection circuit 180 (not shown) and including the command history storing circuit 170. It should be noted that the intelligent power module 190E is, for example, formed as respective components accumulated and mounted on a single circuit board, or is formed as an integrated discrete component.

The microprocessor 110E can cooperate with the RAM 111, a program memory 112E, and the nonvolatile data memory 113 to detect disconnection and short circuit abnormalities of wiring circuits of the electric loads 103a to 103g, the electric loads 103a to 103g, and the switching elements 130, thereby reporting the abnormality using the alarm display 105, storing information on the abnormality generation history in the data memory 113, permitting the external tool 106 to read, for maintenance and inspection, the information on the generated abnormalities. The microprocessor 110E includes a serial/parallel converter 114a serving as a master station, and mutually communicates serial data SER with a serial/parallel converter 114b provided on the intelligent power module 190E side. The intelligent power module 190E includes a communication control circuit 114c, and distributes a plurality of control output signals Dr transmitted via the serial communication from the microprocessor 110E to the respective switching elements 130, thereby individually bringing the respective switching elements 130 into the closed-circuit state or the open-circuit state. A determination storing signal Mi generated by the each determination storing circuit 160E is transmitted via the serial communication circuit sequentially to the microprocessor 110E.

Figure 13A:
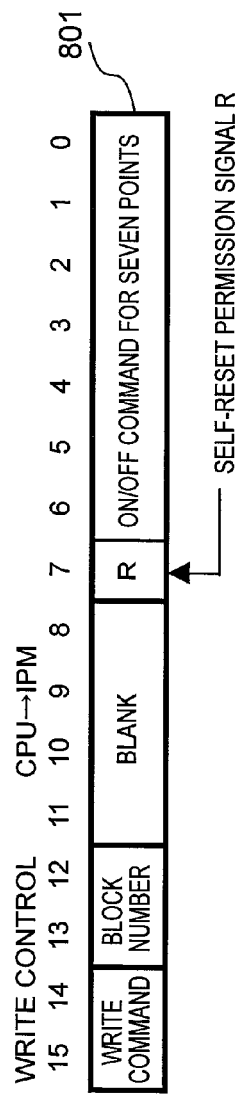
FIG. 13 are diagrams of structures of communication data of the device illustrated in FIG. 12, in which (A) illustrates a data structure upon write control, and (B) illustrates a data structure upon read control.

The microprocessor 110E transmits, to the intelligent power module 190E, a communication control signal CNT via a dedicated line, transmits, immediately after the communication control signal CNT changes in logic level from "L" to "H", the control output signals Dr at once to the seven switching elements 130, and reads, immediately after the communication control signal CNT changes in logic level from "H" to "L", sequentially the determination storing signals Mi relating to two or one switching element 130. In FIG. 13(A), which is a structure diagram of the communication data of the device illustrated in FIG. 12, out of 16-bit write data 801 output by block command output means (refer to Step 902b in FIG. 14), the lower seven bits construct the switching command information directed to the seven switching elements 130, in which, for example, the logic "1" represents the circuit closing command, and the logic "0" represents the circuit opening command. To the eighth lowest bit, a self-reset permission signal R indicating whether self reset of the determination storing circuit in the intelligent power module 190E is permitted is written, and is detailed later referring to FIG. 14. To the upper four bits, a write command identifying this data as the write command, and a block number for identifying the intelligent power module 190E, when a plurality of intelligent power modules 190E are used, are written.

Figure 13B:
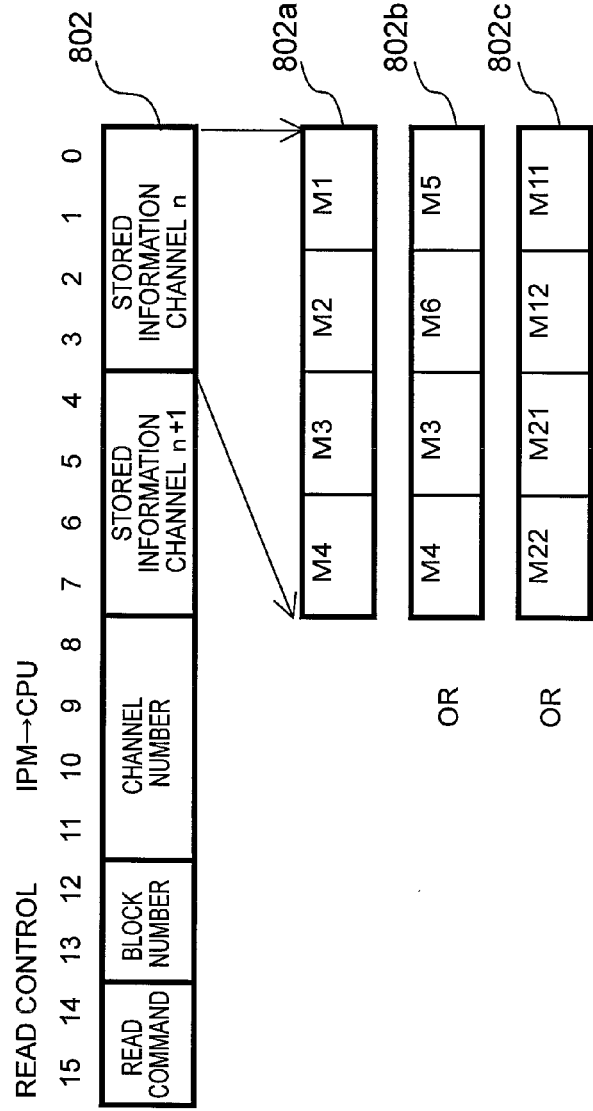

Further, in FIG. 13(B), out of a 16-bit read data 802 read by split monitoring/reading means (refer to Step 904a in FIG. 14), to a first half of the lower eight bits, determination storing information relating to the switching element 130 of an even channel number is written, and to a last half of the lower eight bits, determination storing information relating to the switching element 130 of an odd channel number following to the first half is written. To a first half of the upper eight bits, the even number out of the channel numbers 0 to 7 of the subject switching elements is written. To the upper four bits, a read command identifying this data as the read command, and a block number for identifying the intelligent power module 190E, when a plurality of intelligent power modules 190E are used, are written. As the determination storing signal Mi, when the determination storing circuit 160E is the same as the determination storing circuit illustrated in FIG. 1, as illustrated as determination storing data 802a, the respective logic states of the normal closed-circuit storing signal M1, the normal open-circuit storing signal M2, the on-command storing signal M3, and the off-command storing signal M4 are written.

When the determination storing circuit 160E is the same as the determination storing circuit illustrated in FIGS. 6 and 8, as illustrated as determination storing data 802b, the respective logic states of the abnormal closed-circuit storing signal M5, the abnormal open-circuit storing signal M6, the on-command storing signal M3, and the off-command storing signal M4 are written. When the determination storing circuit 160E is the same as the determination storing circuit according to the embodiment illustrated in FIG. 9, as illustrated as determination storing data 802c, the respective logic states of the normal closed-circuit storing signal M11, the abnormal closed-circuit storing signal M12, the normal open-circuit storing signal M21, and the abnormal open-circuit storing signal M22 are written.

(2) Detailed Description of Effects and Operations

Figure 14:
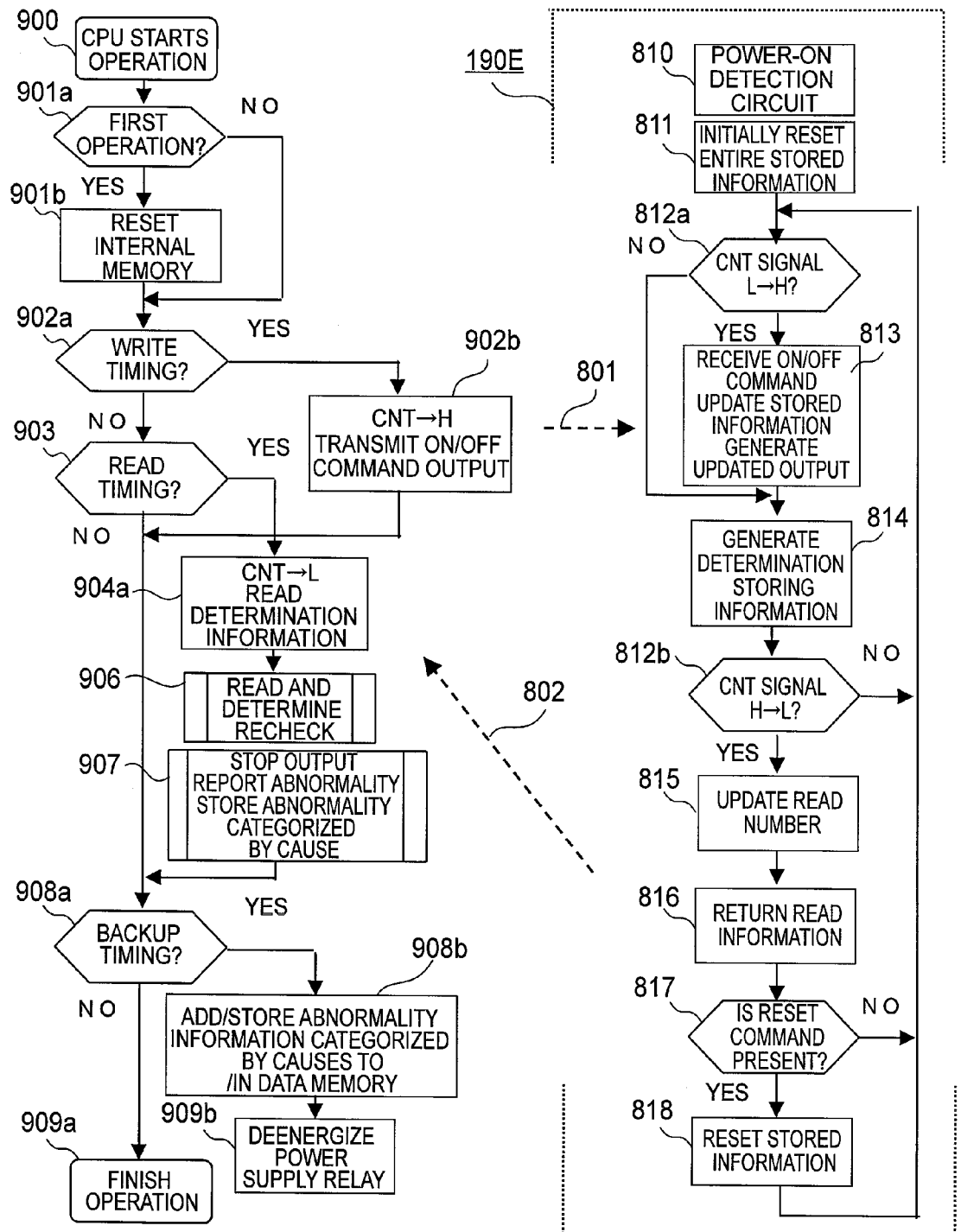
FIG. 14 is a flowchart illustrating an operation of the device in FIG. 12.

A description is given of effects and operations of the device according to the fifth embodiment of the present invention configured as illustrated in FIG. 12 different from those of the device illustrated in FIG. 1 referring to flowcharts illustrated in FIG. 14. First, in FIG. 12, when the power supply switch (not shown) is brought into the closed-circuit state, the output contact point of the power supply relay 102 is brought into the closed-circuit state, the power is supplied to the drive control device 100E, and the microprocessor 110E starts the operation. The microprocessor 110E, according to the operation states of the plurality of input signals (not shown) and contents of the control program stored in the program memory 112E, provides the drive control of the plurality of electric loads (not shown). The power supply to the electric loads 103a to 103g, which are a part of the plurality of electric loads, is controlled by the intelligent power switches 191 to 197 subjected to opening/closing control in response to the control output signal Dr generated by the microprocessor 110E.

The microprocessor 110E, cooperating with the intelligent power switches 191 to 197, detects, for each of the electric loads 103a to 103g, the presence/absence of the abnormalities such as the load internal/external short circuit or the like 210 including the across-load wiring fusion 210a, the load internal short circuit 210b, and the switching element fusion 210c, the element internal/external short circuit 220 including the across-element wiring short circuit 220a, and the element internal short circuit 220b, or the load internal/external short circuit 230 including the load wiring disconnection 230a and the load internal disconnection 230b, and writes and stores the detection in the RAM 111. When the power supply switch is brought into the open-circuit state, the power supply relay 102 maintains the closed-circuit state for the predetermined delay period, and, in this delayed power supply period, the abnormality generation information stored in the RAM 111 is transferred to and stored in the nonvolatile data memory 113.

A description is given of effects and operations of the device illustrated in FIG. 12 referring to the flowcharts for describing the operations in FIGS. 14. In FIG. 14, Step 900 is a start step of the abnormality determination operation by the microprocessor 110E included in the monitoring/controlling means. The following Step 901a is a determination step, from which the operation proceeds, when Step 901a is executed for the first time, by a determination "YES", to Step 901b, and proceeds, when Step 901a is executed for the second and subsequent times, by a determination "NO", to Step 902a. Step 901b is a step of generating a reset command directed to an internal memory storing determination information read in Step block 906 mentioned below, from which the operation proceeds to Step 902a. Step 902a is a determination step of determining whether a timing for transmitting and writing the control output signals Dr to the intelligent power module 190E, has been reached. In Step 902a, a determination "YES" is periodically made, and the operation proceeds to Step 902b, and a determination "NO" is periodically made, and the operation proceeds to Step 903. In Step 902b, the microprocessor 110E uses the command output generation means (corresponding to the block command output means) to first change the logic level of the communication control signal CNT from "L" to "H", then transmit the write data 801 to the intelligent power module 190E, and then the operation proceeds to Step 908a.

Step 903 is a determination step of determining whether a timing for reading the determination storing signal Mi from the intelligent power module 190E, has been reached. In Step 903, a determination "YES" is periodically made and the operation proceeds to Step 904a, and a determination "NO" is periodically made, and the operation proceeds to Step 908a. It should be noted that, in Step 908a described later, when the power supply switch is in the closed-circuit state, a determination "NO" is made, and the operation proceeds to an operation finishing Step 909a, and in the operation finishing Step 909a, the microprocessor 110A executes other control programs, and then the operation proceeds again to the start Step 900. Then, while the control flow is circulating among Steps 900, 902a, 903, 908a, 909a, and 900, when the determination "YES" is periodically made in Step 902a, the microprocessor 110A executes Step 902b, and when the determination "YES" is periodically made in Step 903, the microprocessor 110A executes Steps 904a, 906, and 907. In Step 904a, the microprocessor 110E uses the determination information reading means (corresponding to the split monitoring/reading means) to first change the logic level of the communication control signal CNT from "H" to "L", and then read the read data 802 from the intelligent power module 190E, and then the operation proceeds to Step block 906. In Step block 906, the microprocessor 110E uses the recheck processing means to carry out the overall determination based on the read information, and the recheck processing, and then the operation proceeds to Step block 907.

In Step 907, the microprocessor 110E uses the abnormality handling means to set the control output signal Dr directed to the switching element 130 which has been controlling the electric load to the circuit opening command, and report the abnormality generation state by the alarm display 105, for example, and confirm and store the abnormality generation categorized by the cause, and then the operation proceeds to Step 908a. In Step 908a executed when a determination "NO" is made in Step 903 or executed following to Step block 907, when the power supply switch is in the closed-circuit state, a determination "NO" is made, and the operation proceeds to the operation finishing Step 909a and again proceeds to the operation start Step 900, and when the power supply switch is in the open-circuit state, a determination "YES" is made, and the operation proceeds to Step 908b. In Step 908b, the microprocessor 110E uses the abnormality handling means to store the abnormality generation information categorized by the cause confirmed and stored in Step 907 in the nonvolatile data memory 113, and then the operation proceeds to Step 909b. In Step 909b, the microprocessor 110E deenergizes the power supply relay 102. It should be noted that the data to be stored in the data memory 113 is the number of generated abnormalities categorized by the cause, and, when the forwarding in Step 908b is carried out, data obtained by reading out an accumulated number of times up to the previous time and incremented by one is written for update.

When the determination storing circuit 160E is in a form including the command history storing circuit 170, and generating the determination storing signals M1 to M4 or M3 to M6 illustrated in FIGS. 1, 6, and 8, Step block 906 includes the all Steps in FIG. 5, and Steps 405 to 406b in FIG. 4, and Step block 907 corresponds to Steps 407a and 407b in FIG. 4. When the determination storing circuit 160E is in a form not including the command history storing circuit 170, and generating the determination storing signals M11, M12, M21, and M22 as illustrated in FIG. 9, Step block 906 includes all Steps in FIG. 11 excluding Step 707a, and Step block 907 corresponds to Step 707a in FIG. 11.

In the power transistor 130, the state detection circuit 150, and the determination storing circuit 160E included in the intelligent power module 190E, in Step 810, the power-on detection circuit detects an arrival of the power, thereby generating a rest pulse, and the in the following Step 811, all the stored information in the intelligent power module 190E is reset to initial states. Step 812a is a determination step, in which the intelligent power module 190E determines whether the logic level of the communication control signal CNT transmitted from the microprocessor 110E has changed from "L" to "H", and only when the change is detected, a determination "YES" is made, and the operation proceeds to Step 813, and when there has not been the change, a determination "NO" is made, and the operation proceeds to Step 814. In Step 813, the intelligent power module 190E receives the write data 801 transmitted from the microprocessor 110E in Step 902b, carries out update and storing, and supplies the respective switching elements 130 with the latest control output signals Dr. In the following Step 814, the intelligent power module 190E generates the determination storing signals M1 to M4, M3 to M6, or M11 to M12 in response to the latest switching command signals, and then the operation proceeds to Step 812b.

Step 812b is a determination step, in which the intelligent power module 190E determines whether the logic level of the communication control signal CNT transmitted from the microprocessor 110E has changed from "H" to "L", and only when the change is detected, a determination "YES" is made, and the operation proceeds to Step 815, and when there has not been the change, a determination "NO" is made, and the operation returns and proceeds to Step 812a. In Step 815, the intelligent power module 190E sequentially updates the channel number of the switching element 130 to be read, and in the following Step 816, returns the read data 802 corresponding to the updated channel number. The following Step 817 is a determination step, in which the intelligent power module 190E determines the logic of the self-reset permission signal R out of the write data 801 received in Step 813, and, when the self reset is permitted, a determination "YES" is made, and the operation proceeds to Step 818, and when the self reset is not permitted, a determination "NO" is made, and the operation returns and proceeds to Step 812a. In Step 818, the intelligent power module 190E carries out the self reset of the stored information in the determination storing circuit 160E to be read, and then the operation returns to Step 812a.

A general description is made of the control operation in the intelligent power module 190E. The intelligent power module 190E, which is initialized in Steps 810 and 811 when the power is turned on, in general, repeatedly executes Step 812a where the determination "NO" is made, Step 814, and Step 812b where the determination "NO" is made, and in Step 814, in preparation for the short-circuit and disconnection abnormalities, time of generation of which is unknown, generates the determination storing signal while always monitoring the state detection signals Mn and OC and the disconnection detection signal OP. In Step 902a on the microprocessor 110E side, when the determination "YES" is periodically made, the communication control signal CNT changes from the logic level "L" to "H", and accordingly, the determination "YES" is made in Step 812a, and the write data 801 is received. In Step 903 on the microprocessor 110E side, when the determination "YES" is periodically made, the communication control signal CNT changes from the logic level "H" to "L", and accordingly, the determination "YES" is made in Step 812b, and the read data 802 is returned. When the self-reset permission signal R indicates the permission state of the self reset according to the write data 801, after the read data 802 is transmitted in Step 816, the stored state of the determination storing circuit is initialized by the self-reset processing in Step 818.

(3) Essential Points and Characteristics of Fifth Embodiment

As apparent from the above description, the drive control device for an electric load according to the fifth embodiment is the drive control device for an electric load 100E including the switching elements 130 serially connected to the electric loads 103a to 103g to which the power is supplied from the drive power source 101, and the monitoring/controlling means 110E for performing the opening/closing control of the switching elements 130, and monitoring presence/absence of an abnormal state of the power supply circuits for the electric loads 103a to 103g, the monitoring/controlling means 110E generates the control output signals Dr serving as the circuit closing command or the circuit opening command directed to the switching elements 130, and supplies the switching elements 130 and the determination storing circuits 160E with the control output signals Dr, the switching element 130 generate the state detection signal Mn according to open/closed-circuit states of the switching element 130, and supplies the determination storing circuit 160E with the state detection signal Mn, the determination storing circuit 160E detects, when the control output signal Dr is the circuit closing command, whether the switching element 130 has normally been brought into the closed-circuit state and stores a result of the detection, thereby generating the closed-circuit determination storing signals M1, M11, M12, and M5, detects, when the control output signal Dr is the circuit opening command, whether the switching element 130 has normally been brought into the open-circuit state and stores a result of the detection, thereby generating the open-circuit determination storing signals M2, M21, M22, and M6, and the stored information of the determination storing circuit 160E is, when the monitoring/controlling means 110E has read the determination storing signal, reset periodically by itself, and the monitoring/controlling means 110E further periodically reads and stores the closed-circuit determination storing signals M1, M11, M12, and M5 and the open-circuit determination storing signals M2, M21, M22, and M6 serving as the determination storing signal before the determination storing circuit 160E is reset, thereby determining the presence/absence of the abnormal state according to the combination of the logics relating to the signal voltage levels of the determination storing signals stored before.

Further, the determination storing circuit 160E further includes, as one embodiment, the command history storing circuit 170 to which the control output signal Dr directed to the switching element 130 is input. The command history storing circuit 170 stores information that the control output signal Dr reaches a logic level corresponding to the circuit closing command, thereby outputting the on-command storing signal M3 at the logic "1", and stores information that the control output signal Dr reaches a logic level corresponding to the circuit opening command, thereby outputting the off-command storing signal M4 at the logic "1", and the determination storing circuit 160E includes, as the closed-circuit determination storing signal, the normal closed-circuit storing signal M1 or the abnormal closed-circuit storing signal M5, and as the open-circuit determination storing signal, the normal open-circuit storing signal M2 or the abnormal open-circuit storing signal M6, in the command history storing circuit 170, further, along with the determination storing circuit, the stored information is, when the monitoring/controlling means 110E has read the determination storing signal, forcedly reset periodically by itself, and the monitoring/controlling means 110E includes the first normality memory R11 for storing the preliminary determination that the content of the closed-circuit determination storing signals M1, M5 is a normality or non-abnormality determination when the on-command storing signal M3 is at the logic "1" upon the reading and the first abnormality memory R2 for storing information that the content is a non-normality or abnormality determination, and includes the second normality memory R21 for storing a preliminary determination that the content of the open-circuit determination storing signal M2 is a normality or non-abnormality determination when the off-command storing signal M4 is at the logic "1" upon the reading and the second abnormality memory R22 for storing information that the content is a non-normality or abnormality determination.

Further, another embodiment of the determination storing circuit 160E includes, as the closed-circuit determination storing signal, the normal closed-circuit storing signal M11 and the abnormal closed-circuit storing signal M12, and, as the open-circuit determination storing signal, the normal open-circuit storing signal M21 and the abnormal open-circuit storing signal M22. The monitoring/controlling means 110E periodically reads the determination storing signals of the determination storing circuit 160E, and determines the presence/absence of the abnormal state according to the combination of the voltage levels of the normal closed-circuit storing signal M11, the abnormal closed-circuit storing signal M12, the normal open-circuit storing signal M21, and the abnormal open-circuit storing signal M22, and the stored information on all the respective determination storing signals M11, M12, M21, and M22 is reset by itself when the monitoring/controlling means 110E has read the determination storing signals.

Further, the switching element 130 is incorporated into each of the plurality of intelligent power switches 191 to 197 for controlling the drive of the plurality of electric loads 103a to 103g, each of the intelligent power switches 191 to 197 further includes a determination storing circuit 160E, thereby constructing the intelligent power module 190E as whole, the intelligent power module 190E further includes the communication control circuit 114c for serially communicating the controlling/monitoring signal via the serial/parallel converters 114a and 114b with the monitoring/controlling means 110E, the communication control circuit 114c supplies the switching elements 130 with the plurality of control output signals Dr received from the monitoring/controlling means 110E, respectively, and transmits the closed-circuit determination storing signal and the open-circuit determination storing signal input from the each of the intelligent power switches 191 to 197 to the monitoring/controlling means 110E and the closed-circuit determination storing signal and the open-circuit determination storing signal are constructed by adding, to the normal closed-circuit storing signal M1 and the normal open-circuit storing signal M2, or the abnormal closed-circuit storing signal M5 and the abnormal open-circuit storing signal M6, the on-command storing signal M3 and the off-command storing signal M4, or are the normal closed-circuit storing signal M11, the abnormal closed-circuit storing signal M12, the normal open-circuit storing signal M21, and the abnormal open-circuit storing signal M22.

As a result, the intelligent power module including a plurality of intelligent power switches includes the communication control circuit for serially communicating with the monitoring/controlling means. Thus, there is provided a characteristic that the number of signal lines required for communication of many monitoring/controlling signals is reduced, a compact and inexpensive configuration is provided, even when a delay in the signal communication to the individual intelligent power switches is generated, the presence/absence of the abnormality generation in the individual intelligent power switches is determined and stored immediately in response to a change in the control output signal in the determination storing circuit, and no incorrect abnormality determination is made.

Further, the communication control circuit 114c includes the block command output means 902b and the split monitoring/reading means 904a, the block command output means 902b is means for, by the serial communication once from the monitoring/controlling means 110E, supplying the plurality of intelligent power switches 191 to 197 with the individual control output signal Dr, thereby serving as transmission means of the write data 801 for closing or opening the each switching element 130 in response to the logic level of the control output signal Dr, and the split monitoring/reading means 904a is means for, by the serial communication once to the monitoring/controlling means 110E, reading the read data 802 input from a part of the plurality of intelligent power switches 191 to 197, and, while sequentially changing the intelligent power switch 191 to 197 to be monitored, reading, by a plurality of numbers of transmission, the determination storing signal data 802a, 802b, and 802c relating to all the intelligent power switches 191 to 197. As a result, the communication control circuit includes the block command output means and the split monitoring/reading means. Thus, there is provided a characteristic that, to the plurality of intelligent power switches, the control output signals can be supplied at once and quickly, and, by shortening the read period of the monitoring signal, the next control output signal can be quickly transmitted.

Further, the block command output means 902b, by the serial communication once from the monitoring/controlling means 110E, supplies the plurality of intelligent power switches 191 to 197 with the individual control output signal Dr, and includes therein the self-reset permission signal R directed to the plurality of intelligent power switches 191 to 197, and the self-reset permission signal R is a command signal for determining, in response to the logic level of the self-reset permission signal, whether, upon completion of reading, to reset or not the closed-circuit determination storing signal and the open-circuit determination storing signal in the plurality of intelligent power switches 191 to 197. As a result, the monitoring/controlling means, according to the self-reset permission signal included by the block command output means, can determine whether to reset or not the closed circuit determination signal and the open circuit determination signal when these signals have been read. Thus, there is provided a characteristic that, for an electric load carrying out an output operation changing slowly, after the logic of the control output signal has changed, until the determination storing signal has been read and stored, and the overall abnormality determination has been completed, the determination storing signal can be maintained without reset.

(4) Essential Points and Characteristics of First to Fifth Embodiments

As apparent from the above description, the drive control devices for an electric load according to the present invention are the drive control devices for an electric load 100A to 100E including the switching elements 130 serially connected to the electric loads 103, 103a to 103g to which the power is supplied from the drive power source 101, and the monitoring/controlling means 110A to 110E for performing the opening/closing control of the switching elements 130, and monitoring presence/absence of an abnormal state of the power supply circuit for the electric loads 103, 103a to 103g, the monitoring/controlling means 110A to 110E generate the control output signals Dr serving as the circuit closing command or the circuit opening command directed to the switching elements 130, and supplies the switching elements 130 and the determination storing circuits 160A to 160E with the control output signals Dr, the switching elements 130 generate the state detection signals Mn and OC according to open/closed-circuit states of the switching elements 130, and supply the determination storing circuits 160A to 160E with the state detection signals Mn and OC, the determination storing circuits 160A to 160E detect, when the control output signals Dr are the circuit closing command, whether the switching elements 130 have normally been brought into the closed-circuit state and store a result of the detection, thereby generating the closed-circuit determination storing signals M1, M11, M12, and M5, detect, when the control output signals Dr are the circuit opening command, whether the switching elements 130 have normally been brought into the open-circuit state and store a result of the detection, thereby generating the open-circuit determination storing signals M2, M21, M22, and M6, and the stored information of the determination storing circuits 160A to 160E is reset by itself when the monitoring/controlling means 110A to 110E have read the determination storing signal or is forcedly reset periodically by the command of the monitoring/controlling means 110A to 110E, and the monitoring/controlling means 110A to 110E further periodically read and store the closed-circuit determination storing signals M1, M11, M12, and M5 and the open-circuit determination storing signals M2, M21, M22, and M6 serving as the determination storing signal before the determination storing circuits 160A to 160E are reset, thereby determining the presence/absence of the abnormal state according to the combination of the logics relating to the signal voltage levels of the determination storing signals stored before.

Further, the monitoring/controlling means 110A to 110E include the microprocessors 110A to 110E cooperating with the program memories 112A to 112E, and provided with the RAM 111 for arithmetic processing, the program memories 112A to 112E contain the control programs serving as the command output generation means 402b, 602b, 902b for the control output signal Dr directed to the switching element 130, the determination information reading means 404a, 604a, 904a for reading the closed-circuit determination storing signals M1, M5 and the open-circuit determination storing signals M2, M6 generated by the determination storing circuits 160A to 160E and the on-command storing signal M3 and the off-command storing signal M4 generated by the command history storing circuit 170, or reading the normal closed-circuit storing signal M11, the abnormal closed-circuit storing signal M12, the normal open-circuit storing signal M21, and the abnormal open-circuit storing signal M22, and the abnormality handling means 407a, 707a, 907a for determining, according to the combination of logic levels of the read signals by the determination information reading means, the presence/absence of an abnormal state, and, when the short-circuit abnormality of the electric loads 103, 103a to 103g is detected, setting the control output signal Dr to the circuit closing command, and the switching element 130 is provided with the protection circuit including at least one of the over-current suppression circuit 140a, the over-current interruption circuit 140c, and the overheat interruption circuit 140b.

Further, the over-current suppression circuit 140a is a negative feedback control circuit for controlling the conduction state of the switching element 130 so as to restrain the current passing through the switching element from exceeding the threshold, the over-current interruption circuit 140c is a circuit for maintaining the switching element 130 in the open-circuit state when the current passing through the switching element exceeds the threshold, and the over-heat interruption circuit 140b is a circuit for interrupting the switching element 130 when the temperature of the switching element exceeds the predetermined threshold. As a result, the monitoring/controlling means including the microprocessor cooperating with the program memory includes the abnormality handling means for bringing, when the short-circuit abnormality of the electric load occurs, the switching element into the open-circuit state, and the intelligent power switch includes the over-current suppression circuit, the over-current interruption circuit, or the overheat interruption circuit. Thus, there is provided a characteristic that even when the read timing of the determination information is delayed with respect to the generation timing of the control output signal, and also the generation of the circuit opening command directed to the switching element is delayed after the abnormality determination, the switching element is not burnt, and it is thus not necessary for the microprocessor to carry out emergency processing, resulting in a reduction in control load.

Further, the abnormality handling means 407a, 707a, 907 further include abnormal history storage means 408b, 608b, 908b for generating the abnormality report output signal, thereby carrying out the alarm display, or preliminarily storing at least the determined abnormality content categorized by the cause in the specific area of the RAM 111, and transfer and store the at least the determined abnormality content, in the delayed power supply period after the power supply switch is opened, to the non-volatile data memory 113. As a result, the monitoring/controlling means causes the abnormality handling means to store and retain the information on the abnormality generation history in the nonvolatile data memory. Thus, there is a provided a characteristic that, by reading contents of the data memory, the drive control device can be easily maintained and inspected.

Further, the program memories 112A to 112E further include the control program serving as the recheck processing means 406a, 706a, 906, the recheck processing means 406a, 706a, 906 are means for carrying out check processing checking, when the abnormality determination made by reading/storing the determination storing signal for this time results in an abnormality, whether the abnormality determination made for the next time again results in an abnormality or not, and, when the abnormality determination results in an abnormality for a plurality of times, determining and storing an abnormality generation state, and the abnormality handling means 407a, 707a, 907 are executed when the recheck processing means 406a, 706a, 906 confirm/store the abnormality generation state. As a result, the monitoring/controlling means carries out the check processing for the abnormality determination result, and then carries out the abnormality handling. Thus, there is provided a characteristic that, when the determination storing circuit which is directly connected to the switching element, which is the power transistor, and is provided close thereto malfunctions due to noises or the like, the recheck processing can prevent an erroneous abnormality handling from being carried out.

What is claimed is:

1. A drive control device for an electric load, comprising:
a switching element serially connected to an electric load to which a power is supplied from a drive power source; and
monitoring/controlling means for controlling opening/closing of the switching element, and monitoring presence/absence of an abnormal state of a power supply circuit for the electric load, wherein:
the monitoring/controlling means generates a control output signal serving as one of a circuit closing command and a circuit opening command and supplies the switching element and a determination storing circuit with the control output signal;
the switching element generates a state detection signal according to open/closed-circuit states of the switching element, and supplies the determination storing circuit with the state detection signal;
the determination storing circuit is configured to:
detect, when the control output signal is the circuit closing command, whether the switching element has normally been brought into a closed-circuit state and store a result of the detection, thereby generating a closed-circuit determination storing signal;
detect, when the control output signal is the circuit opening command, whether the switching element has normally been brought into an open-circuit state and store a result of the detection, thereby generating an open-circuit determination storing signal; and
one of reset the stored information by itself when the monitoring/controlling means has read the determination storing signal and periodically reset forcedly the stored information by a command of the monitoring/controlling means; and
the monitoring/controlling means further periodically reads and stores the closed-circuit determination storing signal and the open-circuit determination storing signal serving as the determination storing signal before the determination storing circuit is reset, thereby determining the presence/absence of the abnormal state according to a combination of logics relating to a signal voltage level of the determination storing signal stored before.

2. The drive control device for an electric load according to claim 1, wherein:
the monitoring/controlling means is configured so that a determination signal read timing of periodically reading the closed-circuit determination signal and the open-circuit determination signal is before and after a command supply timing at which the monitoring/controlling means generates the control output signal serving as the one of the circuit closing command and the circuit opening command directed to the switching element, and that a time zone for determination made by the determination storing circuit extends from reset processing of the stored information of the determination storing circuit caused by a completion of the reading of the determination storing signal for a previous time to a completion of the reading/storing by the monitoring/controlling means reading the determination storing signal for a next time; and
when the control output signal changes one of from the circuit opening command to the circuit closing command and from the circuit closing command to the circuit opening command within the determination time zone, the determination storing signal read for the next time contains both the closed-circuit determination storing signal and the open-circuit determination storing signal, and when the control output signal holds at least one of the circuit closing command and the circuit opening command within the determination time zone, as the determination storing signal read for the next time, at least one of the closed-circuit determination storing signal and the open-circuit determination signal is effective.

3. The drive control device for an electric load according to claim 2, wherein:
the monitoring/controlling means is configured to:
periodically read/store the determination storing signal generated by the determination storing circuit, thereby determining the presence/absence of the abnormal state;
carry out recheck processing of checking again, when the abnormality determination made by the reading/storing for this time results in an abnormality, whether the abnormality determination made by the reading/storing for the next time results in an abnormality again or not; and
carry out abnormality handling when the abnormality determination results in an abnormality for a plurality of times; and
the abnormality handling stops the control output signal when the abnormality determination result is at least a short-circuit abnormality of the electric load, and supplies the switching element with the circuit opening command.

4. The drive control device for an electric load according to claim 1, wherein:
the determination storing circuit further includes a command history storing circuit to which the control output signal directed to the switching element is input;
the command history storing circuit stores information that the control output signal reaches a logic level corresponding to the circuit closing command, thereby outputting an on-command storing signal at the logic "1", and stores information that the control output signal reaches a logic level corresponding to the circuit opening command, thereby outputting an off-command storing signal at the logic "1";
the determination storing circuit includes, as the closed-circuit determination storing signal, one of a normal closed-circuit storing signal and an abnormal closed-circuit storing signal, and, as the open-circuit determination storing signal, one of a normal open-circuit storing signal and an abnormal open-circuit storing signal;
along with the determination storing circuit, the command history storing circuit is further configured to one of reset the stored information by itself when the monitoring/controlling means has read the determination storing signal and periodically reset forcedly the stored information by the command of the monitoring/controlling means;
the monitoring/controlling means includes:
a first normality memory for storing a preliminary determination that a content of the closed-circuit determination storing signal is one of a normality determination and a non-abnormality determination when the on-command storing signal is at the logic "1" upon the reading;
a first abnormality memory for storing information that the content is the one of the non-normality determination and the abnormality determination when the on-command storing signal is at the logic "1" upon the reading;

a second normality memory for storing a preliminary determination that a content of the open-circuit determination storing signal is one of a normality determination and a non-abnormality determination when the off-command storing signal is at the logic "1" upon the reading; and a second abnormality memory for storing information that the content is the one of the non-normality determination and the abnormality determination when the off-command storing signal is at the logic "1" upon the reading;

when both the first normality memory and the second normality memory store the normality preliminary determinations, and neither of the first abnormality memory nor the second abnormality memory stores the abnormality determination, a normality determination is made, when at least one of the first abnormality memory and the second abnormality memory stores the abnormality determination, an abnormality determination of one of a closed-circuit abnormality and an open-circuit abnormality is made, and one of when the first normality memory does not store the normality determination and the first abnormality memory does not store the abnormality determination, and when the second normality memory does not store the normality determination and the second abnormality memory does not store the abnormality determination, an uncertainty determination is made; and the first normality memory, the second normality memory, the first abnormality memory, and the second abnormality memory are periodically reset after the result of one of the normality preliminary determination, the normality determination, the abnormality determination, and the uncertainty determination is stored while categorized by a cause.

5. The drive control device for an electric load according to claim 4, wherein, in a state in which a reset signal directed to the command history storing circuit is cleared, any one of when both the on-command storing signal and the off-command storing signal are at the logic "0", when the on-command storing signal is at the logic "0" while the closed-circuit determination storing signal is at the logic "1" though the storing resulting in the on-command storing signal has not been carried out, and when the off-command storing signal is at the logic "0" while the open-circuit determination storing signal is at the logic "1" though the storing resulting in the off command storing signal has not been carried out, the monitoring/controlling means makes a preliminary determination of a logic abnormality, carries out the recheck processing, then makes a logic abnormality determination, and determines that the logic abnormality is one of an abnormality of any one of a signal transmission system from the monitoring/controlling means to the switching element, the determination storing circuit, and the command history storing circuit, and malfunctions due to a noise.

6. The drive control device for an electric load according to claim 4, wherein:

the determination storing circuit generates the normal closed-circuit storing signal and the normal open-circuit storing signal;

the normal closed-circuit storing signal is at the logic "1" when the control output signal is the circuit closing command signal, and a voltage between terminals of the switching element is equal to or less than a predetermined closed-circuit voltage, so as to make the preliminary normality determination considering that the switching element has normally carried out a circuit closing operation, while leaving a possibility that an abnormality of an element internal/external short circuit which is one of an internal short circuit and an across-element wiring short circuit of the switching element is present;

the normal closed-circuit storing signal is at the logic "0" when the control output signal is the circuit closing command signal, and the voltage between the terminals of the switching element is more than the predetermined closed-circuit voltage, so as to make a determination of an abnormality of a load internal/external short circuit which means any one of an internal short circuit of the electric load, a short circuit across the electric load by external wiring, and a fused state in which the switching element is disabled to be closed;

the normal open-circuit storing signal is at the logic "1" when the control output signal is the circuit opening command signal, and the voltage between the terminals of the switching element is equal to or more than a predetermined open-circuit voltage, so as to make the preliminary normality determination considering that the switching element has normally carried out a circuit opening operation, while leaving a possibility that abnormality including the load internal/external short circuit is present;

the normal open-circuit storing signal is at the logic "0" when the control output signal is the circuit opening command signal, and the voltage between the terminals of the switching element is less than the predetermined open-circuit voltage, so as to make a determination that the abnormality includes the element internal/external short circuit is present;

the monitoring/controlling means is configured to:
when both the normal closed-circuit storing signal and the normal open-circuit storing signal are at the logic "1", which represents the preliminary normality determination, determine that all the electric load, the switching element, and external wiring are normal;

when the normal closed-circuit storing signal is at the logic "1", which represents the preliminary normality determination, and the normal open-circuit storing signal is at the logic "0", which represents the non-normality determination, determine that the abnormality caused by the element internal/external short circuit is present; and when the normal closed-circuit storing signal is at the logic "0", which represents the non-normality determination, and the normal open-circuit storing signal is at the logic "1", which represents the preliminary normality determination, determine that the abnormality caused by the load internal/external short circuit is present; and the logic "1" represents that a logic level of a signal voltage is one of "H" and "L" while the logic "0" represents that the logic level of the signal voltage is another one of "L" and "H", so as to implement an inverted logic.

7. The drive control device for an electric load according to claim 6, further comprising:

a pull-up resistor and a pull-down resistor which are connected to a connection point between the switching element and the electric load; and a disconnection detection circuit to which a monitored voltage at the connection point is input, wherein:

the disconnection detection circuit includes:
voltage dividing resistors for generating a first voltage and a second voltage, which is a set value higher than the first voltage; and a zone comparison circuit;

the zone comparison circuit, when the monitored voltage is between the first voltage and the second voltage, determines that a load internal/external disconnection which is one of an internal disconnection of the electric load and a disconnection of load wiring occurs, thereby generating a disconnection detection signal; and when the disconnection detection circuit detects the electric load internal/external disconnection, both the normal closed-circuit storing signal and the normal open-circuit storing signal are set to the logic "0", which represents the non-normality determination.

8. The drive control device for an electric load according to claim 4, wherein:

the determination storing circuit generates the abnormal closed-circuit storing signal and the abnormal open-circuit storing signal;

the abnormal closed-circuit storing signal is at the logic "1" when the control output signal is the circuit closing command signal, and a voltage between terminals of the switching element is more than a predetermined closed-circuit voltage, so as to make a determination of an abnormality of a load internal/external short circuit which means any one of an internal short circuit of the electric load, a short circuit across the electric load by external wiring, and a fused state in which the switching element is disable to be closed;

the abnormal closed-circuit storing signal is at the logic "0" when the control output signal is the circuit closing command signal, and the voltage between the terminals of the switching element is equal to or less than the predetermined closed-circuit voltage, so as to make the preliminary normality determination considering that the switching element has normally carried out a circuit closing operation, while leaving a possibility that an abnormality of an element internal/external short circuit which is one of an internal short circuit and an across-element wiring short circuit of the switching element is present;

the abnormal open-circuit storing signal is at the logic "1" when the control output signal is the circuit opening command signal, and the voltage between the terminals of the switching element is less than a predetermined open-circuit voltage, so as to make a determination that the abnormality of the element internal/external short circuit is present;

the abnormal open-circuit storing signal is at the logic "0" when the control output signal is the circuit opening command signal, and the voltage between the terminals of the switching element is equal to or more than the predetermined open-circuit voltage, so as to make the preliminary normality determination considering that the switching element has normally carried out a circuit opening operation, while leaving a possibility that abnormality including the load internal/external short circuit is present;

the monitoring/controlling means is configured to, in a state in which a reset command directed to the determination storing circuit is cleared:

when both the abnormal closed-circuit storing signal and the abnormal open-circuit storing signal are at the logic "0", which represents the preliminary normality determination, determine that all the electric load, the switching element, and external wiring are normal;

when the abnormal closed-circuit storing signal is at the logic "0", which represents the preliminary normality determination, and the abnormal open-circuit storing signal is at the logic "1", which represents the abnormality determination, determine that the abnormality caused by the element internal/external short circuit is present; and when the abnormal closed-circuit storing signal is at the logic "1", which represents the abnormality determination, and the abnormal open-circuit storing signal is at the logic "0", which represents the preliminary normality determination, determine that the abnormality caused by the load internal/external short circuit is present; and the logic "1" represents that a logic level of a signal voltage is one of "H" and "L" while the logic "0" represents that the logic level of the signal voltage is another one of "L" and "H", so as to implement an inverted logic.

9. The drive control device for an electric load according to claim 4, wherein:

the determination storing circuit generates the abnormal closed-circuit storing signal and the abnormal open-circuit storing signal;

the abnormal closed-circuit storing signal is at the logic "1" when the control output signal is the circuit closing command signal, and a current flowing through the switching element is more than a predetermined upper limit valve, so as to make a determination of an abnormality of a load internal/external short circuit which is one of an internal short circuit of the electric load and a short circuit across the electric load by external wiring;

the abnormal closed-circuit storing signal is at the logic "0" when the control output signal is the circuit closing command signal, and the current flowing through the switching element is less than the predetermined upper limit valve, so as to make the preliminary normality determination considering that the switching element has normally carried out a circuit closing operation, while leaving a possibility that an abnormality of an element internal/external short circuit which is one of an internal short circuit and an across-element wiring short circuit of the switching element is present;

the abnormal open-circuit storing signal is at the logic "1" when the control output signal is the circuit opening command signal, and the voltage between the terminals of the switching element is less than a predetermined open-circuit voltage, so as to make a determination that the abnormality of the element internal/external short circuit is present;

the abnormal open-circuit storing signal is at the logic "0" when the control output signal is the circuit opening command signal, and the voltage between the terminals of the switching element is equal to or more than the predetermined open-circuit voltage, so as to make the preliminary normality determination considering that the switching element has normally carried out a circuit opening operation, while leaving a possibility that abnormality including the load internal/external short circuit which means any one of an internal short circuit of the electric load, a short circuit across the electric load by external wiring, and a fused state in which the switching element is disable to be closed is present;

the monitoring/controlling means is configured to, in a state in which a reset command directed to the determination storing circuit is cleared:

when both the abnormal closed-circuit storing signal and the abnormal open-circuit storing signal are at the logic "0", which represents the preliminary normality determination, determine that all the electric load, the switching element, and external wiring are normal;

when the abnormal closed-circuit storing signal is at the logic "0", which represents the preliminary normality determination, and the abnormal open-circuit storing signal is at the logic "1", which represents the abnormality determination, determine that the abnormality caused by the element internal/external short circuit is present; and when the abnormal closed-circuit storing signal is at the logic "1", which represents the abnormality determination, and the abnormal open-circuit storing signal is at the logic "0", which represents the preliminary normality determination, determine that the abnormality caused by the load internal/external short circuit is present; and the logic "1" represents that a logic level of a signal voltage is one of "H" and "L" while the logic "0" represents that the logic level of the signal voltage is another one of "L" and "H", so as to implement an inverted logic.

10. The drive control device for an electric load according to claim 4, further comprising:
a pull-up resistor and a pull-down resistor which are connected to a connection point between the switching element and the electric load; and
a disconnection detection circuit to which a monitored voltage at the connection point is input, wherein:
the disconnection detection circuit includes:
voltage dividing resistors for generating a first voltage and a second voltage, which is a set value higher than the first voltage; and
a zone comparison circuit;
the zone comparison circuit, when the monitored voltage is between the first voltage and the second voltage, determines that a load internal/external disconnection which is one of an internal disconnection of the electric load and a disconnection of load wiring occurs, thereby generating a disconnection detection signal; and
when the disconnection detection circuit detects the electric load internal/external disconnection, both the abnormal closed-circuit storing signal and the abnormal open-circuit storing signal are set to the logic "1", which represents the abnormality determination.

11. The drive control device for an electric load according to claim 1, wherein:
the determination storing circuit includes, as the closed-circuit determination storing signal, a normal closed-circuit storing signal and an abnormal closed-circuit storing signal, and, as the open-circuit determination storing signal, a normal open-circuit storing signal and an abnormal open-circuit storing signal;
the monitoring/controlling means periodically reads the determination storing signal of the determination storing circuit, and determines the presence/absence of the abnormal state according to a combination of signal voltage levels of a normal closed-circuit storing signal, an abnormal closed-circuit storing signal, a normal open-circuit storing signal, and an abnormal open-circuit storing signal; and
the stored information on all the respective determination storing signals is one of reset by itself when the monitoring/controlling means has read the determination storing signal and forcedly reset periodically by the command of the monitoring/controlling means.

12. The drive control device for an electric load according to claim 11, wherein:
the monitoring/controlling means, in a state in which neither the normal closed-circuit storing signal nor the abnormal closed-circuit storing signal read from the determination storing circuit does not store the closed-circuit determination signal, and neither the normal open-circuit storing signal nor the abnormal open-circuit storing signal does not store the open-circuit determination signal, makes a preliminary determination of a logic abnormality, carries out recheck processing, and then makes a logic abnormality determination; and the logic abnormality determination determines one of an abnormality of one of a signal transmission system from the monitoring/controlling means to the switching element and the determination storing circuit, and malfunctions due to a noise.

13. The drive control device for an electric load according to claim 11, wherein:
the normal closed-circuit storing signal is at the logic "1" when the control output signal is the circuit closing command signal, and a voltage between terminals of the switching element is equal to or less than a predetermined closed-circuit voltage, so as to make a preliminary normality determination considering that the switching element has normally carried out a circuit closing operation, while leaving a possibility that an abnormality of an element internal/external short circuit which is one of an internal short circuit of the switching element and an across-element wiring short circuit is present;

the abnormal closed-circuit storing signal is at the logic "1" when the control output signal is the circuit closing command signal, and the voltage between the terminals of the switching element is more than the predetermined closed-circuit voltage, so as to make a determination of an abnormality including a load internal/external short circuit which means any one of an internal short circuit of the electric load, a short circuit across the electric load by external wiring, and a fused state in which the switching element is disabled to be closed;

the normal open-circuit storing signal is at the logic "1" when the control output signal is the circuit opening command signal, and the voltage between the terminals of the switching element is equal to or more than a predetermined open-circuit voltage, so as to make the preliminary normality determination considering that the switching element has normally carried out a circuit opening operation, while leaving a possibility that the abnormality including the load internal/external short circuit is present;

the abnormal open-circuit storing signal is at the logic "1" when the control output signal is the circuit opening command signal, and the voltage between the terminals of the switching element is less than the predetermined open-circuit voltage, so as to make a determination that the abnormality of the element internal/external short circuit is present;

the monitoring/controlling means is configured to:
when both the normal closed-circuit storing signal and the normal open-circuit storing signal are at the logic "1", which represents the preliminary normality determination, and both the abnormal closed-circuit storing signal and the abnormal open-circuit storing signal are at the logic "0", determine that all the electric load, the switching element, and external wiring are normal;

when the normal closed-circuit storing signal is at the logic "1", which represents the preliminary normality determination, and the abnormal open-circuit storing signal is at the logic "1", which represents the abnormality determination, determine that the abnormality caused by the element internal/external short circuit is present; and when the abnormal closed-circuit storing signal is at the logic "1", which represents the abnormality determination, and the normal open-circuit storing signal is at the logic "1", which represents the preliminary normality determination, determine that the abnormality caused by the load internal/external short circuit is present; and the logic "1" represents that a logic level of a signal voltage is one of "H" and "L" while the logic "0" represents that the logic level of the signal voltage is another one of "L" and "H", so as to implement an inverted logic.

14. The drive control device for an electric load according to claim 13, further comprising:

a pull-up resistor and a pull-down resistor which are connected to a connection point between the switching element and the electric load; and a disconnection detection circuit to which a monitored voltage at the connection point is input, wherein:

the disconnection detection circuit includes:

voltage dividing resistors for generating a first voltage and a second voltage, which is a set value higher than the first voltage; and a zone comparison circuit;

the zone comparison circuit, when the monitored voltage is between the first voltage and the second voltage, determines that a load internal/external disconnection which is one of an internal disconnection of the electric load and a disconnection of load wiring occurs, thereby generating a disconnection detection signal; and when the disconnection detection circuit detects the electric load internal/external disconnection, both the abnormal closed-circuit storing signal and the abnormal open-circuit storing signal are set to the logic "1", which represents the abnormality determination.

15. The drive control device for an electric load according to claim 1, wherein:

the switching element is incorporated into each of a plurality of intelligent power switches for controlling drive of a plurality of the electric loads;

the plurality of intelligent power switches each include the determination storing circuit, thereby constituting an intelligent power module as a whole;

the intelligent power module includes a communication control circuit for serially communicating a controlling/monitoring signal via a serial/parallel converter with the monitoring/controlling means;

the communication control circuit supplies each of the switching elements with a plurality of the control output signals received from the monitoring/controlling means individually, and transmits the closed-circuit determination storing signal and the open-circuit determination storing signal input from the each of the intelligent power switches to the monitoring/controlling means.

16. The drive control device for an electric load according to claim 15, wherein:

the communication control circuit includes block command output means and split monitoring/reading means;

the block command output means supplies, by a single serial communication from the monitoring/controlling means, the each of the plurality of intelligent power switches with an individual control output signal, thereby serving as transmission means for write data for bringing the each switching element into one of the closed-circuit state and the open-circuit state in response to a logic level of the control output signal; and the split monitoring/reading means reads, by a single serial communication to the monitoring/controlling means, read data input from a part of the plurality of intelligent power switches, and reads, while sequentially changing the intelligent power switch to be monitored, by a plurality of numbers of transmission, determination storing signal data relating to all the plurality of intelligent power switches.

17. The drive control device for an electric load according to claim 16, wherein:

the block command output means supplies, by a single serial communication from the monitoring/controlling means, the each of the plurality of intelligent power switches with an individual control output signal, and includes therein a self-reset permission signal directed to the plurality of intelligent power switches; and the self-reset permission signal includes a command signal for determining, in response to a logic level of the self-reset permission signal, whether, upon completion of reading, to reset or not the closed-circuit determination storing signal and the open-circuit determination storing signal in the plurality of intelligent power switches.

18. The drive control device for an electric load according to claim 1, wherein:

the monitoring/controlling means includes a microprocessor cooperating with a program memory, and including a RAM for arithmetic processing;

the program memory contains a control program serving as:

command output generation means for the control output signal directed to the switching element;

determination information reading means for one of reading the closed-circuit determination storing signal and the open-circuit determination storing signal generated by the determination storing circuit and the on-command storing signal and the off-command storing signal generated by the command history storing circuit, and reading the normal closed-circuit storing signal, the abnormal closed-circuit storing signal, the normal open-circuit storing signal, and the abnormal open-circuit storing signal; and abnormality handling means for determining, according to a combination of logic levels of the read signals by the determination information reading means, the presence/absence of the abnormal state, and, when a short-circuit abnormality of the electric load is detected, setting at least the control output signal to the circuit closing command;

the switching element is provided with a protection circuit including at least one of an over-current suppression circuit, an over-current interruption circuit, and an overheat interruption circuit;

the over-current suppression circuit includes a negative feedback control circuit for controlling a conduction state of the switching element so as to restrain a current flowing through the switching element from exceeding a predetermined threshold;

the over-current interruption circuit includes a circuit for maintaining the switching element in the open-circuit state when the current flowing through the switching element exceeds the predetermined threshold; and the overheat interruption circuit includes a circuit for interrupting the switching element when temperature of the switching element exceeds a predetermined threshold.

19. The drive control device for an electric load according to claim 18, wherein the abnormality handling means further includes abnormal history storage means for one of generating an abnormality report output signal, thereby carrying out an alarm display, and preliminarily storing at least a determined abnormality content categorized by a cause in a specific area of the RAM, to thereby transfer/store the at least the determined abnormality content, in a delayed power supply period after a power supply switch is brought into an open-circuit state, to a non-volatile data memory.

20. The drive control device for an electric load according to claim 18, wherein:
- the program memory further contains a control program serving as recheck processing means;
- the recheck processing means carries out check processing of checking, when the abnormality determination made by the reading/storing of the determination storing signal for this time results in an abnormality, whether the abnormality determination made by the reading/storing for the next time again results in an abnormality or not, and, when the abnormality determination results in an abnormality for a plurality of times, confirms/stores an abnormality generation state; and
- the abnormality handling means is carried out when the recheck processing means confirms/stores the abnormality generation state.

\* \* \* \* \*